(12) United States Patent
Park et al.

(10) Patent No.: US 12,015,047 B2
(45) Date of Patent: Jun. 18, 2024

(54) DISPLAY DEVICE

(71) Applicant: Samsung Display Co., LTD., Yongin-si (KR)

(72) Inventors: No Kyung Park, Hwaseong-si (KR); Kyung Bae Kim, Seongnam-si (KR); Do Yeong Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 452 days.

(21) Appl. No.: 17/210,959

(22) Filed: Mar. 24, 2021

(65) Prior Publication Data

US 2022/0028922 A1  Jan. 27, 2022

(30) Foreign Application Priority Data

Jul. 24, 2020  (KR) .................. 10-2020-0092320

(51) Int. Cl.
*H01L 27/15* (2006.01)
*H01L 33/38* (2010.01)
(Continued)

(52) U.S. Cl.
CPC .......... *H01L 27/156* (2013.01); *H01L 33/382* (2013.01); *H01L 33/505* (2013.01); *H01L 33/62* (2013.01)

(58) Field of Classification Search
CPC ... H01L 33/382; H01L 33/504; H01L 25/167; H01L 27/156; H10K 59/121;
(Continued)

(56) References Cited

U.S. PATENT DOCUMENTS

2018/0061908 A1* 3/2018 Shim .................. H10K 59/00
2019/0189975 A1* 6/2019 Lim .................... H01L 27/1225
(Continued)

FOREIGN PATENT DOCUMENTS

KR  10-2019-0072700  6/2019
KR  10-2020-0027136  3/2020
(Continued)

OTHER PUBLICATIONS

International Search Report corresponding to International Application No. PCT/KR2021/008822 dated Oct. 18, 2021.
(Continued)

*Primary Examiner* — Matthew C Landau
*Assistant Examiner* — Halee Cramer
(74) *Attorney, Agent, or Firm* — KILE PARK REED & HOUTTEMAN PLLC

(57) ABSTRACT

A display device includes pixels including subpixels, electrodes spaced apart from each other in a first direction, extending in a second direction, and disposed in the subpixels, light emitting elements in the subpixels and on the electrodes, and contact electrodes electrically contacting the light emitting elements and the electrodes. The subpixels each includes an emission area including the light emitting elements, and a sub area spaced apart from the emission area. The pixels each includes a first subpixel including a first emission area and a sub area on a first side of the first emission area, and a second subpixel which is disposed on a first side of the first subpixel and includes a second emission area and a sub area disposed on a second side of the second emission area. The sub area of the second subpixel is disposed side by side with the first emission area.

20 Claims, 23 Drawing Sheets

(51) Int. Cl.
*H01L 33/50* (2010.01)
*H01L 33/62* (2010.01)

(58) Field of Classification Search
CPC .. H10K 59/122; H10K 59/126; H10K 59/352; H10K 59/35; H10K 59/353; H10K 59/351; H10K 59/1213; H10K 59/1315
See application file for complete search history.

(56) References Cited

U.S. PATENT DOCUMENTS

| | | |
|---|---|---|
| 2020/0144336 A1* | 5/2020 | Xiong .................. H10K 59/121 |
| 2020/0159065 A1* | 5/2020 | Kim .................. G02F 1/133502 |
| 2020/0403055 A1* | 12/2020 | Jung .................. H10K 59/1213 |
| 2021/0143137 A1 | 5/2021 | Kim et al. |
| 2021/0351171 A1 | 11/2021 | Yoo et al. |
| 2021/0384252 A1 | 12/2021 | Lee et al. |
| 2022/0037568 A1 | 2/2022 | Kwag et al. |

FOREIGN PATENT DOCUMENTS

| | | |
|---|---|---|
| KR | 10-2020-0034904 | 4/2020 |
| KR | 10-2020-0037911 | 4/2020 |
| KR | 10-2020-0063380 | 6/2020 |
| KR | 10-2020-0063386 | 6/2020 |
| KR | 10-2020-0079379 | 7/2020 |
| KR | 10-2021-0057891 | 5/2021 |

OTHER PUBLICATIONS

Written Opinion corresponding to International Application No. PCT/KR2021/008822 dated Oct. 18, 2021.

* cited by examiner

DISPLAY DEVICE

CROSS REFERENCE TO RELATED APPLICATION(S)

This application claims priority to and benefits of Korean Patent Application No. 10-2020-0092320 under 35 U.S.C. § 119 filed on Jul. 24, 2020 in the Korean Intellectual Property Office, the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

A typical display device may include a display panel such as an organic light-emitting display panel or a liquid crystal display (LCD) panel. A light-emitting display panel may include light-emitting elements. For example, light-emitting diodes (LEDs) may include organic light-emitting diodes (OLEDs) using an organic material as a fluorescent material and inorganic LEDs using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having a novel pixel arrangement and electrode structure.

The disclosure also provides a display device having a sufficient aperture ratio by securing a free space between adjacent subpixels according to a pixel arrangement or arrangements.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment provides a display device that may include a plurality of pixels comprising a plurality of subpixels and disposed in a first direction and a second direction intersecting the first direction; a plurality of electrodes spaced apart from each other in the first direction, extending in the second direction, and disposed in each of the plurality of subpixels; a plurality of light emitting elements disposed in each of the plurality of subpixels and disposed on the plurality of electrodes; and a plurality of contact electrodes electrically contacting the light plurality of emitting elements and the plurality of electrodes, wherein each of the plurality of subpixels comprises an emission area comprising the plurality of light emitting elements; and a sub area spaced apart from the emission area in the second direction, each of the plurality of pixels comprises a first subpixel comprising a first emission area and a sub area disposed on a first side of the first emission area in the second direction; and a second subpixel disposed on a first side of the first subpixel in the first direction and comprises a second emission area and a sub area disposed on a second side of the second emission area in the second direction, and the sub area of the second subpixel may be disposed side by side with the first emission area in the first direction.

In an embodiment, the plurality of electrodes may comprise a first electrode disposed across the emission area and the sub area of each subpixel of the plurality of pixels; a second electrode spaced apart from the first electrode in the first direction and disposed across the plurality of subpixels; a third electrode disposed between the first electrode and the second electrode and disposed across the emission area and the sub area of the plurality of subpixels; and a fourth electrode spaced apart from the third electrode in the first direction with the first electrode interposed between the fourth electrode and the third electrode, wherein the first electrode may comprise a first electrode contact part disposed in the sub area of the plurality of subpixels, and the second electrode may comprise a plurality of second electrode contact parts disposed at boundaries of adjacent plurality of pixels in the second direction.

In an embodiment, each of the plurality of electrodes may comprise an electrode extension part disposed in the emission area of the plurality of subpixels, and the plurality of light emitting elements may comprise first light emitting elements having first ends disposed on a first electrode extension part of the first electrode, and second ends disposed on a fourth electrode extension part of the fourth electrode, and second light emitting elements having first ends disposed on a third electrode extension part of the third electrode, and second ends disposed on a second electrode extension part of the second electrode.

In an embodiment, the display device may further comprise a first wiring horizontal part and a second wiring horizontal part which are disposed on a first side and a second side of each of the plurality of subpixels in the second direction, wherein a second electrode contact part of the second electrode may overlap the second wiring horizontal part to electrically contact the second wiring horizontal part.

In an embodiment, the first wiring horizontal part may intersect the first emission area of the first subpixel and may be spaced apart toward a second side of the second direction from the plurality of light emitting elements disposed in the first subpixel, and the second wiring horizontal part may intersect the second emission area of the second subpixel and may be spaced apart toward a first side of the second direction from the plurality of light emitting elements disposed in the second subpixel.

In an embodiment, the second electrode contact part electrically contacting the second wiring horizontal part may be disposed on a first side of the sub area in the second direction in the second electrode disposed in the first subpixel, and a part of the second electrode contact part electrically contacting the second wiring horizontal part may be disposed in the second emission area in the second electrode disposed in the second subpixel.

In an embodiment, the plurality of contact electrodes may comprise a first contact electrode electrically contacting the first electrode and the first ends of the first light emitting elements; a second contact electrode electrically contacting the second electrode and the second ends of the second light emitting elements; and a third contact electrode electrically contacting the third electrode, the fourth electrode, the second ends of the first light emitting elements, and the first ends of the second light emitting elements.

In an embodiment, the first contact electrode may be disposed on the first electrode extension part to extend in the second direction, the second contact electrode may be disposed on the second electrode extension part to extend in the second direction, and the third contact electrode may surround the first contact electrode, and may comprise a first extending part disposed on the third electrode extension part; a second extending part disposed on the fourth electrode extension part; and a plurality of connecting parts electrically connecting the first extending part and the second extending part.

In an embodiment, the display device may further comprise a plurality of first banks overlapping the second electrode and the fourth electrode and disposed in the emission area of each of the plurality of subpixels; a second bank surrounding the emission area and the sub area of each of the plurality of subpixels and disposed at a boundary between adjacent subpixels; and a third bank extending in the second direction to intersect the emission area and the sub area of each of the plurality of subpixels and comprising a part disposed between the first banks, wherein the light emitting elements may be disposed between the plurality of first banks and the third bank.

In an embodiment, the display device may further comprise a plurality of color control structures, at least a part of each of the plurality of color control structures may overlap the emission area of each of the plurality of subpixels, wherein the plurality of color control structures may comprise a first wavelength conversion layer disposed in the first emission area of the first subpixel and overlapping the plurality of light emitting elements of the first emission area; and a light transmitting layer disposed in the second emission area of the second subpixel and overlapping the plurality of light emitting elements of the second emission area.

In an embodiment, at least a part of the first wavelength conversion layer may overlap the sub area of the second subpixel disposed on a first side of the first emission area in the first direction; and the light transmitting layer may be not disposed in the sub area of the first subpixel.

In an embodiment, at least a part of each of the first wavelength conversion layer and the light transmitting layer may overlap the second bank in a thickness direction.

In an embodiment, the display device may further comprise a third subpixel disposed on a first side of the second subpixel in the first direction and comprises a third emission area and a sub area disposed on a first side of the third emission area in the second direction, wherein, the second emission area may be disposed between the sub areas of the first subpixel and the third subpixel in the second subpixel, and the sub area may be disposed between the first emission area of the first subpixel and the third emission area of the third subpixel.

In an embodiment, the plurality of color control structures may further comprise a second wavelength conversion layer disposed in the third emission area of the third subpixel overlapping the plurality of light emitting elements of the third emission area, and at least a part of the second wavelength conversion layer may overlap the sub area of the second subpixel disposed on a second side of the third emission area of the third subpixel in the first direction.

In an embodiment, the display device may further comprise a first capacitor electrode overlapping the second emission area, the first capacitor electrode and the second wiring horizontal part being disposed on a same layer; a second capacitor electrode overlapping the sub area of the second subpixel; and a first extending electrode part overlapping the sub area of the first subpixel and being electrically connected to the first capacitor electrode, wherein the first electrode contact part of the first electrode of the first subpixel may electrically contact the first extending electrode part in the sub area of the first subpixel, and the first electrode contact part of the first electrode of the second subpixel may directly electrically contact the second capacitor electrode in the sub area of the second subpixel.

An embodiment provides a display device that may include a plurality of pixels comprising a plurality of emission areas, and a plurality of sub areas, wherein each of the plurality of pixels may comprise a plurality of electrodes spaced part from each other in a first direction, at least a part of each of the plurality of electrode extending in each emission area in a second direction; a plurality of light emitting elements disposed in each emission area of the plurality of emission areas, ends of each of the plurality of light emitting elements being disposed on the plurality of electrodes; and a plurality of contact electrodes electrically contacting the plurality of light emitting elements and the plurality of electrodes. The plurality of emission areas of each pixel of the plurality of pixels may comprise a first emission area; a second emission area spaced apart from the first emission area in a diagonal direction between the first direction and the second direction; and a third emission area spaced apart from the first emission area in the first direction. At least one of the plurality of subareas spaced apart from the second emission area in the second direction may be included between the first emission area and the third emission area.

In an embodiment, the display device may further comprise a plurality of color control structures overlapping the plurality of light emitting elements disposed in each emission area of the plurality of emission areas of each pixel of the plurality of pixels, wherein the plurality of color control structures may comprise a first wavelength conversion layer overlapping the first emission area; a light transmitting layer overlapping the second emission area; and a second wavelength conversion layer overlapping the third emission area, and at least a part of each of the first wavelength conversion layer and the second wavelength conversion layer may overlap the sub area of the plurality of emission areas spaced apart from the second emission area in the second direction.

In an embodiment, the display device may further comprise a bank surrounding the plurality of emission areas and the sub areas of the plurality of pixels, wherein at least a part of each of the first wavelength conversion layer and the second wavelength conversion layer may overlap the bank.

In an embodiment, the first wavelength conversion layer may have a maximum width in the first direction greater than a maximum width of the first emission area in the first direction, and the second wavelength conversion layer may have a maximum width in the first direction greater than a maximum width of the third emission area in the first direction.

In an embodiment, the plurality of electrodes may comprise a first electrode disposed across each emission area and each sub area of the plurality of pixels; a second electrode spaced apart from the first electrode in the first direction and overlapping a plurality of adjacent pixels in the second direction; a third electrode disposed between the first electrode and the second electrode and overlapping each emission area and each sub area of the plurality of pixels; and a fourth electrode spaced apart from the third electrode in the first direction, the first electrode interposed between the fourth electrode and the third electrode, wherein the first electrode may comprise a first electrode contact part disposed in each sub area of the plurality of pixels, and the second electrode may comprise a plurality of second electrode contact parts disposed at boundaries of adjacent pixels in the second direction.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
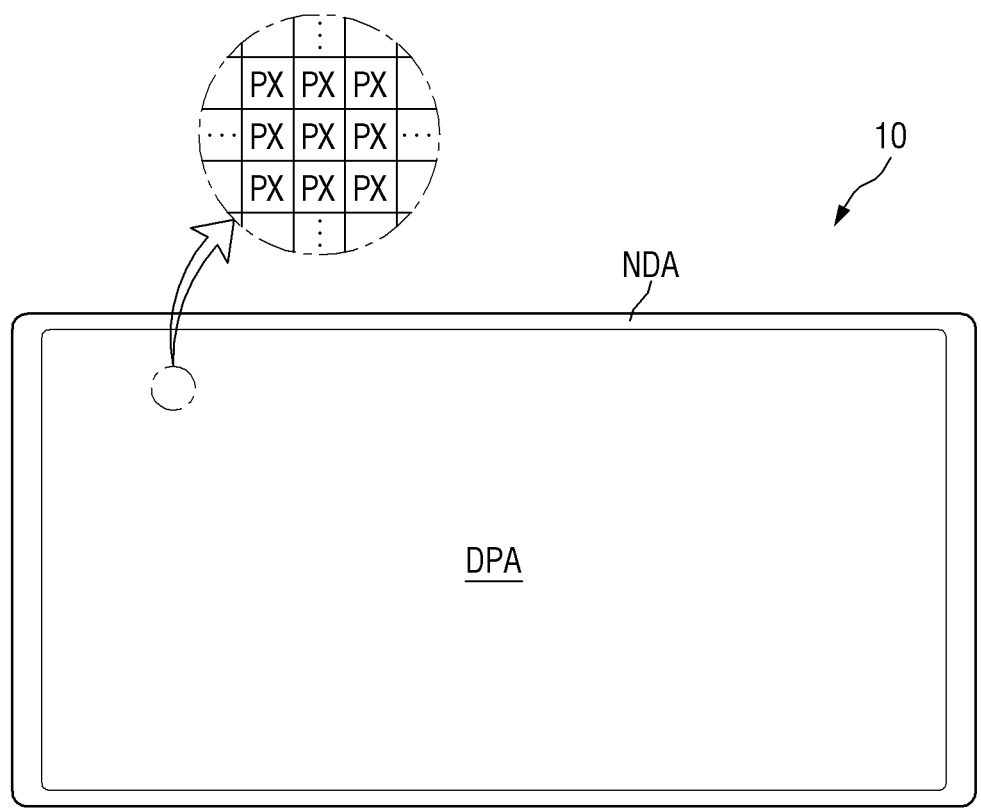
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

Like reference numerals refer to like elements throughout. Also, in the figures, the thickness, ratio, and dimensions of components may be exaggerated for clarity of illustration.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms of a singular form may include plural forms unless referred to the contrary.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this disclosure pertains. Also, terms such as defined terms in commonly used dictionaries are to be interpreted as having meanings consistent with their meaning in the context of the relevant art and will not be interpreted in an ideal or excessively formal sense unless clearly defined in the specification.

The meaning of "include" or "comprise" or "have" and variations of "include", "comprise" and "have" specifies a property, a fixed number, a step, an operation, an element, a component or a combination thereof, but does not exclude other properties, fixed numbers, steps, operations, elements, components or combinations thereof.

Hereinafter, embodiments will be described with reference to the attached drawings.

FIG. 1 is a schematic plan view of a display device 10 according to an embodiment.

In the disclosure, a first direction DR1 and a second direction DR2 may be perpendicular to each other in a plan view, and a third direction DR3 is perpendicular to the first direction DR1 and the second direction DR2 in cross section. In addition, in the disclosure, "above." "top," and "upper surface" indicate an upward direction from the display device 10, that is, a direction of the third direction DR3, and "under," "bottom," and "lower surface" indicate a downward direction from the display device 10, that is, the other direction of the third direction DR3. In addition, "left," "right," "upper," and "lower" indicate directions when the display device 10 is seen in a plan view. For example, "left" indicates a direction of the first direction DR1, "right" indicates the other direction of the first direction DR1, "upper" indicates a direction of the second direction DR2, and "lower" indicates the other direction of the second direction DR2.

Referring to FIG. 1, the display device 10 displays moving images and/or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which may provide a display screen.

The display device 10 may include a display panel that provides a display screen. Examples of the display panel include inorganic light emitting diode display panels, organic light emitting display panels, quantum dot light emitting display panels, plasma display panels, and field emission display panels. An inorganic light emitting diode display panel, as an example of the display panel, will be described below, but the disclosure is not limited to this case, and other display panels can also be applied within the spirit and the scope of the disclosure.

The shape of the display device 10 can be variously modified. For example, the display device 10 may have various shapes such as a substantially horizontally long rectangle, a substantially vertically long rectangle, substantially a square, substantially a quadrangle with rounded corners (vertices), substantially other polygons, and substantially a circle. The shape of a display area DPA of the display device 10 may also be similar to the overall shape of the display device 10. In FIG. 1, each of the display device 10 and the display area DPA may be shaped like a substantially horizontally long rectangle.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy a center of the display device 10.

The display area DPA may include a plurality of pixels PX. The pixels PX may be arranged or disposed in a matrix direction. Each of the pixels PX may be rectangular or square in a plan view. However, the disclosure is not limited thereto, and each of the pixels PX may also have a substantially rhombic planar shape having each side inclined with respect to a direction. The pixels PX may be alternately arranged or disposed in a stripe or pentile type. For example, each of the pixels PX may include one or more light emitting elements ED which emit light of a specific or predetermined wavelength band to display a specific or predetermined color.

The non-display area NDA may be disposed around the display area DPA. The non-display area NDA may entirely or partially surround or may be adjacent to the display area DPA. The display area DPA may be substantially rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
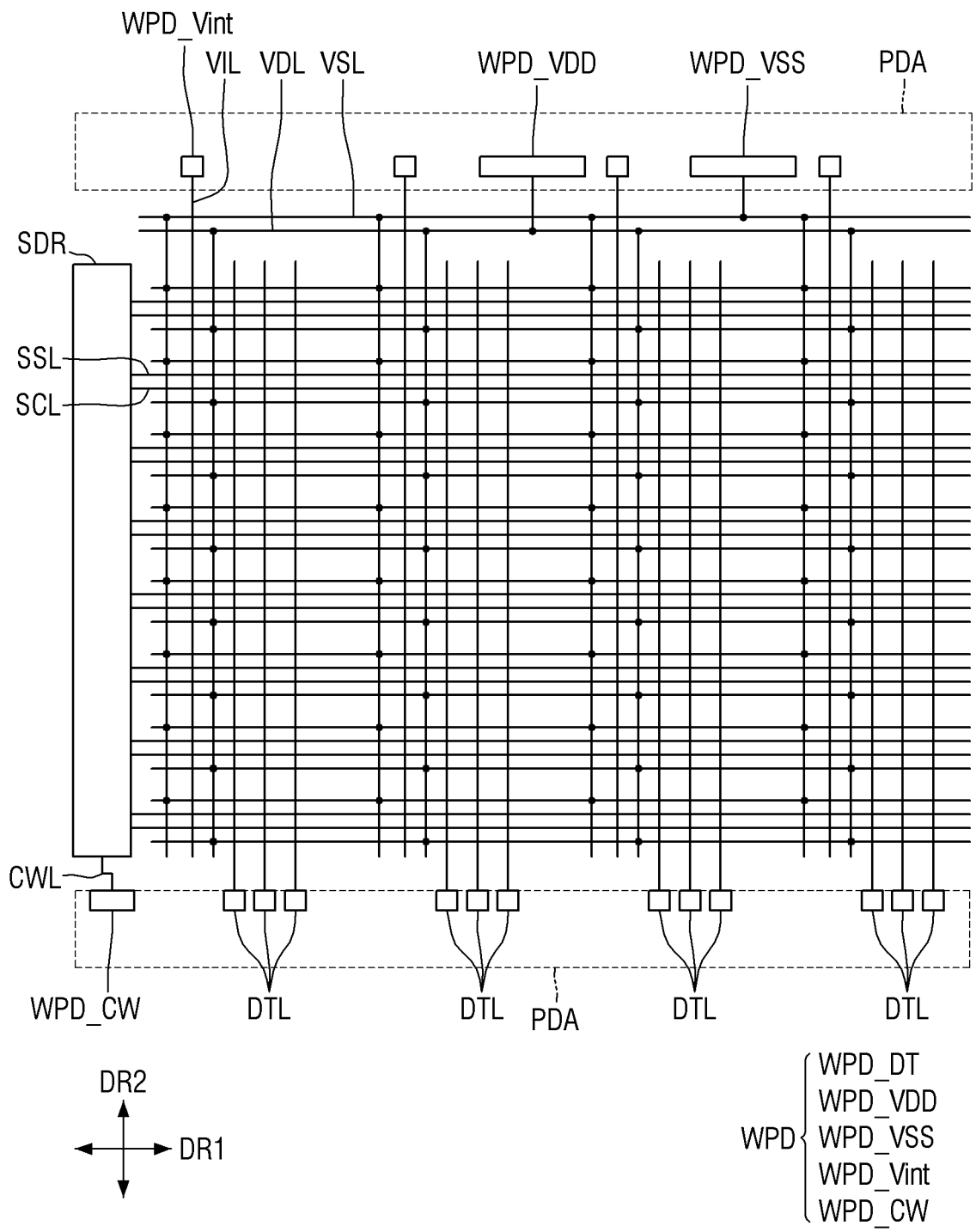
FIG. 2 is a schematic layout view of wirings included in the display device according to an embodiment.

FIG. 2 is a schematic layout view of wirings included in the display device 10 according to an embodiment.

Referring to FIG. 2, the display device 10 may include a plurality of wirings. The wirings may include first scan lines SCL, second scan lines SSL, data lines DTL, initialization voltage wirings VIL, a first voltage wiring VDL, and a second voltage wiring VSL. For example, although not illustrated in the drawing, other wirings may be further disposed in the display device 10.

The first scan lines SCL and the second scan lines SSL may extend in the first direction DR1. The first scan lines SCL and the second scan lines SSL may be electrically connected to a scan driver SDR. The scan driver SDR may include a driving circuit. The scan driver SDR may be disposed on a side of the display area DPA in the first direction DR1, but the disclosure is not limited thereto. The scan driver SDR may be electrically connected to a signal wiring pattern CWL, and at least one end of the signal wiring pattern CWL may form a pad WPD_CW in the non-display area NDA and thus be electrically connected to an external device.

In the disclosure, the term "connect" may mean that any one member and another member may be connected to each other not only through physical contact but also through another member. For example, it can be understood that any one part and another part may be connected to each other as one integrated member. Further, the connection between any one member and another member can be interpreted as including an electrical connection through another member in addition to as well as a connection through direct contact.

The data lines DTL and the initialization voltage wirings VIL may extend in the second direction DR2 intersecting the first direction DR1. The first voltage wiring VDL and the second voltage wiring VSL extend in the first direction DR1 and the second direction DR2. As will be described later, each of the first voltage wiring VDL and the second voltage wiring VSL may include parts extending in the first direction DR1 and parts extending in the second direction DR2, which may be made of conductive layers disposed on different layers, and may have a mesh structure in the entire display area DPA. However, the disclosure is not limited thereto. Each pixel PX of the display device 10 may be electrically connected to at least one data line DTL, an initialization voltage wiring VIL, the first voltage wiring VDL, and the second voltage wiring VSL.

The data lines DTL, the initialization voltage wirings VIL, the first voltage wiring VDL and the second voltage wiring VSL may be electrically connected to at least one wiring pad WPD. Each wiring pad WPD may be disposed in the non-display area NDA. In an embodiment, wiring pads WPD_DT (hereinafter, referred to as 'data pads') of the data lines DTL may be disposed in a pad area PDA on a side, which is perpendicular to the second direction DR2, of the display area DPA, and wiring pads WPD Vint (hereinafter, referred to as 'initialization voltage pads') of the initialization voltage wirings VIL, a wiring pad WPD_VDD (hereinafter, referred to as a 'first power pad') of the first voltage wiring VDL and a wiring pad WPD_VSS (hereinafter, referred to as a 'second power pad') of the second voltage wiring VSL may be disposed in the pad area PDA located or disposed on the other side of the display area DPA in the second direction DR2. For another example, the data pads WPD_DT, the initialization voltage pads WPD Vint, the first power pad WPD_VDD, and the second power pad WPD_VSS may all be disposed in the same area, for example, in the non-display area NDA located or disposed on an upper side of the display area DPA. An external device may be mounted on the wiring pads WPD. The external device may be mounted on the wiring pads WPD through an anisotropic conductive film, ultrasonic bonding, or the like within the spirit and the scope of the disclosure.

Each pixel PX or subpixel PXn (where n may be an integer of 1 to 3) of the display device 10 may include a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to an embodiment, each subpixel PXn of the display device 10 may have a 3T1C structure in which the pixel driving circuit may include three transistors and one capacitor. Although the pixel driving circuit will be described below using the 3T1C structure as an example, the disclosure is not limited thereto, and other various modified pixel structures such as a 2T1C structure, a 7T1C structure, and a 6T1C structure are also applicable.

Figure 3:
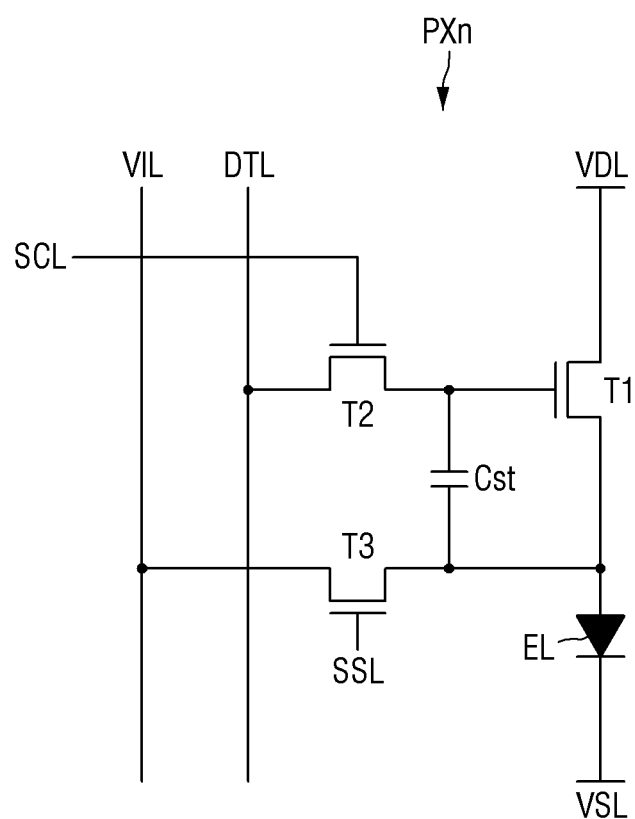
FIG. 3 is an equivalent circuit diagram of one subpixel according to an embodiment.

FIG. 3 is an equivalent circuit diagram of one subpixel PXn according to an embodiment.

Referring to FIG. 3, each subpixel PXn of the display device 10 according to an embodiment may include three transistors T1 through T3 and one storage capacitor Cst in addition to a light emitting diode EL.

The light emitting diode EL emits light according to a current supplied through a first transistor T1. The light emitting diode EL may include a first electrode, a second electrode, and at least one light emitting element disposed between them. The light emitting element may emit light of a specific or predetermined wavelength band in response to electrical signals received from the first electrode and the second electrode.

A first end of the light emitting diode EL may be electrically connected to a source electrode of the first transistor T1, and a second end of the light emitting diode EL may be electrically connected to the second voltage wiring VSL to which a low potential voltage (hereinafter, referred to as a second power supply voltage) lower than a high potential voltage (hereinafter, referred to as a first power supply voltage) is supplied. For example, the second end of the light emitting diode EL may be electrically connected to a source electrode of a second transistor T2.

The first transistor T1 adjusts a current flowing from the first voltage wiring VDL, to which the first power supply voltage is supplied, to the light emitting diode EL according to a voltage difference between a gate electrode and the source electrode. For example, the first transistor T1 may be a driving transistor for driving the light emitting diode EL. The first transistor T1 may have the gate electrode electrically connected to the source electrode of the second transistor T2, the source electrode electrically connected to the first electrode of the light emitting diode EL, and a drain electrode electrically connected to the first voltage wiring VDL to which the first power supply voltage may be applied.

The second transistor T2 may be turned on by a scan signal of a first scan line SCL to electrically connect a data line DTL to the gate electrode of the first transistor T1. The second transistor T2 may have a gate electrode electrically connected to the first scan line SCL, the source electrode electrically connected to the gate electrode of the first transistor T1, and a drain electrode electrically connected to the data line DTL.

A third transistor T3 may be turned on by a sensing signal of a second scan line SSL to electrically connect an initialization voltage wiring VIL to the first end of the light emitting diode EL. The third transistor T3 may have a gate electrode connected to the second scan line SSL, a drain electrode electrically connected to the initialization voltage wiring VIL, and a source electrode electrically connected to the first end of the light emitting diode EL or the source electrode of the first transistor T1.

In an embodiment, the source electrode and the drain electrode of each of the transistors T1 through T3 are not limited to the above description, and they may be referred to as conversely. For example, the source electrode may be termed the drain electrode and the drain electrode may be termed the source electrode within the spirit and the scope of the disclosure. For example, each of the transistors T1 through T3 may be formed as a thin-film transistor. For example, although each of the transistors T1 through T3 is mainly described as an N-type metal oxide semiconductor field effect transistor (MOSFET) in FIG. 3, the disclosure is not limited thereto. For example, each of the transistors T1 through T3 may also be a P-type MOSFET, or some or a predetermined number of the transistors T1 through T3 may be N-type MOSFETs, and the other(s) may be (a) P-type MOSFET(s).

The storage capacitor Cst is formed between the gate electrode and the source electrode of the first transistor T1. The storage capacitor Cst stores a difference between a gate voltage and a source voltage of the first transistor T1.

The structure of one pixel PX of the display device 10 according to an embodiment will now be described in detail by further referring to another drawing.

Figure 4:
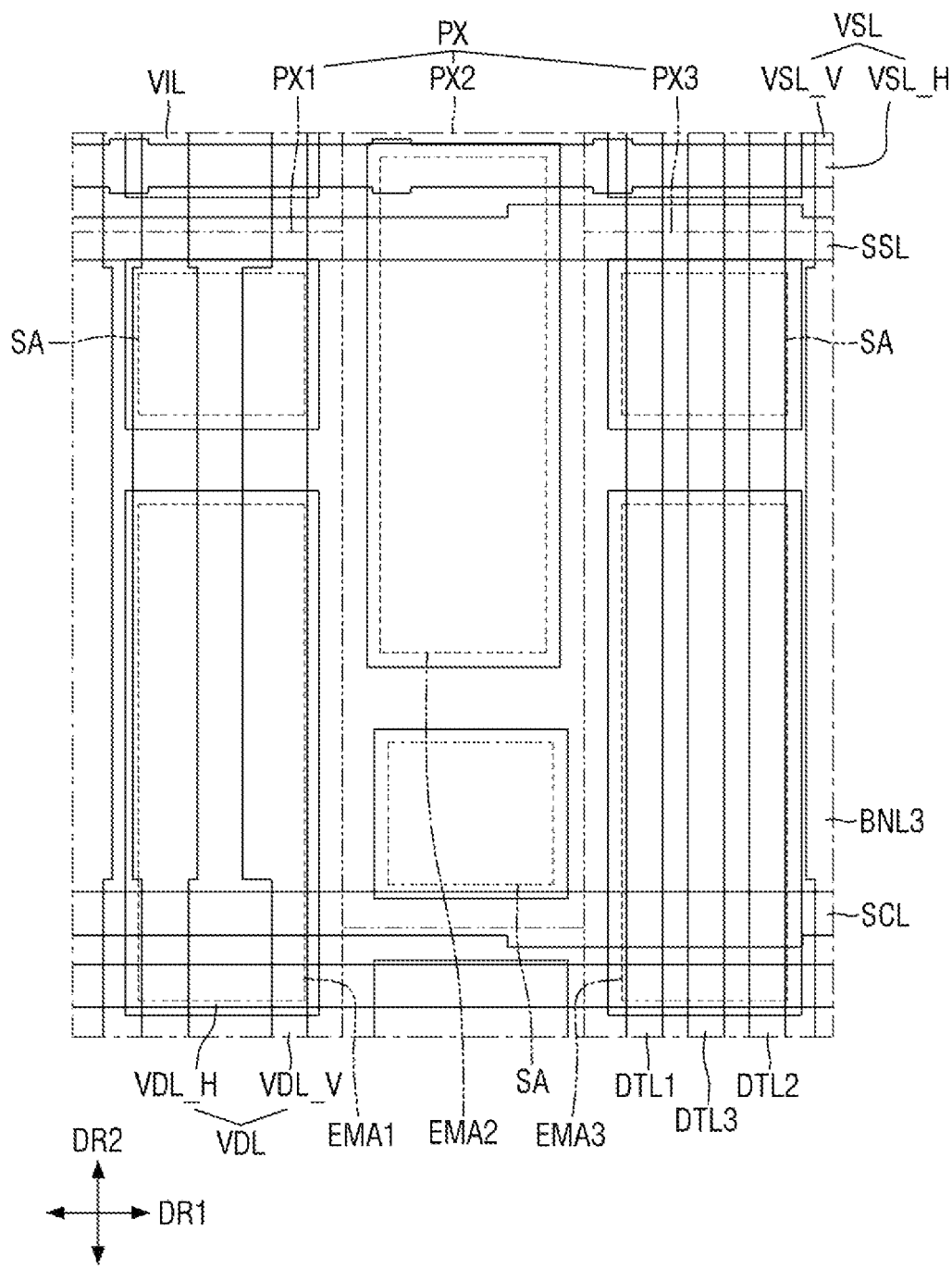
FIG. 4 is a schematic plan view of wirings disposed in one pixel of the display device according to an embodiment.

FIG. 4 is a schematic plan view of wirings disposed in one pixel PX of the display device 10 according to an embodiment. In FIG. 4, while schematic shapes of a plurality of wirings and a third bank BNL3 disposed in each pixel PX of the display device 10 are illustrated, members disposed in an emission area EMA of each subpixel PXn and some or a predetermined number conductive layers disposed under or below the members are not illustrated. In each of the following drawings, both sides of the first direction DR1 may be referred to as a left side and a right side, respectively, and both sides of the second direction DR2 may be referred to as an upper side and a lower side, respectively.

Referring to FIG. 4, each of the pixels PX of the display device 10 may include a plurality of subpixels PXn (where n may be an integer of 1 to 3). For example, one pixel PX may include a first subpixel PX1, a second subpixel PX2, and a third subpixel PX3.

One pixel PX of the display device 10 may include a plurality of emission areas EMA, and each subpixel PXn may include an emission area EMA and a non-emission area (not illustrated). The emission area EMA may be an area in which light emitting elements ED (see FIG. 14) may be disposed to emit light of a specific or predetermined wavelength band, and the non-emission area may be an area where the light emitting elements ED may not be disposed and light emitted from the light emitting elements ED does not reach so that no light may be output from this area. The emission area EMA may include an area where light emitted from the light emitting elements ED may be output to an area adjacent to the light emitting elements ED, in addition to an area where the light emitting elements ED may be disposed.

However, the emission area EMA may also include an area from which light emitted from the light emitting elements ED is output after being reflected or refracted by other members. A plurality of light emitting elements ED may be disposed in each subpixel PXn, and an area where the light emitting elements ED may be disposed and an area adjacent thereto may form the emission area EMA.

A first emission area EMA1 of the pixel PX is disposed in the first subpixel PX1, a second emission area EMA2 is disposed in the second subpixel PX2, and a third emission area EMA3 is disposed in the third subpixel PX3. The subpixels PXn include different types of light emitting elements ED so that light of different colors may be emitted from the first through third emission areas EMA1 through EMA3. For example, the first subpixel PX1 may emit light of a first color, the second subpixel PX2 may emit light of a second color, and the third subpixel PX3 may emit light of a third color. The first color may be green, the second color may be blue, and the third color may be red. However, the disclosure is not limited thereto, and the subpixels PXn may also include the same type of light emitting elements ED so that light of the same color is emitted from the emission areas EMA or one pixel PX.

For example, each subpixel PXn of the pixel PX may include a sub area SA which may be a part of the non-emission area and spaced apart from the emission area EMA. The sub area SA may be disposed on a side of the emission area EMA of each subpixel PXn in the second direction DR2 and may be disposed between the emission areas EMA of subpixels PXn neighboring each other in the second direction DR2. Light may not exit from the sub area SA because the light emitting elements ED may not be disposed in the sub area SA, but parts of electrodes RME (see FIG. 8) disposed in each subpixel PXn may be disposed in the sub area SA. Some or a predetermined number of the electrodes RME disposed in each subpixel PXn may be split or separated in the sub area SA. It is to be understood that neighboring may also mean adjacent to in the disclosure.

According to an embodiment, each pixel PX of the display device 10 may include subpixels PXn having different arrangements of the emission area EMA and the sub area SA. In each subpixel PXn included in one pixel PX, the emission area EMA and the sub area SA neighbor each other in the second direction DR2. In some or a predetermined number of subpixels PXn, the direction in which the sub area SA is disposed with respect to the emission area EMA may be different. For example, the emission area EMA and the sub area SA of each subpixel PX may be alternately arranged or disposed along the second direction DR2, and, similarly, the emission areas EMA and the sub areas SA of different subpixels PXn may be alternately arranged or disposed along the first direction DR1.

For example, in the first subpixel PX1 and the third subpixel PX3, the sub area SA may be disposed on an upper side of the emission area EMA which may be a first side of the second direction DR2. In the second subpixel PX2, the sub area SA may be disposed on a lower side of the emission area EMA which may be a second side of the second direction DR2. The emission areas EMA of the first through third subpixels PX1 through PX3 may not be disposed side by side with each other in the first direction DR1. The first emission area EMA1 and the third emission area EMA3 may be side by side with each other in the first direction DR1, but the sub area SA of the second subpixel PX2 may be disposed between them. Similarly, the sub areas SA of the subpixels PXn may not neighbor each other in the first direction DR1 or the second direction DR2 and may be spaced apart from each other in one direction or in a diagonal direction. For example, the sub areas SA of the first subpixel PX1 and the third subpixel PX3 may be side by side with each other in the first direction DR1 but may be spaced apart so as not to neighbor each other, and the second emission area EMA2 may be disposed between them. The sub area SA of the second subpixel PX2 may be spaced apart from the sub areas SA of the first subpixel PX1 and the third subpixel PX3 in the diagonal direction. Accordingly, a plurality of emission areas EMA, for example, the first emission area EMA1 and the third emission area EMA3 may be disposed in a substantially island-shaped or isolated structure in the diagonal direction between the first direction DR1 and the second direction DR2, respectively, with respect to any one emission area EMA, for example, the second emission area EMA2.

As will be described later, a plurality of subpixels PXn may be disposed in one pixel PX, and each of the subpixels PXn may include a plurality of electrodes RME (see FIG. 8) and a plurality of light emitting elements ED (see FIG. 8).

The light emitting elements ED may be disposed in the emission area EMA of each subpixel PXn, and the electrodes RME may be disposed across the emission area EMA and the sub area SA of each subpixel PXn. Since the first subpixel PX1 and the third subpixel PX3 have an arrangement of the emission area EMA and the sub area SA different from an arrangement of the second subpixel PX2, the arrangement of the light emitting elements ED and the electrodes RME may also be different depending on the type of subpixel PXn.

The display device 10 according to an embodiment may include different types of subpixels PXn having different arrangements of the light emitting elements ED and the electrodes RME according to the arrangement of the emission area EMA and the sub area SA. Thus, the emission area EMA having a sufficient area per unit area may be secured. For example, by forming color control structures with greater widths, a reduction in the amount of output light due to deterioration may be prevented.

The emission area EMA needs a minimum area for accommodating the electrodes RME and the light emitting elements ED. When the emission areas EMA of a plurality of subpixels PXn may be arranged or disposed in one direction, the area occupied by each subpixel PXn increases to secure a space for accommodating the electrodes RME and the light emitting elements ED, thus the number of subpixels PXn per unit area may be reduced. However, increasing the number of subpixels PXn per unit area and reducing the area of each subpixel PXn may reduce the number of light emitting elements ED disposed in the emission area EMA, thereby lowering luminance.

For example, when the display device 10 may include color control structures disposed to correspond to the emission areas EMA and having organic materials, the color control structures may have smaller widths than designed widths due to deterioration of the organic materials, and the amount of light output through the light emitting elements ED and the color control structures of the subpixels PXn having a small area may be absolutely reduced.

On the other hand, when the electrodes RME and the light emitting elements ED of the subpixels PXn disposed in the display device 10 may be arranged or disposed as described above, each subpixel PXn can secure the emission area EMA having a sufficient area. Accordingly, the color control structures can also be designed to have a sufficient area considering deterioration, and even if the widths of the color control structures may be reduced due to deterioration, a reduction in the amount of output light can be minimized. Therefore, since the display device 10 according to an embodiment can secure the emission areas EMA having a sufficient area per unit area due to the above-described arrangement of the electrodes RME and the light emitting elements ED of the subpixels PXn, it is advantageous in implementing a high-resolution display device. This will be described in more detail later.

The third bank BNL3 may include parts extending in the first direction DR1 and the second direction DR2 in a plan view to form a lattice pattern over the entire display area DPA. The third bank BNL3 may be disposed at the boundary of each subpixel PXn to separate neighboring subpixels PXn. For example, the third bank BNL3 may surround the emission area EMA and the sub area SA disposed in each subpixel PXn to separate them from each other. The third bank BNL3 will be described in more detail later.

The above-described wirings may be disposed in each pixel PX of the display device 10. For example, the display device 10 may include wiring horizontal parts VDL_H and VSL_H of the first voltage wiring VDL and the second voltage wiring VSL, for example to a first scan line SCL and a second scan line SSL extending in the first direction DR1. For example, the display device 10 may include a plurality of data lines DTL, an initialization voltage wiring VIL, and wiring vertical parts VDL_V and VSL_V of the voltage wirings VDL and VSL extending in the second direction DR2.

Wirings and circuit elements of a circuit layer disposed in each pixel PX and electrically connected to the light emitting diodes EL may be electrically connected to each of the first through third subpixels PX1 through PX3. The wirings and the circuit elements may not be disposed corresponding to an area occupied by each subpixel PXn or each emission area EMA but rather may be disposed regardless of the positions of the emission areas EMA in one pixel PX. For example, in the display device 10 according to an embodiment, a circuit layer for driving the light emitting diode EL of each subpixel PXn may be disposed regardless of the positions of the subpixels PXn or the emission areas EMA in each pixel PX.

One pixel PX may include the first through third subpixels PX1 through PX3, and a circuit layer electrically connected to the first through third subpixels PX1 through PX3 may be disposed in a specific or predetermined pattern. The patterns may be repeated not on a subpixel-by-subpixel basis but on a pixel-by-pixel basis. The subpixels PXn disposed in one pixel PX may be areas separated based on the emission area EMA and the sub area SA, and the circuit layer electrically connected to the subpixels PXn may be disposed regardless of the areas of the subpixels PXn. In the display device 10, since the wirings and elements of the circuit layer may be repeatedly disposed on a unit pixel-by-unit pixel basis, not on a subpixel-by-subpixel basis, the area occupied by the wirings and elements electrically connected to each subpixel PXn can be minimized, and a high-resolution display device can be more advantageously implemented.

The arrangement of wirings disposed in each pixel PX will now be described in detail. A plurality of data lines DTL1 through DTL3 extend in the second direction DR2. In the display area DPA, the data lines DTL1 through DTL3 may be disposed in a plurality of pixels PX arranged or disposed in the second direction DR2 and may be spaced apart from each other in the first direction DR1. First through third data lines DTL1 through DTL3 may be disposed in one pixel PX and may be electrically connected to subpixels PXn, for example, the first through third subpixels PX1 through PX3. The first data line DTL1, the third data line DTL3, and the second data line DTL2 may be sequentially arranged or disposed along the first direction DR1. For example, while the first subpixel PX1, the subpixel PX2, and the third subpixel PX3 may be sequentially arranged or disposed toward a first side of the first direction DR1, the first data line DTL1, the third data line DTL3, and the second data line DTL2 may be sequentially arranged or disposed in this order toward the first side of the first direction DR1. Each of the data lines DTL1 through DTL3 may be electrically connected to a second transistor T2 (see FIG. 5) through a conductive pattern disposed in a different conductive layer and may transmit a data signal to the second transistor T2 (see FIG. 5). However, as described above, the first through third data lines DTL1 through DTL3 may not be disposed to respectively correspond to areas occupied by the first through third subpixels PX1 through PX3 but may be disposed at a specific or predetermined position in one pixel PX. Although the first through third data lines DTL1 through DTL3 may be arranged or disposed over an area occupied by the second subpixel PX2 and the third subpixel PX3 in the drawing, the disclosure is not limited thereto.

The initialization voltage wiring VIL extends in the second direction DR2 across a plurality of pixels PX arranged or disposed in the second direction DR2. In the display area DPA, a plurality of initialization voltage wirings VIL may be spaced apart from each other in the first direction DR1, and each of the initialization voltage wirings VIL may be disposed across a plurality of pixels PX arranged or disposed in the same column. The initialization voltage wiring VIL may be disposed on a left side of the first data line DTL1 and on a left side of a center of each pixel PX in a plan view, but the disclosure is not limited thereto. One initialization voltage wiring VIL may be disposed for each of the pixels PX arranged or disposed in the first direction DR1 and may be electrically connected to each subpixel PXn by being electrically connected to a conductive pattern disposed in a different conductive layer. The initialization voltage wiring VIL may be electrically connected to the drain electrode of a third transistor T3 (see FIG. 5) and may supply an initialization voltage to the third transistor T3 (see FIG. 5).

The first voltage wiring VDL and the second voltage wiring VSL may extend in the first direction DR1 and the second direction DR2. In an embodiment, the first voltage wiring VDL and the second voltage wiring VSL may respectively include the wiring vertical parts VDL_V and VSL_V extending in the second direction DR2. The wiring vertical parts VDL_V and VSL_V extend in the second direction DR2 across a plurality of pixels PX neighboring each other in the second direction DR2. A first wiring vertical part VDL_V of the first voltage wiring VDL may be disposed on a right side, which is the first side of the first direction DR1, of the initialization voltage wiring VIL. And a second wiring vertical part VSL_V of the second voltage wiring VSL may be disposed on a left side, which is a second side of the first direction DR1, of the initialization voltage wiring VIL. The second wiring vertical part VSL_V may be disposed at a boundary between pixels PX neighboring each other in the first direction DR1. In the drawing, the second wiring vertical part VSL_V may be disposed on both left and right sides of the pixel PX, for example, at each boundary between neighboring pixels PX. Each of the wiring vertical parts VDL_V and VSL_V may intersect the wiring horizontal part VDL_H or VSL_H, which will be described later, and may be electrically connected to the wiring horizontal part VDL_H or VSL_H through a contact hole at an intersection with the wiring horizontal part VDL_H or VSL_H to form one voltage wiring VDL or VSL. However, the arrangement and configuration of the voltage wirings VDL and VSL are not limited to those illustrated in FIG. 4, and the arrangement of the voltage wirings VDL and VSL can be variously changed.

The data lines DTL1 through DTL3, the initialization voltage wiring VIL, and the wiring vertical parts VDL_V and VSL_V of the voltage wirings VDL and VSL may each be made of a first conductive layer, respectively. The first conductive layer may include another conductive layer in addition to the above wirings and lines.

The first scan line SCL and the second scan line SSL may extend in the first direction DR1 across a plurality of pixels PX arranged or disposed in the first direction DR1. For example, a plurality of first scan lines SCL and a plurality of second scan lines SSL may be spaced apart from each other in the second direction DR2, and each of the first scan lines SCL and each of the second sensing lines SSL may be disposed across a plurality of pixels PX arranged or disposed in the same row. The first scan line SCL may be disposed on a lower side of the center of each pixel PX in a plan view, and the second scan line SSL may be disposed on an upper side of the center of each pixel PX in a plan view. The first scan line SCL and the second scan line SSL may be disposed in the emission areas EMA and the non-emission areas of some or a predetermined number of subpixels PXn. As described above, since one pixel PX in the display device 10 may include different types of subpixels having different arrangements of the emission area EMA and the sub area SA, the first scan line SCL and the second scan line SSL extending in one direction may be disposed in the emission areas EMA or the sub areas SA of some or a predetermined number of subpixels PXn. However, the positions of the first scan line SCL and the second scan line SSL are not limited to the above positions and can be variously changed according to the structure of the pixel PX. The first scan line SCL and the second scan line SSL may be electrically connected to a gate pattern which is made of a second conductive layer on the first conductive layer and extends in the second direction DR2. A part of the gate pattern may serve as the gate electrode of a second transistor T2 (see FIG. 5) or a third transistor T3 (see FIG. 5).

The wiring horizontal parts VDL_H and VSL_H of the first voltage wiring VDL and the second voltage wiring VSL may extend in the first direction DR1 across a plurality of pixels PX neighboring each other in the first direction DR1. The wiring horizontal parts VDL_H and VSL_H may be spaced apart from each other in the second direction DR2, and each of the wiring horizontal parts VDL_H and VSL_H may be disposed across a plurality of pixels PX arranged or disposed in the same row. A first wiring horizontal part VDL_H of the first voltage wiring VDL may be disposed on the lower side, which is the second side of the second direction DR2, of the center of each pixel PX, and a second wiring horizontal part VSL_H of the second voltage wiring VSL may be disposed on the upper side, which is the first side of the second direction DR2, of the center of each pixel PX. The wiring vertical parts VDL_V and VSL_V and the wiring horizontal parts VDL_H and VSL_H may be made of conductive layers disposed on different layers and may be electrically connected to each other through contact holes. For example, the first wiring horizontal part VDL_H may be disposed on a lower side of each pixel PX and may be electrically connected to the first wiring vertical part VDL_V through a contact hole at an intersection with the first wiring vertical part VDL_V but may not be electrically connected to the second wiring vertical part VSL_V at an intersection with the second wiring vertical part VSL_V. Similarly, the second wiring horizontal part VSL_H may be disposed on the upper side of each pixel PX and may be electrically connected to the second wiring vertical part VSL_V through a contact hole at an intersection with the second wiring vertical part VSL_V but may not be electrically connected to the first wiring vertical part VDL_V at an intersection with the first wiring vertical part VDL_V.

The first voltage wiring VDL and the second voltage wiring VSL may extend in the first direction DR1 and the second direction DR2 in the entire display area DPA so as to have a mesh structure. For example, the first through third subpixels PX1 through PX3 of one pixel PX may share the same first voltage wiring VDL and the same second voltage wiring VSL. As described above, since a plurality of subpixels PXn in each pixel PX share the first voltage wiring VDL and the second voltage wiring VSL to which the same signal is applied, the number of wirings disposed per unit area can be reduced.

In an embodiment, the wiring horizontal parts VDL_H and VSL_H of the first voltage wiring VDL and the second voltage wiring VSL may be disposed to correspond to one pixel PX, and the pixel PX may share the wiring horizontal parts VDL_H and VSL_H with other pixels PX adjacent to the pixel PX in the second direction DR2. In the latter case, the wiring horizontal parts VDL_H and VSL_H may not be repeatedly arranged or disposed every pixel row along the second direction DR2 but may be alternately arranged or disposed with each other. Since the first voltage wiring VDL and the second voltage wiring VSL may be disposed in a mesh structure including the wiring vertical parts VDL_V and VSL_V in addition to as well as the wiring horizontal parts VDL_H and VSL_H, they may be electrically connected to all pixels PX even if the wiring horizontal parts VDL_H and VSL_H may be alternately arranged or disposed instead of being disposed in each pixel PX. Accordingly, it may be possible to further reduce the number of wirings disposed in the display area DPA and prevent a drop (IR drop) of a voltage applied through the voltage wirings VDL and VSL in a large-area display device.

The first voltage wiring VDL may be electrically connected to the drain electrode of the first transistor T1 of each subpixel PXn and may apply the first power supply voltage to the first transistor T1. The second voltage wiring VSL may be electrically connected to the second electrode of a light emitting diode EL and may apply the second power supply voltage to the light emitting element.

The first scan line SCL, the second scan line SSL, and the wiring horizontal parts VDL_H and VSL_H may be made of a third conductive layer on the second conductive layer. For example, the third conductive layer may include other conductive patterns in addition to the above wirings and lines.

In the display device 10 according to an embodiment, a circuit layer that transmits a signal for driving the light emitting diodes EL may include the first through third conductive layers. For example, each of the first voltage wiring VDL and the second voltage wiring VSL which apply power supply voltages to the light emitting diodes EL may be composed of wirings disposed in the first conductive layer and the third conductive layer and may be disposed on the same layer as the data lines DTL, the initialization voltage wiring VIL, or other conductive patterns. The structure of each subpixel PXn will now be described in more detail by further referring to other drawings.

Figure 5:
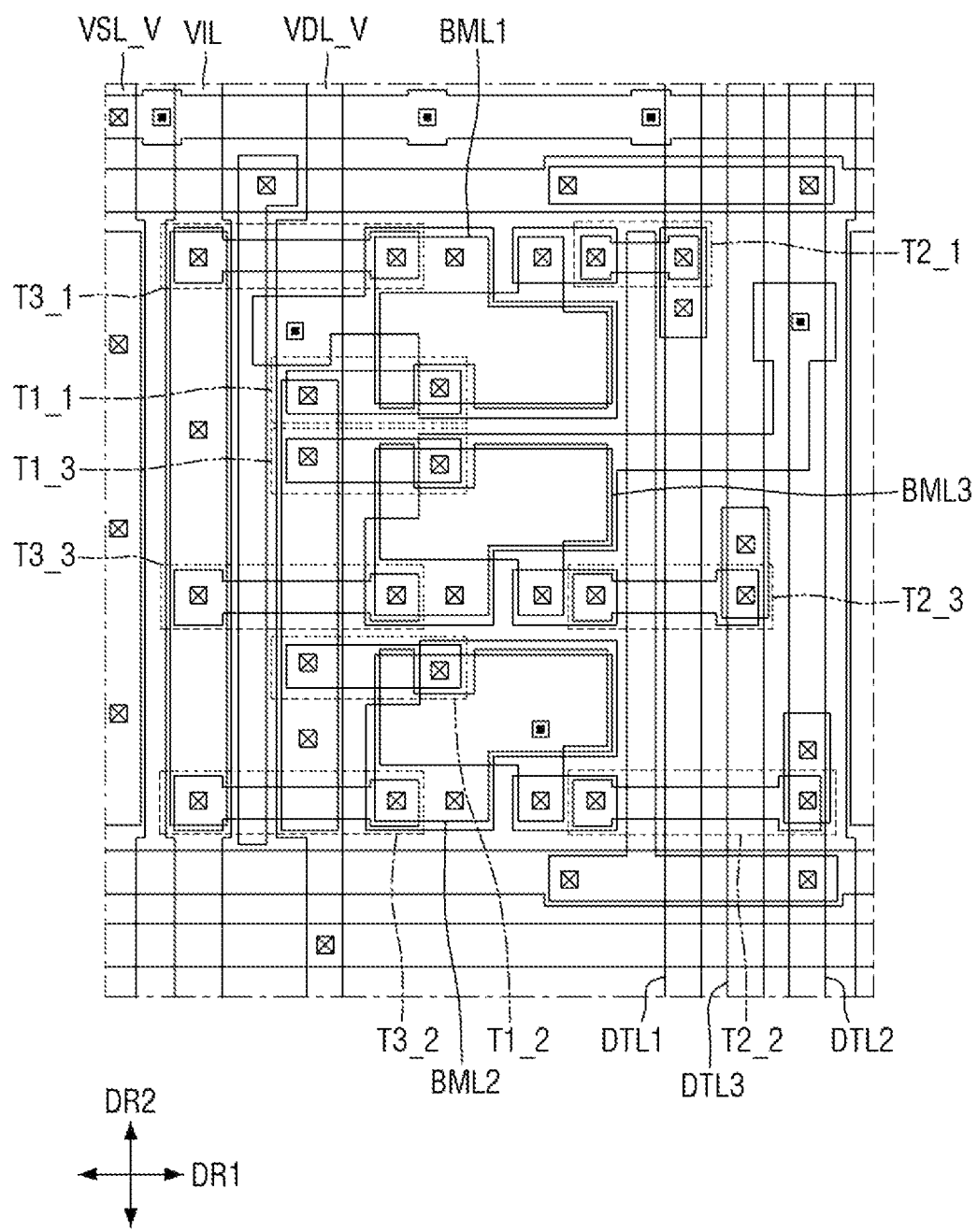
FIGS. 5 through 7 are layout views illustrating the arrangement of a plurality of conductive layers included in one pixel of the display device according to an embodiment.
Figure 6:
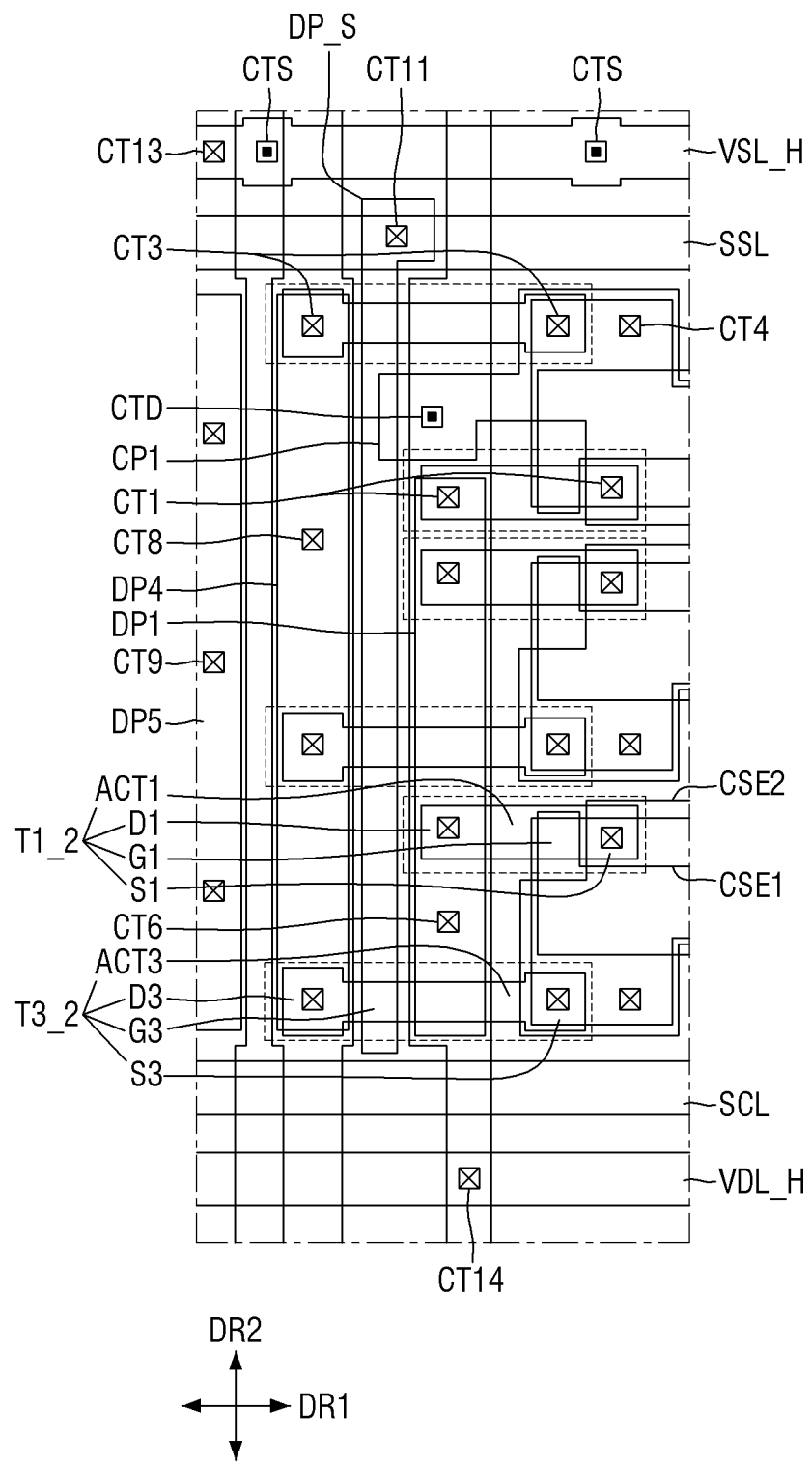
Figure 7:
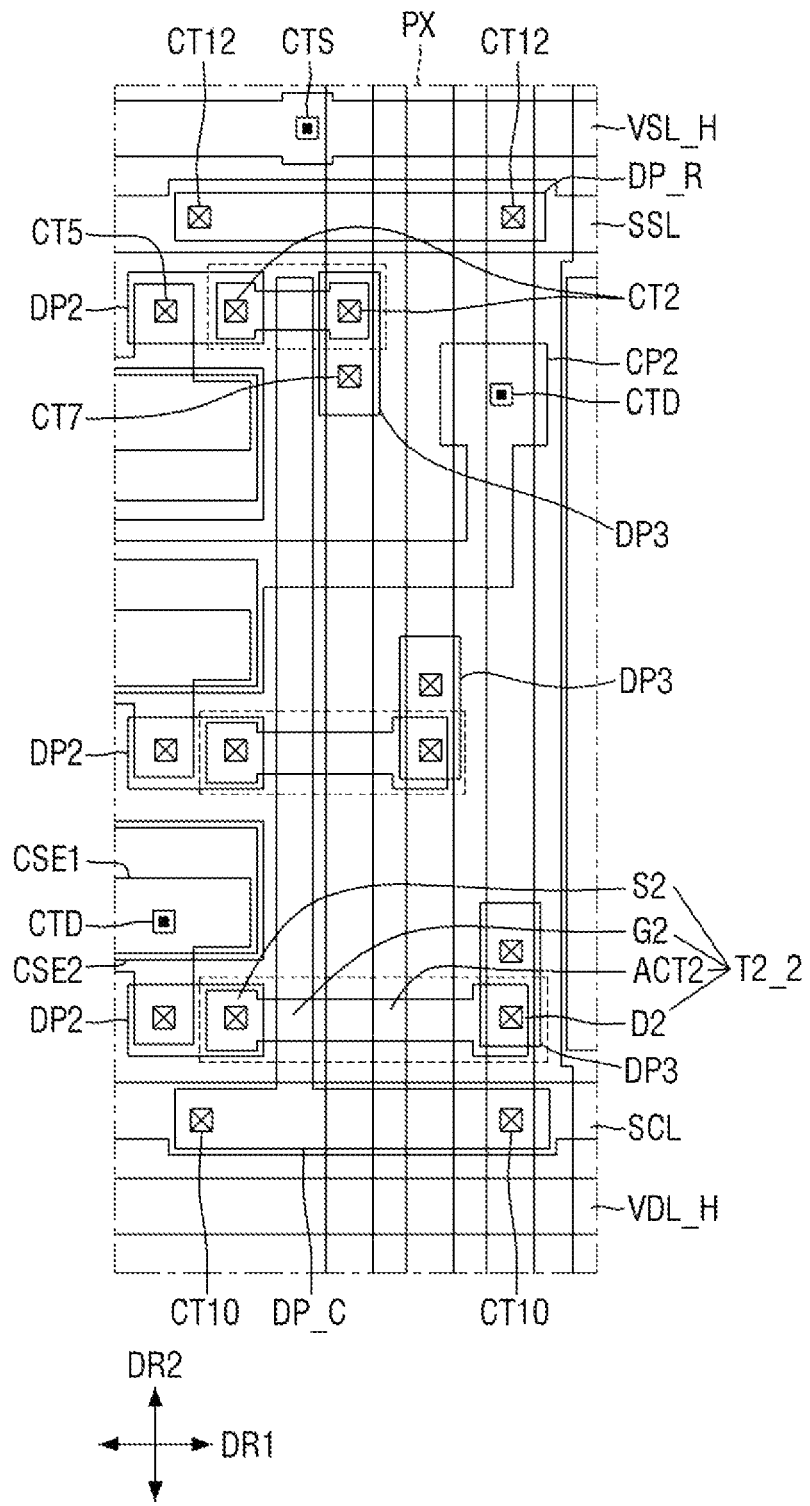
Figure 10:
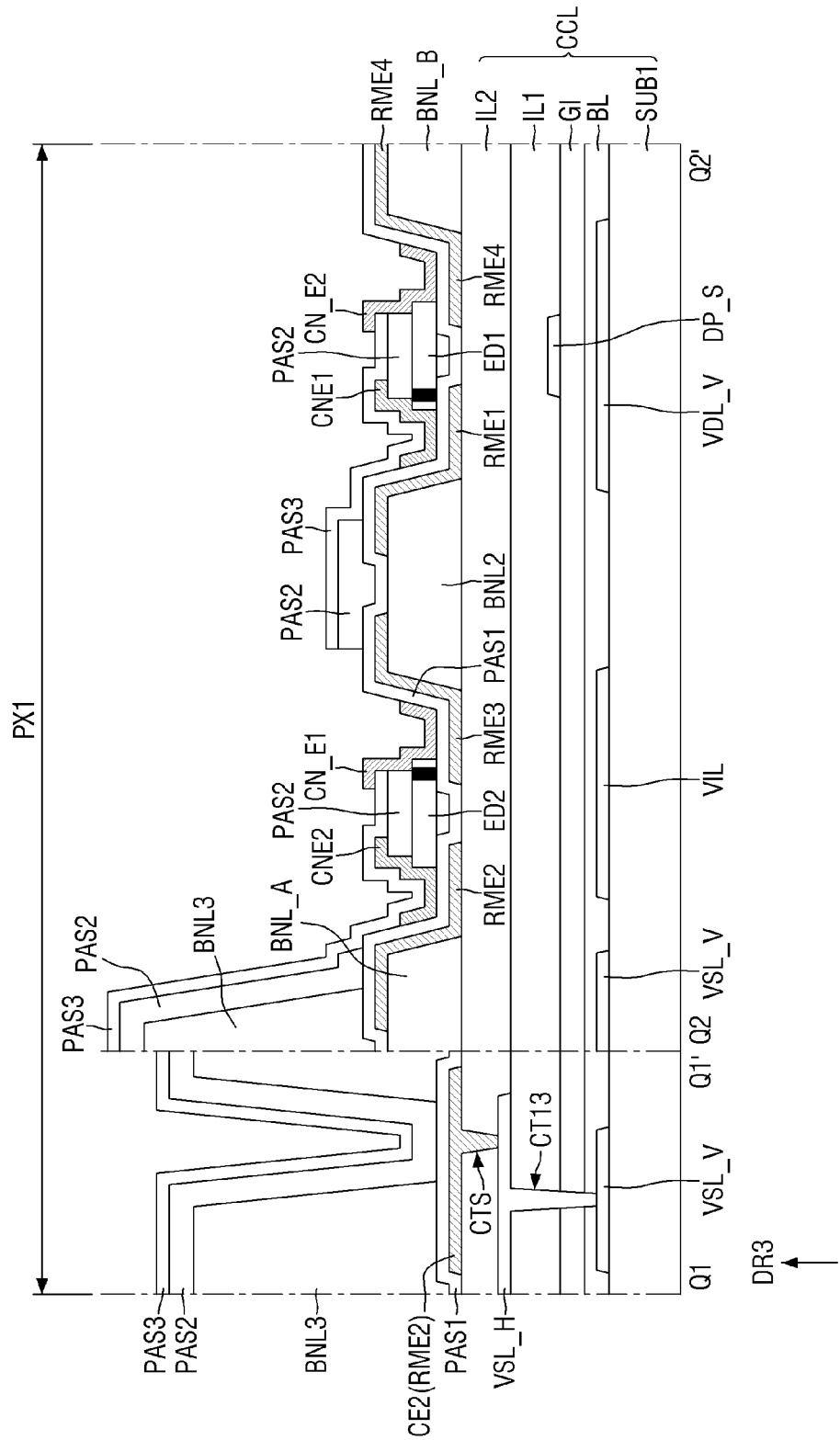
FIG. 10 is a schematic cross-sectional view taken along lines Q1-Q1' and Q2-Q2' of FIG. 8.
Figure 11:
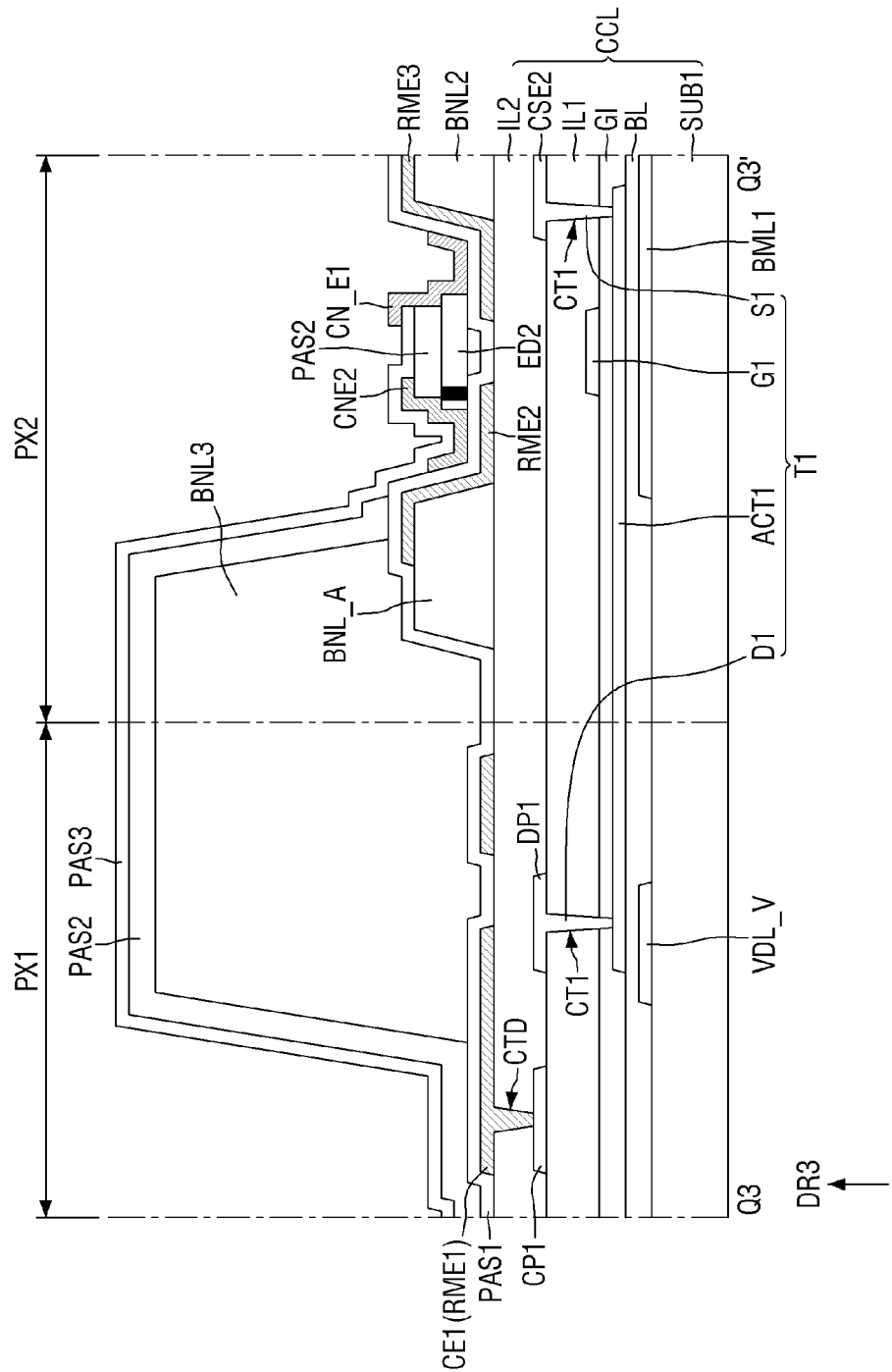
FIG. 11 is a schematic cross-sectional view taken along line Q3-Q3' of FIG. 8.
Figure 12:
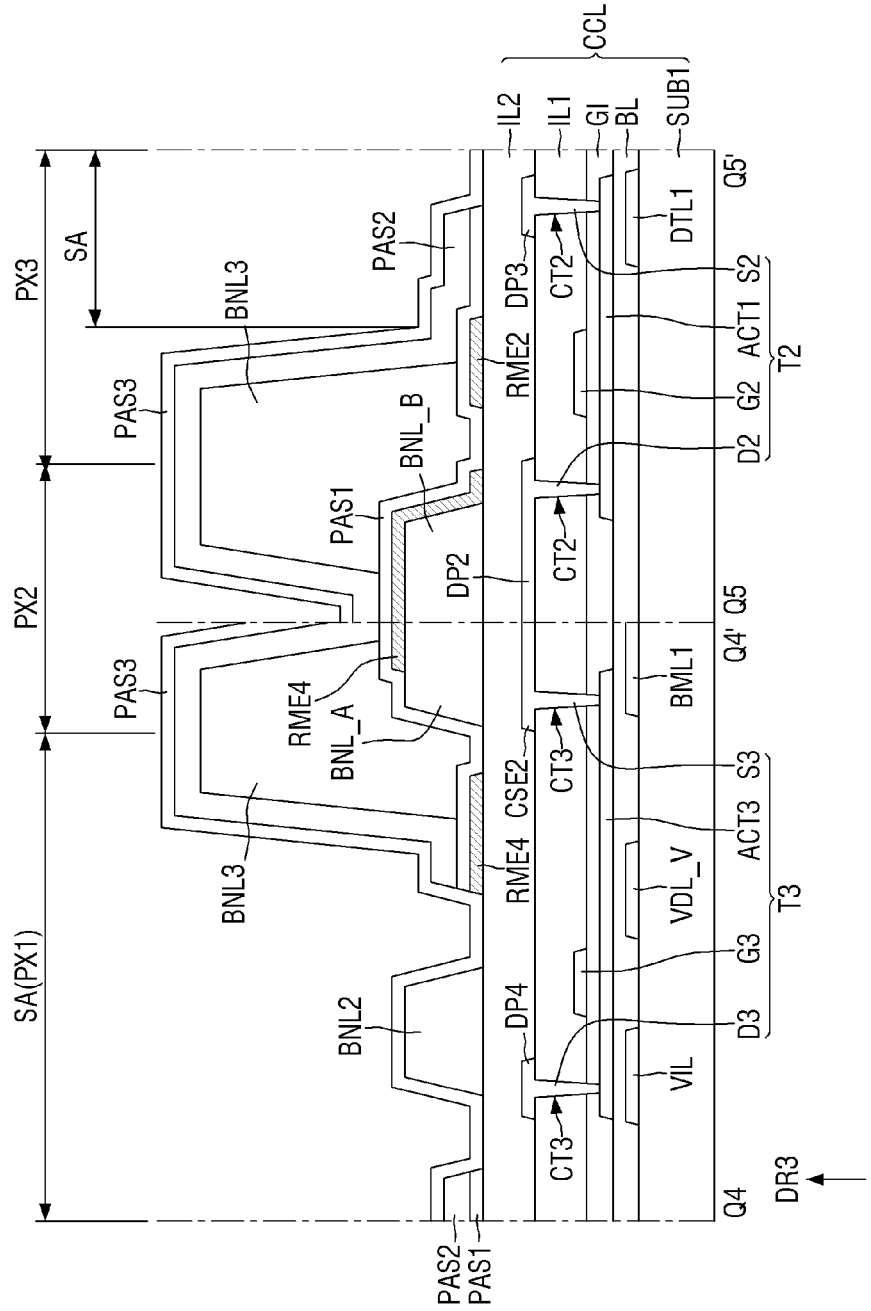
FIG. 12 is a schematic cross-sectional view taken along lines Q4-Q4' and Q5-Q5' of FIG. 8.
Figure 13:
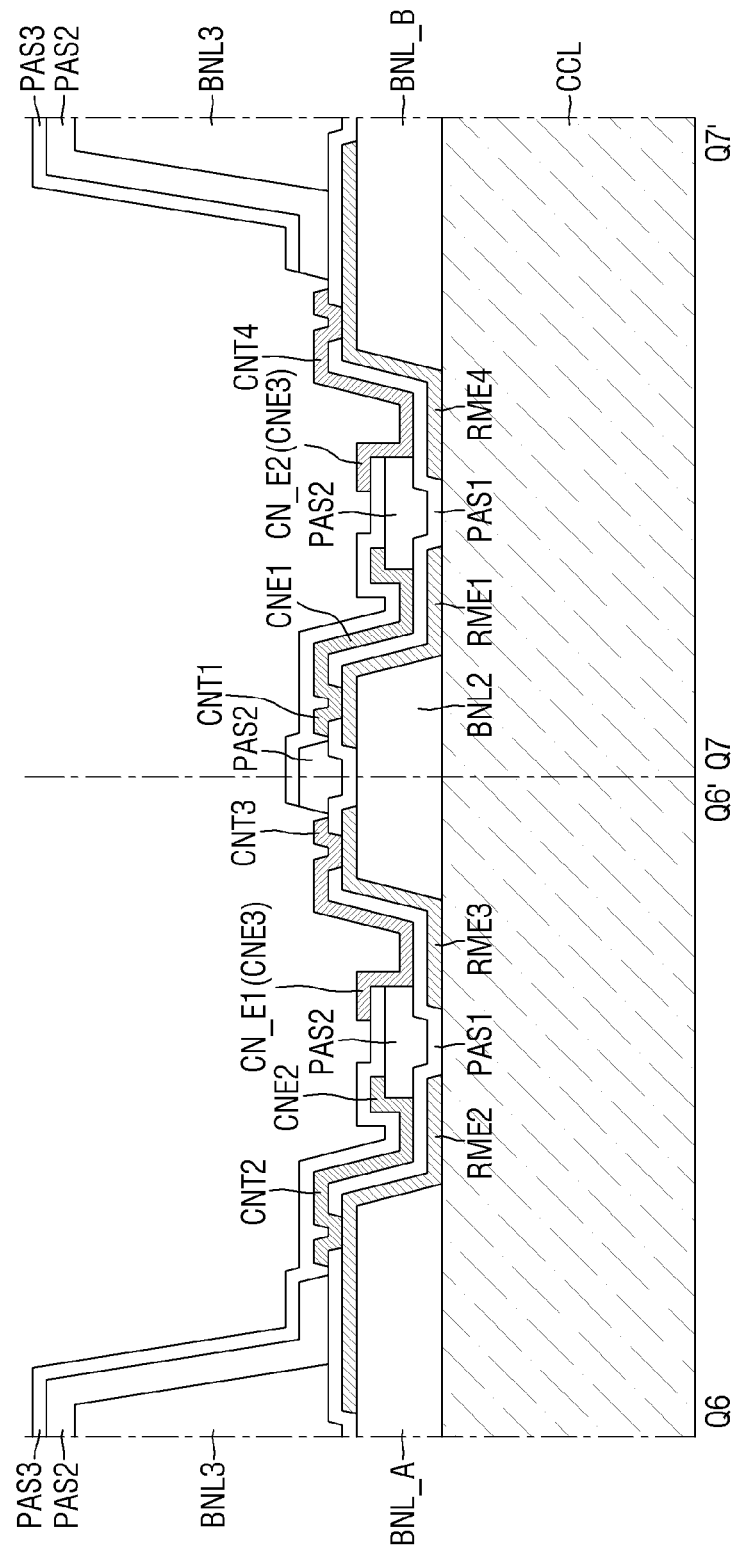
FIG. 13 is a schematic cross-sectional view taken along lines Q6-Q6' and Q7-Q7' of FIG. 8.

FIGS. 5 through 7 are layout views illustrating the arrangement of a plurality of conductive layers in one pixel PX of the display device 10 according to an embodiment. FIG. 8 is a schematic plan view of a plurality of electrodes and a plurality of banks included in one pixel PX of the display device 10 according to an embodiment. FIG. 9 is a plan view of a plurality of electrodes and a plurality of banks in the first subpixel PX1 of FIG. 8. FIG. 10 is a schematic cross-sectional view taken along lines Q1-Q1' and Q2-Q2' of FIG. 8. FIG. 11 is a schematic cross-sectional view taken along line Q3-Q3' of FIG. 8. FIG. 12 is a schematic cross-sectional view taken along lines Q4-Q4' and Q5-Q5' of FIG. 8. FIG. 13 is a schematic cross-sectional view taken along lines Q6-Q6' and Q7-Q7' of FIG. 8.

FIGS. 5 through 7 illustrate the planar arrangement of wirings and elements of a circuit layer CCL electrically connected to one pixel PX. FIG. 5 illustrates the planar arrangement of the first conductive layer, an active layer, the second conductive layer and the third conductive layer, and FIGS. 6 and 7 respectively illustrate different parts of the conductive layers disposed in one pixel PX.

Figure 8:
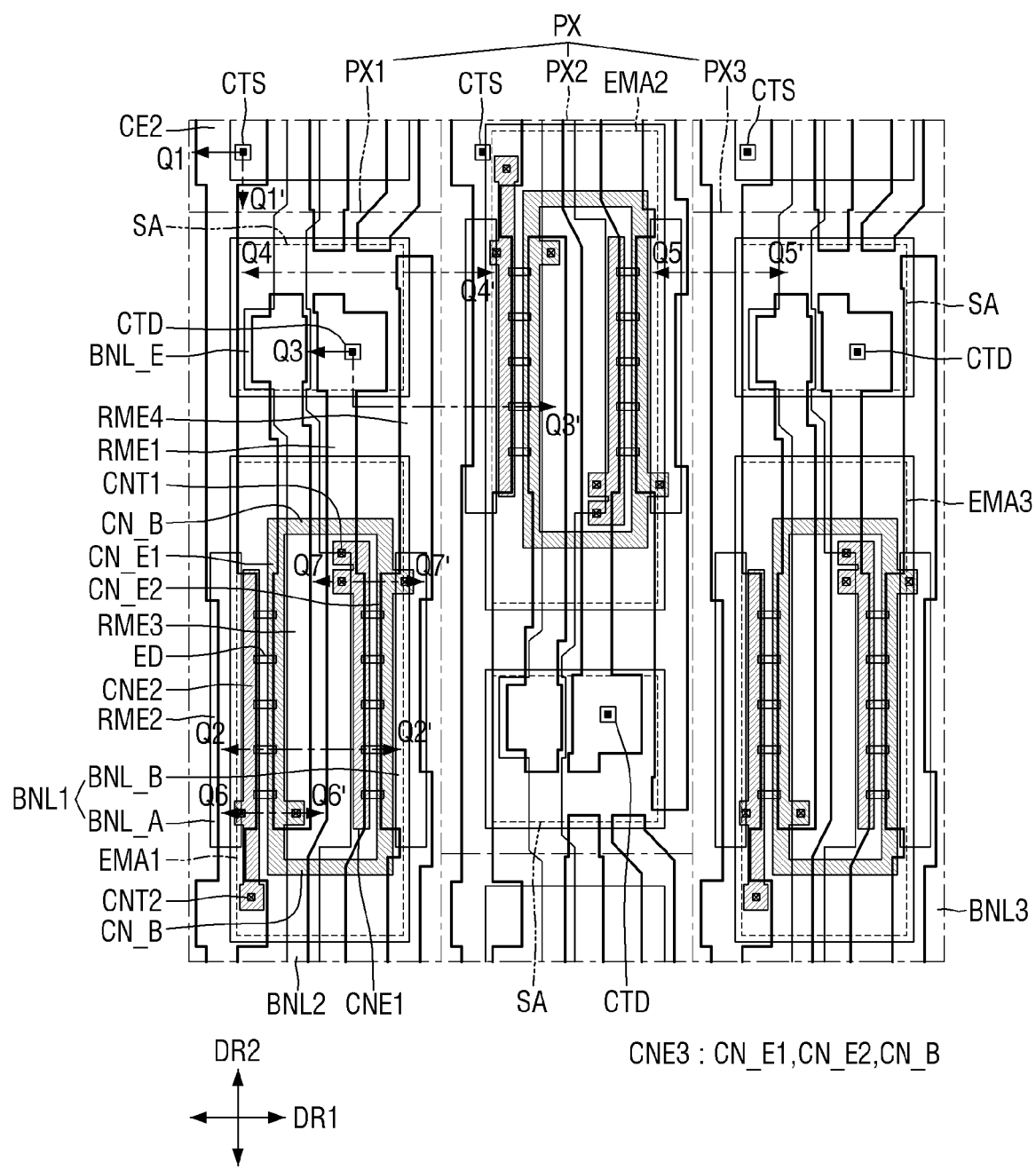
FIG. 8 is a schematic plan view of a plurality of electrodes and a plurality of banks included in one pixel of the display device according to an embodiment.
Figure 9:
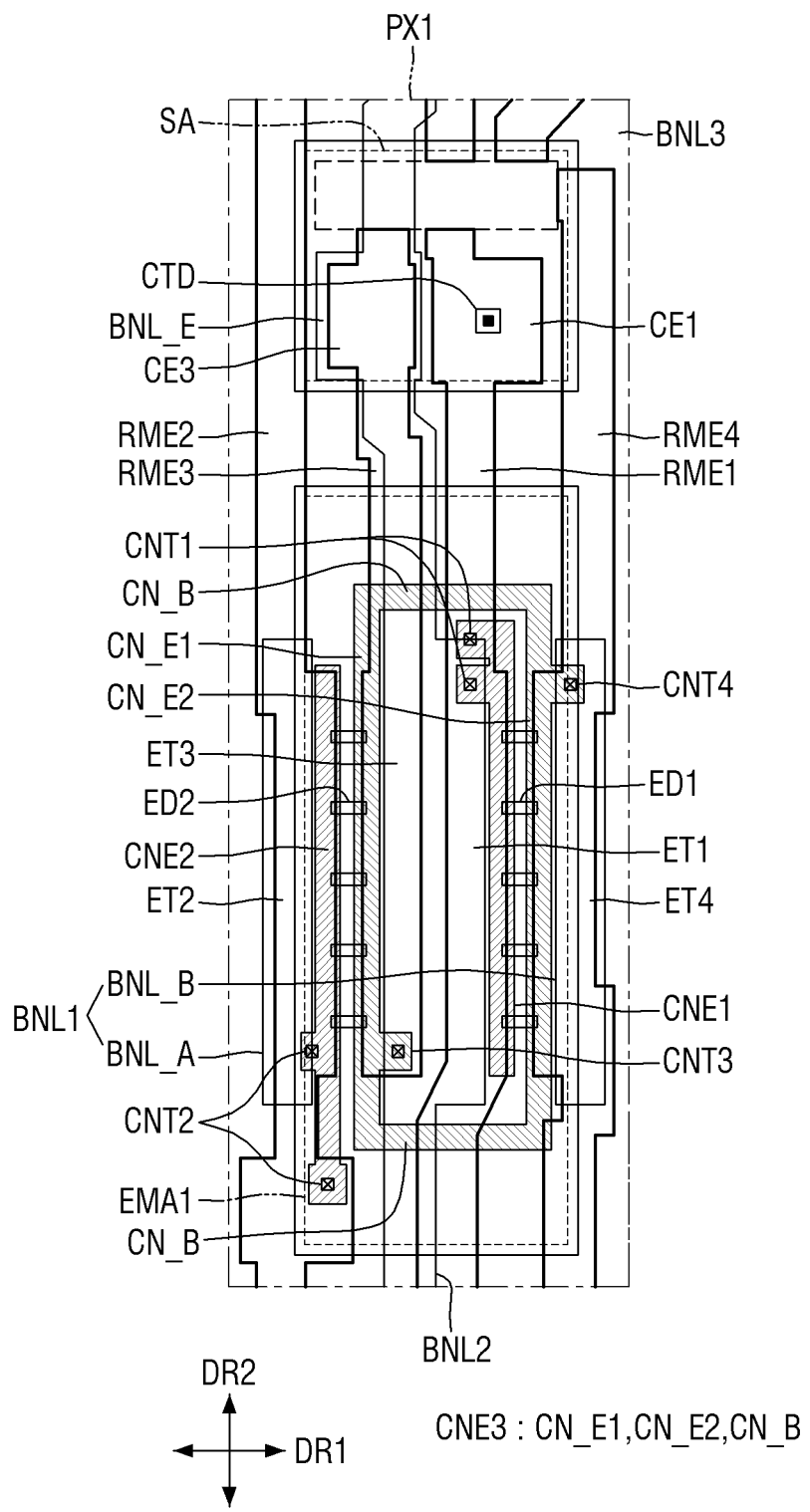
FIG. 9 is a plan view of a plurality of electrodes and a plurality of banks included in a first subpixel of FIG. 8.

FIGS. 8 and 9 illustrate a display element layer disposed in each pixel PX based on each subpixel PXn defined by the third bank BNL3. FIGS. 8 and 9 illustrate the arrangement of a plurality of banks BNL1 through BNL3 and a plurality of contact electrodes CNE1 through CNE3 in addition to the electrodes RME and the light emitting elements ED constituting each light emitting diode EL.

FIG. 10 illustrates a cross section across both ends of the light emitting elements ED (ED1 and ED2) in the first subpixel PX1, FIG. 11 illustrates a cross section of a first transistor T1 electrically connected to the light emitting elements ED of the first subpixel PX1, and FIG. 12 illustrates cross sections of a second transistor T2 and a third transistor T3 of the first subpixel PX1. FIG. 13 illustrates cross sections of contact parts between the contact electrodes CNE1 through CNE3 and the electrodes RME in the first subpixel PX1.

Referring to FIGS. 5 through 13 in conjunction with FIG. 4, the display device 10 may include the circuit layer CCL and the display element layer. The display element layer may be a layer in which the electrodes RME and the contact electrodes CNE1 through CNE3 as well as the light emitting elements ED of each light emitting diode EL may be disposed. The circuit layer CCL may be a layer in which a plurality of wirings as well as pixel circuit elements for driving each light emitting diode EL may be disposed. For example, the circuit layer CCL may include the transistors T1 through T3 in addition to a first scan line SCL, a second scan line SSL, data lines DTL, an initialization voltage line VIL, the first voltage wiring VDL, and the second voltage wiring VSL.

For example, the display device 10 may include a first substrate SUB1 on which the circuit layer CCL and the display element layer may be disposed. The first substrate SUB1 may be an insulating substrate and may be made of an insulating material such as glass, quartz, or polymer resin. For example, the first substrate SUB1 may be a rigid substrate, but may also be a flexible substrate that can be bent, folded, rolled, or the like within the spirit and the scope of the disclosure.

The first conductive layer is disposed on the first substrate SUB1. The first conductive layer may include the wiring vertical parts VDL_V and VSL_V of the voltage wirings VDL and VSL, the initialization voltage wring VIL, the data lines DTL1 through DTL3, and a plurality of bottom metal layers BML1 through BML3.

The wiring vertical parts VDL_V and VSL_V of the voltage wirings VDL and VSL extend in the second direction DR2. They may be electrically connected to the pads WPD_VDD and WPD_VSS of the pad area PDA and may receive the first power supply voltage and the second power supply voltage.

The first wiring vertical part VDL_V of the first voltage wiring VDL may be electrically connected to the drain electrodes of the first transistors T1 through a first conductive pattern DP1 of the third conductive layer. For example, the first wiring vertical part VDL_V may be electrically connected to the first wiring horizontal part VDL_H through a fourteenth contact hole CT14 at an intersection with the first wiring horizontal part VDL_H. The second wiring vertical part VSL_V of the second voltage wiring VSL may be electrically connected to a fifth conductive pattern DP5 of the third conductive layer. For example, the second wiring vertical part VSL_V may be electrically connected to the second wiring horizontal part VSL_H through a thirteenth contact hole CT13 at an intersection with the second wiring horizontal part VSL_H.

The initialization voltage wiring VIL may extend in the second direction DR2 and may be disposed between the wiring vertical parts VDL_V and VSL_V The initialization voltage wiring VIL may be electrically connected to the drain electrodes of the third transistors T3 through a fourth conductive pattern DP4 of the third conductive layer and may deliver the initialization voltage to the third transistor T3 of each subpixel PXn.

The bottom metal layers BML1 through BML3 may be disposed on the first substrate SUB1. The bottom metal layers BML1 through BML3 overlap first active layers ACT1 of a semiconductor layer and first capacitor electrodes CSE1 of the second conductive layer which will be described later. A first bottom metal layer BML1 overlaps the first active layer ACT1 of a first transistor T1_1 electrically connected to the first subpixel PX1. A second bottom metal layer BML2 overlaps the first active layer ACT1 of a first transistor T1_2 electrically connected to the second subpixel PX2, and a third bottom metal layer BML3 overlaps the first active layer ACT1 of a first transistor T1_3 electrically connected to the third subpixel PX3. The first through third bottom metal layers BML1 through BML3 may be spaced apart from each other in the second direction DR2 and disposed adjacent to the center of each pixel PX in a plan view. The bottom metal layers BML1 through BML3 may include a light blocking material to prevent light from entering the first active layers ACT1 of the first transistors T1. For example, the bottom metal layers BML1 through BML3 may be made of an opaque metal material that blocks transmission of light. However, the disclosure is not limited thereto. In some cases, the bottom metal layers BML1 through BML3 may be omitted or may overlap active layers of other transistors T1 through T3.

The data lines DTL1 through DTL3 extend in the second direction DR2 between the second wiring vertical part VSL_V of the second voltage wiring VSL, which is disposed at a boundary between pixels PX, and the bottom metal layers BML1 through BML3. The data lines DTL1 through DTL3 may be electrically connected to third conductive patterns DP3 of the third conductive layer and electrically connected to the drain electrodes of the second transistors T2 through the third conductive patterns DP3. The first data line DTL1 may be electrically connected to a second transistor T2_1 of the first subpixel PX1, the second data line DTL2 may be electrically connected to a second transistor T2_2 of the second subpixel PX2, and the third data line DTL3 may be electrically connected to a second transistor T2_3 of the third subpixel PX3.

The first subpixel PX1, the second subpixel PX2, and the third subpixel PX3 in one pixel PX may be sequentially arranged or disposed along the first direction DR1, but circuit elements or wirings electrically connected to each of them may be arranged or disposed in a different order from the arrangement order of the subpixels PXn. For example, the data lines DTL1 through DTL3 may be arranged or disposed in the order of the first data line DTL1, the third data line DTL3 and the second data line DTL2 in the first direction DR1, and the bottom metal layers BML1 through BML3 may be arranged or disposed in the order of the first bottom metal layer BML1, the third bottom metal layer BML3 and the second bottom metal layer BML2 in the second direction DR2. Similarly, the arrangement order of the active layers ACT of the semiconductor layer to be described later may also be different from the arrangement order of the subpixels PXn. This may be related to a connection position between a first electrode RME1 of each subpixel PXn and the third conductive layer according to the arrangement of different types of subpixels in one pixel PX. This will be described in detail later.

A buffer layer BL may be entirely disposed on the first conductive layer and the first substrate SUB1. The buffer layer BL may be formed on the first substrate SUB1 to protect the transistors T1 through T3 from moisture introduced through the first substrate SUB1 vulnerable to moisture penetration and may perform a surface planarization function.

The semiconductor layer is disposed on the buffer layer BL. The semiconductor layer may include the respective active layers ACT1 through ACT3 of the transistors T1 through T3.

One pixel PX may include the first active layers ACT1 of the first transistors T1_1 through T1_3 electrically connected to the subpixels PX1 through PX3, respectively. The first active layer ACT1 of each first transistor T1 may be disposed adjacent to and on the left side of the center of each pixel PX. The first active layers ACT1 may be spaced apart from each other in the second direction DR2, and parts of the first active layers ACT1 may overlap the first conductive pattern DP1, the bottom metal layers BML1 through BML3 and the second capacitor electrodes CSE2 of the third conductive layer. For example, the first active layers ACT1 may include first regions overlapping the first conductive pattern DP1 and second regions overlapping the bottom metal layers BML1 through BML3 and the second capacitor electrodes CSE2. The first regions of the first active layers ACT1 may contact the first conductive pattern DP1 and thus be electrically connected to the first voltage wiring VDL, and the second regions may contact the second capacitor electrodes CSE2. A part of the first conductive pattern DP1 may form a first drain electrode D1 of each first transistor T1, and a part of a second capacitor electrode CSE2 may form a first source electrode S1 of each first transistor T1.

One pixel PX may include a plurality of second active layers ACT2 of the second transistors T2_1 through T2_3 electrically connected to the subpixels PX1 through PX3, respectively. The second active layer ACT2 of each second transistor T2 may be disposed adjacent to and on a right side of the center of each pixel PX. The second active layers ACT2 may be spaced apart from each other in the second direction DR2. A part of the second active layer ACT2 may overlap a second conductive pattern DP2 and a third conductive pattern DP3 of the third conductive layer, respectively. For example, the second active layer ACT2 may include a third region overlapping the third conductive patterns DP3 and a fourth region overlapping the second conductive patterns DP2. The third region of the second active layer ACT2 may contact the third conductive pattern DP3 and thus be electrically connected to one of the data lines DL1 through DL3, and the fourth region may contact the second conductive pattern DP2 and thus be electrically connected to the first capacitor electrode CSE1. A part of the third conductive pattern DP3 may form a second drain electrode D2 of each second transistor T2, and a part of a second conductive pattern DP2 may form a second source electrode S2 of each second transistor T2.

The first data line DTL1 may be disposed closest to the fourth regions of the second transistors T2, and the second data line DTL2 may be disposed farthest from the fourth regions of the second transistors T2. Accordingly, the second active layer ACT2 of the second transistor T2_1 electrically connected to the first subpixel PX1 may be shorter than the second active layer ACT2 of the second transistor T2_2 electrically connected to the second subpixel PX2 and the second active layer ACT2 of the second transistor T2_3 electrically connected to the third subpixel PX3. For example, the second active layer ACT2 of the second transistor T2_2 electrically connected to the second subpixel PX2 may be longer than the second active layer ACT2 of the second transistor T2_3 electrically connected to the third subpixel PX3. However, the disclosure is not limited thereto.

One pixel PX may include a plurality of third active layers ACT3 of the third transistors T3_1 through T3_3, each of which electrically connected to the subpixels PX1 through PX3, respectively. The third active layer ACT3 of each third transistor T3 may be disposed on the left side of each pixel PX. The third active layers ACT3 may be spaced apart from each other in the second direction DR2. A part of the third active layer ACT3 may overlap the fourth conductive pattern DP4 and second capacitor electrode CSE2 of the third conductive layer. For example, the third active layer ACT3 may include fifth region overlapping the fourth conductive pattern DP4 and sixth region overlapping the second capacitor electrode CSE2. The fifth region of the third active layers ACT3 may contact the fourth conductive pattern DP4 and thus be electrically connected to the initialization voltage wiring VIL, and the sixth region may contact the second capacitor electrode CSE2 and thus be electrically connected to the second capacitor electrode CSE2. A part of the fourth conductive pattern DP4 may form a third drain electrode D3 of the third transistor T3, and a part of a second capacitor electrode CSE2 may form a third source electrode S3 of the third transistor T3.

In an embodiment, the semiconductor layer may include polycrystalline silicon, monocrystalline silicon, an oxide semiconductor, or the like within the spirit and the scope of the disclosure. The polycrystalline silicon may be formed by crystallizing amorphous silicon. When the semiconductor layer may include an oxide semiconductor, each of the active layers ACT1 through ACT3 may include a plurality of conducting regions and a channel region disposed between them. The oxide semiconductor may be an oxide semiconductor containing indium (In). In an embodiment, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like within the spirit and the scope of the disclosure.

In an embodiment, the semiconductor layer may include polycrystalline silicon. The polycrystalline silicon may be formed by crystallizing amorphous silicon. In this case, each of the conducting regions of the active layers ACT1 though ACT3 may be, but not limited to, a doping region doped with impurities.

A first gate insulating layer GI is disposed on the semiconductor layer and the buffer layer BL. The first gate insulating layer GI may be disposed to entirely cover or overlap the semiconductor layer and the buffer layer BL. The first gate insulating layer GI may function as a gate insulating film for each transistor.

The second conductive layer is disposed on the first gate insulating layer GI. The second conductive layer may include the first capacitor electrodes CSE1 of storage capacitors, a first gate pattern DP_C, a second gate pattern DP_S, and a third gate pattern DP_R, and some of those constitute gate electrodes G1 through G3 of transistors T1 through T3.

A plurality of first capacitor electrodes CSE1 may be disposed in one pixel PX. Each of the first capacitor electrodes CSE1 may overlap the first active layer ACT1 of the first transistor T1, and a part overlapping the first active layer ACT1 may serve as a first gate electrode G1 of the first transistor T1. For example, the first capacitor electrodes CSE1 may overlap the bottom metal layers BML1 through BML3 and the second capacitor electrodes CSE2 of the third conductive layer. The first capacitor electrodes CSE1 may be electrically connected to the second source electrodes S2 of the second transistors T2. For example, the first capacitor electrodes CSE1 may be integrated with the first gate electrodes G1 and may contacts the second conductive patterns DP2 through fifth contact holes CT5 so as to be electrically connected to the second source electrodes S2 of the second transistors T2.

The first gate pattern DP_C may include a first part extending in the first direction DR1 and a second part connected to the first part and extending in the second direction DR2. The first part of the first gate pattern DP_C may be disposed on the lower side of each pixel PX to overlap the first scan line SCL. The first gate pattern DP_C may be disposed between the bottom metal layers BML1 through BML3 and the first data line DTL1 to overlap the second active layers ACT2. Parts of the first gate pattern DP_C which overlap the second active layers ACT2 may serve as second gate electrodes G2 of the second transistors T2. The first gate pattern DP_C may be electrically connected to the first scan line SCL1, and a scan signal may be applied to the second transistors T2.

The second gate pattern DP_S may extend in the second direction DR2 within one pixel PX. For example, the second gate pattern DP_S may not extend beyond boundaries with neighboring pixels PX in the second direction DR2. The second gate pattern DP_S may be disposed on the left side of each pixel PX to overlap the second scan line SSL. The second gate pattern DP_S is disposed between the initialization voltage wiring VIL and the first wiring vertical part VDL_V to overlap the third active layers ACT3. Parts of the second gate pattern DP_S which overlap the third active layers ACT3 may serve as third gate electrodes G3 of the third transistors T3. The second gate pattern DP_S may be electrically connected to the second scan line SSL, and a second scan signal may be applied to the third transistors T3.

The third gate pattern DP_R may be disposed above the first capacitor electrodes CSE1 to overlap the second scan line SSL. The third gate pattern DP_R may be electrically connected to the second scan line SSL to lower the wiring resistance of the second scan line SSL extending in the first direction DR1.

A first interlayer insulating layer IL1 is disposed on the second conductive layer. The first interlayer insulating layer IL1 may cover or overlap the second conductive layer to protect the second conductive layer.

The third conductive layer is disposed on the first interlayer insulating layer IL1. The third conductive layer may include the first scan line SCL, the second scan line SSL, the wiring horizontal parts VDL_H and VSL_H, and the second capacitor electrodes CSE2. For example, the third conductive layer may include a plurality of conductive patterns DP1 through DP5 forming the source electrodes S1 through S3 or the drain electrodes D1 through D3 of the transistors T1 through T3 or electrically connected to the wiring vertical parts VDL_V and VSL_V or the initialization voltage wiring VIL.

The first scan line SCL and the second scan line SSL extend in the first direction DR1 and may be disposed on the upper and lower sides of each pixel PX. The first scan line SCL may be disposed on the lower side of each pixel PX to overlap the first gate pattern DP_C and may be electrically connected to the first gate pattern DP_C through tenth contact holes CT10 penetrating the first interlayer insulating layer IL1. The second scan line SSL may be disposed on the upper side of each pixel PX to overlap the second gate pattern DP_S and the third gate pattern DP_R and may be electrically connected to the second gate pattern DP_S and the third gate pattern DP_R respectively through an eleventh contact hole CT11 and twelfth contact holes CT12 penetrating the first interlayer insulating layer IL1.

A plurality of second capacitor electrodes CSE2 may be disposed in one pixel PX. Each of the second capacitor electrodes CSE2 may overlap one of the first capacitor electrodes CSE1. The second capacitor electrode CSE2 may overlap the first capacitor electrode CSE1 in a thickness direction with the first interlayer insulating layer IL1 interposed between them, and the storage capacitors Cst may be formed between them.

For example, a part of each second capacitor electrode CSE2 may be electrically connected to the first active layer ACT1 of a first transistor T1 through a first contact hole CT1 penetrating the first gate insulating layer GI and the first interlayer insulating layer IL1 and may serve as the first source electrode S1 of the first transistor T1. For example, the second capacitor electrodes CSE2 may be electrically connected to the bottom metal layers BML1 through BML3 through fourth contact holes CT4 penetrating the buffer layer BL, the first gate insulating layer GI and the first interlayer insulating layer ILL and the first source electrodes S1 of the first transistors T1 may also be electrically connected to the bottom metal layers BML1 through BML3. Another part of each second capacitor electrode CSE2 may be electrically connected to the third active layer ACT3 of a third transistor T3 through a third contact hole CT3 penetrating the first gate insulating layer GI and the first interlayer insulating layer IL1 and may serve as the third source electrode S3 of the third transistor T3.

For example, the second capacitor electrodes CSE2 may be electrically connected to the first electrodes RME1 of the display element layer which will be described later and may transmit electrical signals received through the first transistors T1 to the first electrodes RME1. Of the second capacitor electrodes CSE2, a second capacitor electrode CSE2 electrically connected to the first subpixel PX1 may be electrically connected to a first extending electrode part CP1 extending in the first direction DR1, and the first extending electrode part CP1 may directly contact the first electrode RME1 of the first subpixel PX1. Similarly, a second capacitor electrode CSE2 electrically connected to the third subpixel PX3 may be electrically connected to a second extending electrode part CP2 extending in the first direction DR1, and the second extending electrode part CP2 may directly contact the first electrode RME1 of the third subpixel PX3. On the other hand, a second capacitor electrode CSE2 electrically connected to the second subpixel PX2 may be electrically connected to the first electrode RME1 of the second subpixel PX2 in a part overlapping a first capacitor electrode CSE1 even without the extending electrode parts CP1 and CP2.

The first conductive pattern DP1 may be disposed on the left side of the center of each pixel PX to extend in the second direction DR2. The first conductive pattern DP1 may overlap the first wiring vertical part VDL_V in the thickness direction and may be electrically connected to the first wiring vertical part VDL_V through a sixth contact hole CT6 penetrating the buffer layer BL, the first gate insulating layer GI and the first interlayer insulating layer ILL For example, the first conductive pattern DP1 may be electrically connected to the first active layer ACT1 of each first transistor T1 through the first contact hole CT1 penetrating the first gate insulating layer GI and the first interlayer insulating layer IL1 and may serve as the first drain electrode D1. The first transistors T1 may be electrically connected to the first voltage wiring VDL through the first conductive pattern DP1 and may receive the first power supply voltage.

The second conductive patterns DP2 may be disposed around the center of each pixel PX to overlap the first capacitor electrodes CSE1 and the second active layers ACT2 of the second transistors T2 in the thickness direction. Each of the second conductive patterns DP2 may contact the second active layer ACT2 through a second contact hole CT2 penetrating the first gate insulating layer GI and the first interlayer insulating layer IL1 and may serve as the second source electrode S2. For example, the second conductive patterns DP2 may be electrically connected to the first capacitor electrodes CSE1 through the fifth contact holes CT5 penetrating the first interlayer insulating layer IL1, and the second source electrodes S2 of the second transistors T2 may be electrically connected to the first gate electrodes G1 of the first transistors T1.

The third conductive patterns DP3 may be disposed on the right side of the center of each pixel PX to overlap the data lines DTL1 through DTL3 and the second active layers ACT2 of the second transistors T2 in the thickness direction. For example, the third conductive patterns DP3 may overlap the second active layers ACT2 and the data lines DTL1 through DTL3, respectively. The third conductive patterns DP3 may be electrically connected to the second active layers ACT2 through the second contact holes CT2 penetrating the first gate insulating layer GI and the first interlayer insulating layer IL1 and may serve as the second drain electrodes D2. For example, the third conductive patterns DP3 may be electrically connected to the data lines DTL1 through DTL3 through seventh contact holes CT7 penetrating the buffer layer BL, the first gate insulating layer GI and the first interlayer insulating layer IL1. The second transistors T2 may be electrically connected to the data lines DTL1 through DTL3 through the third conductive patterns DP3.

The fourth conductive pattern DP4 may be disposed on the left side of each pixel PX to extend in the second direction DR2. The fourth conductive pattern DP4 may overlap the initialization voltage wiring VIL in the thickness direction and may be electrically connected to the initialization voltage wiring VIL through an eighth contact hole CT8 penetrating the buffer layer BL, the first gate insulating layer GI and the first interlayer insulating layer IL1 For example, the fourth conductive pattern DP4 may be electrically connected to the third active layer ACT3 of each third transistor T3 through the third contact hole CT3 penetrating the first gate insulating layer GI and the first interlayer insulating layer IL1 and may serve as the third drain electrode D3. The third transistors T3 may be electrically connected to the initialization voltage wiring VIL through the fourth conductive pattern DP4 and may receive the initialization voltage.

The fifth conductive pattern DP5 may be disposed at the boundary between pixels PX neighboring in the first direction DR1 and may extend in the second direction DR2. The fifth conductive pattern DP5 may overlap the second wiring vertical part VSL_V in the thickness direction and may be electrically connected to the second wiring vertical part VSL_V through ninth contact holes CT9 penetrating the buffer layer BL, the first gate insulating layer GI and the first interlayer insulating layer IL1.

The wiring horizontal parts VDL_H and VSL_H of the voltage wirings VDL and VSL may be disposed on the lower and upper sides of each pixel PX, respectively. The first wiring horizontal part VDL_H may be electrically connected to the first wiring vertical part VDL_V through the fourteenth contact hole CT14, which penetrates the buffer layer BL, the first gate insulating layer GI and the first interlayer insulating layer IL1 at the intersection with the first wiring vertical part VDL_V. Similarly, the second wiring horizontal part VSL_H may be electrically connected to the second wiring vertical part VSL_V through the thirteenth contact hole CT13, which penetrates the buffer layer BL, the first gate insulating layer GI and the first interlayer insulating layer ILL at the intersection with the second wiring vertical part VSL_V For example, the second wiring vertical part VSL_V may be electrically connected to second electrodes RME2, which will be described later, so as to supply the second power supply voltage to the second electrodes RME2.

A second interlayer insulating layer IL2 is disposed on the third conductive layer. The second interlayer insulating layer IL2 may function as an insulating film between the third conductive layer and other layers disposed on the third conductive layer. For example, the second interlayer insulating layer IL2 may cover or overlap and protect the third conductive layer. Also, the second interlayer insulating layer IL2 may perform a surface planarization function.

Each of the first through third conductive layers described above may be, but not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

Each of the buffer layer BL, the first gate insulating layer GI, the first interlayer insulating layer IL1 and the second interlayer insulating layer IL2 described above may be composed of a plurality of inorganic layers stacked alternately. For example, each of the buffer layer BL, the first gate insulating layer GI, the first interlayer insulating layer IL1 and the second interlayer insulating layer IL2 may be a double layer or multiple layer in which inorganic layers including at least any one of silicon oxide ($SiO_x$), silicon nitride ($SiN_x$) and silicon oxynitride ($SiO_xN_y$) may be alternately stacked. Alternatively, each of the buffer layer BL, the first gate insulating layer GI, the first interlayer insulating layer IL1 and the second interlayer insulating layer IL2 may be a single inorganic layer including the above materials.

A plurality of first banks BNL1, the electrodes RME, the light emitting element ED (ED1 and ED2), a second bank BNL2, the third bank BNL3 and the contact electrodes CNE1 and CNE2 may be disposed on the second interlayer insulating layer IL2. For example, a plurality of insulating layers PAS1 through PAS3 may be further disposed on the second interlayer insulating layer IL2.

Referring to FIG. 8 in combination with the other drawings, the first and second banks BNL1 and BNL2 may be directly disposed on the second interlayer insulating layer IL2. Parts of the first banks BNL1 may be disposed in the emission area EMA of each subpixel PXn and spaced apart from each other. For example, the first banks BNL1 may include a plurality of sub banks BNL_A and BNL_B spaced apart from each other in the first direction DR1 in each emission area EMA. The first sub bank BNL_A may be disposed on a left side of a center of each emission area EMA, and the second sub bank BNL_B may be disposed on a right side of the center of each emission area EMA. Parts of the first sub bank BNL_A and the second sub bank BNL_B may overlap parts of the third bank BNL3 which extend in the second direction DR2. The first banks BNL1 may extend in the second direction DR2, and a length of each first bank BNL1 may be smaller than a length of an opening area surrounded by the third bank BNL3 in the second direction DR2. The first banks BNL1 may form substantially island-shaped or isolated shaped patterns extending in one direction in the entire display area DPA.

The second bank BNL2 may be disposed between the first banks BNL1 and may extend in the second direction DR2. Different from the first banks BNL1, the second bank BNL2 may extend in the second direction DR2 beyond the emission area EMA and the sub area SA, to be disposed across a plurality of neighboring pixels PX in the second direction DR2. In an embodiment, a part of which the second bank BNL2 is disposed between the first banks BNL1 may be wider than other parts of the second bank BNL2, and the electrodes RME may be disposed on the part disposed between the first banks BNL1. For example, the second bank BNL2 may include a bank extension part BNL_E having a larger width in the sub area. A third electrode contact part CE3 of a third electrode RME3, which will be described later, may be disposed on the bank extension part BNL_E of the second bank BNL2. The second bank BNL2 may generally extend in the second direction DR2 and may form a linear or stripe pattern having parts of larger width in the display area DPA.

At least a part of each of the first and second banks BNL1 and BNL2 may protrude from an upper surface of the second interlayer insulating layer IL2. The first and second banks BNL1 and BNL2 disposed on the second interlayer insulating layer IL2 may separate an area between them from an area outside them. The light emitting elements ED may be disposed between the first sub bank BNL_A and the second bank BNL2 and between the second bank BNL2 and the second sub bank BNL_B. The protruding part of each of the first and second banks BNL1 and BNL2 may have inclined side surfaces, and light emitted from the light emitting elements ED may be reflected by the electrodes RME disposed on the first and second banks BNL1 and BNL2 to travel in an upward direction of the first substrate SUB1. The first banks BNL1 may provide an area where the light emitting elements ED may be disposed while functioning as reflective barriers reflecting light emitted from the light emitting elements ED in an upward direction. The side surfaces of the first banks BNL1 may be inclined, and extended in a substantially linear shape. However, the disclosure is not limited thereto. For example, cross section of outer surfaces of the first banks BNL1 may also have a substantially curved shape semicircular or substantially semielliptical shape. The first banks BNL1 may include, but are not limited to, an organic insulating material such as polyimide (PI).

The electrodes RME extend in one direction and may be spaced apart from each other in each subpixel PXn. For example, the first electrode RME1, a second electrode RME2, the third electrode RME3 and a fourth electrode RME4 may be disposed in one subpixel PXn, may extend in the second direction DR2, and may be spaced apart from each other in the first direction DR1. The first electrode RME1 and the third electrode RME3 may be partially disposed on the second bank BNL2, the second electrode RME2 may be partially disposed on the first sub bank BNL_A, and the fourth electrode RME4 may be partially disposed on the second sub bank BNL_B. Referring to FIG.

9, in an embodiment, the electrodes RME may respectively include electrode extension parts ET1 through ET4 which may be disposed on the first banks BNL1 or the second bank BNL2 and may be relatively wider than other parts. Each electrode RME may be disposed such that the electrode extension part ET1, ET2, ET3 or ET4 lies on a side surface of the first or second bank BNL1 or BNL2 and may extend in the second direction DR2.

For example, the first electrode RME1 may be disposed such that a first electrode extension part ET1 lies on a side surface facing the second sub bank BNL_B among both side surfaces of the second bank BNL2. The first electrode extension part ET1 of the first electrode RME1 may be disposed on a part of the second bank BNL2 which has a larger width and is disposed in the emission area EMA, and other parts of the first electrode RME1 other than the first electrode extension part ET1 may be disposed not to overlap the second bank BNL2. For example, a part of the first electrode extension part ET1 of the first electrode RME1 may be disposed on the second bank BNL2, and other parts of the first electrode RME1 may be disposed directly on the second interlayer insulating layer IL2. The first electrode RME1 may extend in the second direction DR2 beyond the emission area EMA but, in the sub area SA, may be separated from the first electrode RME1 of another pixel PX neighboring in the second direction DR2. The first electrode RME1 may initially be formed to extend in the second direction DR2 across a plurality of pixels PX, and then may later be formed as a separate electrode disposed in each subpixel PXn by being partially removed in the sub area SA. For example, the first electrode RME1 may also be partially disposed at the boundary between pixels PX neighboring in the second direction DR2. For example, according to an embodiment, the first electrode RME1 may include a first electrode contact part CE1 disposed in the sub area SA, and the first electrode contact part CE1 may be electrically connected to a second capacitor electrode CSE2 of the third conductive layer through a first electrode contact hole CTD penetrating the second interlayer insulating layer IL2. The first electrode RME1 may be electrically connected to a first transistor T1 through the second capacitor electrode CSE2 to receive the first power supply voltage. Since the first electrode RME1 is provided as a separate electrode in each pixel PX and in each subpixel PXn, the light emitting elements ED of different subpixels PX may emit light individually.

The third electrode RME3 may be disposed such that a third electrode extension part ET3 lies on a side surface facing the first sub bank BNL_A, among both side surfaces of the second bank BNL2. The third electrode extension part ET3 of the third electrode RME3 may be disposed on a part of the second bank BNL2 which has a larger width and is disposed in the emission area EMA, and other parts of the third electrode RME3 other than the third electrode extension part ET3 may also be disposed on the second bank BNL2 and may extend in the second direction DR2. The third electrode RME3 may be spaced apart from the first electrode RME1 on the second bank BNL2 in the first direction DR1. A side of the third electrode RME3 in the second direction DR2 may be disposed in the emission area EMA, and the other side may be disposed in the sub area SA. Different from the first electrode RME1, the third electrode RME3 may be disposed across the emission area EMA and the sub area SA of each subpixel PXn but may not be disposed at the boundary with a pixel PX neighboring in the second direction DR2. For example, according to an embodiment, the third electrode RME3 may include the third electrode contact part CE3 disposed in the sub area SA, and the third electrode contact part CE3 may be disposed on the extension part of the second bank BNL2. Although not illustrated in the drawings, an electrode pattern made of a conductive layer may be disposed on the third electrode contact part CE3 of the third electrode RME3.

The second electrode RME2 may be disposed such that a second electrode extension part ET2 lies on a side surface facing the second bank BNL2, among both side surfaces of the first sub bank BNL_A. Other parts of the second electrode RME2 other than the second electrode extension part ET2 may be disposed not to overlap the first sub bank BNL_A and may thus be disposed directly on the second interlayer insulating layer IL2. A part of the second electrode extension part ET2 of the second electrode RME2 may be disposed in the emission area EMA, but other parts of the second electrode RME2 may be disposed to overlap the third bank BNL3. The second electrode RME2 may substantially extend in the second direction DR2 under or below the third bank BNL3. In an embodiment, the second electrode RME2 may extend in the second direction DR2 beyond the emission area EMA and the sub area SA. And one second electrode RME2 may be disposed across a plurality of pixels PX neighboring in the second direction DR2. Different from the first electrode RME1, the second electrode RME2 may not be split or separated in the sub area SA. For example, according to an embodiment, the second electrode RME2 may include a second electrode contact part CE2 disposed at the boundary between pixel PXs neighboring in the second direction DR2 and overlapping the second wiring horizontal part VSL_H in the thickness direction. The second electrode contact part CE2 may be electrically connected to the second wiring horizontal part VSL_H of the third conductive layer through a second electrode contact hole CTS penetrating the second interlayer insulating layer IL2. Since the second electrode RME2 is disposed in a plurality of subpixels PXn neighboring in the second direction DR2 across a plurality of pixels PX, the subpixels PXn may receive the second power supply voltage through the same second electrode RME2. Since the first power supply voltage applied through the first electrode RME1 may be applied individually to each subpixel PXn, each subpixel PXn may be driven individually even if the second electrode RME2 is disposed in a plurality of subpixels PXn.

For example, the second electrode RME2 may include a plurality of second electrode contact parts CE2. One of the second electrode contact parts CE2 may be electrically connected to the third conductive layer through the second electrode contact hole CT2, but the others of second electrode contact parts CE2 may not be electrically connected to the third conductive layer. As described above, the first wiring horizontal part VDL_H and the second wiring horizontal part VSL_H may extend in the first direction DR1 on the upper and lower sides of each pixel PX and may be alternately arranged or disposed along the second direction DR2. For example, when, in a first pixel PX, the first wiring horizontal part VDL_H is disposed on the lower side and the second wiring horizontal part VSL_H is disposed on the upper side as illustrated in FIG. 5, in a pixel PX neighboring the first pixel PX in the second direction DR2, the first wiring horizontal part VDL_H may be located or disposed on the upper side of, and the second wiring horizontal part VSL_H may be disposed on the lower side. The second electrode RME2 may include a plurality of second electrode contact parts CE2 overlapping the first wiring horizontal part VDL_H and the second wiring horizontal part VSL_H. And, among the second electrode contact parts CE2, only the second electrode contact part CE2 overlapping the second wiring horizontal part VSL_H may be electrically connected to the third conductive layer.

The fourth electrode RME4 may be disposed such that a fourth electrode extension part ET4 lies on a side surface facing the second bank BNL2, among both side surfaces of the second sub bank BNL_B. Other parts of the fourth electrode RME4 other than the fourth electrode extension part ET4 may be disposed not to overlap the second sub bank BNL_B and may thus be disposed directly on the second interlayer insulating layer IL2. Similar to the second electrode RME2, the fourth electrode RME4 may extend in the second direction DR2 beyond the emission area EMA and the sub area SA. However, different from the second electrode RME2, the fourth electrode RME4 may be separated, in the sub area SA, from other fourth electrodes RME4 of another neighboring pixel PX. The fourth electrode RME4 may not include an electrode contact part. And The fourth electrode RME4 may be disposed substantially symmetrically to the second electrode RME2 except that it may be split or separated in the sub area SA.

In an embodiment, during a process of manufacturing the display device 10, a plurality of electrode lines (RM1 through RM3 of FIG. 15) may be formed to extend in the second direction DR2, and the light emitting elements ED may be placed. Then, the electrode lines may split or be separated in the sub area SA into a plurality of electrodes RME. The second electrode RME2 may remain as an electrode line that may not be split or separated in the sub area SA, but the first electrode RME1, the third electrode RME3 and the fourth electrode RME4 may be formed by partially removing the electrode lines. The electrode lines may be utilized to generate an electric field for placing the light emitting elements ED during the manufacturing process of the display device 10. After the light emitting elements ED may be placed, when the electrodes RME may be formed by splitting or separating the electrode lines in the sub area SA, a driving signal for driving the light emitting elements ED may be transmitted to the electrodes RME.

A gap between the electrode extension part s ET1 through ET4 of the electrodes RME may be smaller than a gap between parts other than the electrode extension parts ET1 through ET4. A plurality of light emitting elements ED may be disposed on the electrode extension parts ET1 through ET4. Each of the electrode extension parts ET1 through ET4 may be disposed on an inclined side surface of the first or second bank BNL1 or BNL2, and a width of each of the electrode extension parts ET1 through ET4 measured in the first direction DR1 may be smaller than a width of each of the first and second banks BNL1 and BNL2 measured in the first direction DR1. Each electrode RME may be disposed such that the electrode extension part ET1, ET2, ET3 or ET4 covers or overlaps at least one side surface of the first or second bank BNL1 or BNL2 to reflect light emitted from the light emitting elements ED.

Although the first through fourth electrodes RME1 through RME4 may be disposed in each subpixel PXn in the drawings, the disclosure is not limited thereto. The arrangement of the electrodes RME in each subpixel PXn may vary according to the number of the electrodes RME or the number of the light emitting elements ED disposed in each subpixel PXn.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels toward the inclined side surfaces of the first and second banks BNL1 and BNL2 after being emitted from the light emitting elements ED, in an upward direction of each subpixel PXn.

However, the disclosure is not limited thereto, and each electrode RME may further include a transparent conductive material. For example, each electrode RME may include a material such as ITO, IZO or ITZO. In an embodiment, each electrode RME may have a structure in which at least one of transparent conductive material and at least one of highly reflective metal layer may be stacked or may be formed as a single layer including transparent conductive material and highly reflective metal layer. For example, each electrode RME may have a stacked structure of ITO/Ag/ITO, ITO/Ag/IZO, or ITO/Ag/ITZO/IZO.

The first insulating layer PAS1 is entirely disposed on the second interlayer insulating layer IL2. For example, the first insulating layer PAS1 may cover or overlap the electrodes RME and the first and second banks BNL1 and BNL2. However, the first insulating layer PAS1 may include openings partially exposing upper surfaces of the electrodes RME, and the contact electrodes CNE1 through CNE3 to be described later may contact the electrodes RME through the openings.

In an embodiment, the first insulating layer PAS1 may be stepped such that a part of an upper surface of the first insulating layer PAS1 is lowered between the electrodes RME spaced apart from each other in the first direction DR1. Since the first insulating layer PAS1 covers or overlaps the electrodes RME, it may be stepped between them. The first insulating layer PAS1 may protect the electrodes RME while insulating them from each other. For example, the first insulating layer PAS1 may prevent the light emitting elements ED disposed on the first insulating layer PAS1 from directly contacting other members and thus from being damaged.

The third bank BNL3 may be disposed on the first insulating layer PAS1. The third bank BNL3 may include parts extending in the first direction DR1 and the second direction DR2 to form a lattice pattern in a plan view. The third bank BNL3 may be disposed at the boundary of each subpixel PXn to separate neighboring subpixels PXn. For example, the third bank BNL3 may surround the emission area EMA and the sub area SA to separate them from each other in each subpixel PXn. Of the parts of the third bank BNL3 extending in the second direction DR2, a part disposed between the emission areas EMA and a part disposed between the sub areas SA may have the same width. Accordingly, a gap between the sub areas SA may be, but is not limited to, equal to a gap between the emission areas EMA.

Parts of the third bank BNL3 may overlap the electrodes RME thereunder in the thickness direction. For example, the third bank BNL3 may overlap the second electrode RME2 and the fourth electrode RME4 at the boundary of each sub pixel PXn. For example, the third bank BNL3 may overlap electrodes RME in a part surrounding the sub area SA and may overlap the first electrode RME1, the second electrode RME2 and the fourth electrode RME4 in a part extending in the first direction DR1 at the boundary between pixels PX neighboring in the second direction DR2. For example, the second electrode contact parts CE2 of the second electrode RME2 may be disposed under or below a part of the third bank BNL3 which extend in the first direction DR1.

The third bank BNL3 may be formed to have a greater height than the first and second banks BNL1 and BNL2. The third bank BNL3 may prevent ink from overflowing to adjacent subpixels PXn in an inkjet printing process during the manufacturing process of the display device 10. Therefore, the third bank BNL3 may separate inks in which different light emitting elements ED may be dispersed for different subpixels PXn, so that the inks may not be mixed with each other. Some or a predetermined number of the parts of the third bank BNL3 which extend in the second direction DR2 may be disposed on the first banks BNL1. Similar to the first banks BNL1, the third bank BNL3 may include, but is not limited to, polyimide (PI). Although the third bank BNL3 is disposed on a different layer from the first banks BNL1 in the drawings, the disclosure is not limited thereto. In an embodiment, the third bank BNL3 may be formed in the same process and on the same layer as the first banks BNL1.

The light emitting elements ED may be disposed on the first insulating layer PAS1. The light emitting elements ED may be spaced apart from each other along the second direction DR2 in which each electrode RME extends and may be aligned substantially parallel to each other. The light emitting elements ED may have shape extended in a direction, substantially perpendicular to the direction in which each electrode RME extends. However, the disclosure is not limited thereto, and the light emitting elements ED may also extend obliquely to the direction in which each electrode RME extends.

Each light emitting element ED may include semiconductor layers doped with different conductivity types. Each light emitting element ED including the semiconductor layers may be oriented such that an end faces in a specific or predetermined direction according to the direction of an electric field generated on the electrodes RME. For example, each light emitting element ED may include a light emitting layer 36 (see FIG. 14) to emit light of a specific or predetermined wavelength band. The light emitting elements ED disposed in each subpixel PXn may emit light of different wavelength bands according to the material that forms the light emitting layer 36. However, the disclosure is not limited thereto, and the light emitting elements ED disposed in each subpixel PXn may also emit light of the same color.

In each light emitting element ED, a plurality of layers may be disposed in a direction parallel to an upper surface of the first substrate SUB1. The direction in which the light emitting elements ED of the display device 10 extend may be parallel to the first substrate SUB1, and a plurality of semiconductor layers of each light emitting element ED may be sequentially arranged or disposed along a direction parallel to the upper surface of the first substrate SUB1. However, the disclosure is not limited thereto. In some cases, when each light emitting element ED has a different structure, the semiconductor layers may be arranged or disposed in the direction perpendicular to the first substrate SUB1.

The light emitting elements ED may be disposed on each electrode RME between the first and second banks BNL1 and BNL2. A length of each light emitting element ED may be greater than a gap between the electrodes RME spaced apart from each other in the first direction DR1, and both ends of each light emitting element ED may be disposed on different electrodes RME, respectively. As will be described later, each light emitting element ED may include a plurality of semiconductor layers, and a first end and a second end opposite the first end may be defined based on any one of the semiconductor layers. The light emitting elements ED may be divided into different light emitting elements ED based on an electrode on which the first ends may be disposed.

For example, referring to FIG. 9, the light emitting elements ED may include first light emitting elements ED1 having the first ends disposed on the first electrode RME1 and the second ends disposed on the fourth electrode RME4 and second light emitting elements ED2 having the first ends disposed on the third electrode RME3 and the second ends disposed on the second electrode RME2. The first light emitting elements ED1 may be disposed between the second bank BNL2 and the second sub bank BNL_B such that the first ends lie on the first electrode extension part ET1 and the second ends lie on the fourth electrode extension part ET4. The second light emitting elements ED2 may be disposed between the second bank BNL2 and the first sub bank BNL_A such that the first ends lie on the third electrode extension part ET3 and the second ends lie on the second electrode extension part ET2. The light emitting elements ED disposed in one subpixel PXn may include the first and second light emitting elements ED1 and ED2 whose first ends face in opposite directions.

Both ends of each light emitting element ED may contact the contact electrodes CNE1 through CNE3, respectively. An insulating film 38 (see FIG. 14) may not be formed on end surfaces of each light emitting element ED in the direction in which each light emitting element ED extends, thereby partially exposing the semiconductor layers. The exposed semiconductor layers may contact the contact electrodes CNE1 through CNE3. However, the disclosure is not limited thereto. In some cases, at least a part of the insulating film 38 of each light emitting element ED may be removed to partially expose side surfaces of both ends of the semiconductor layers. The exposed side surfaces of the semiconductor layers may directly contact the contact electrodes CNE1 through CNE3. Each light emitting element ED may be electrically connected to each electrode RME through the contact electrodes CNE1 through CNE3. The second ends of the first light emitting elements ED1 and the first ends of the second light emitting elements ED2 may be electrically connected to each other through the same contact electrode. Accordingly, the first light emitting elements ED1 and the second light emitting elements ED2 may be electrically connected in series to each other.

The second insulating layer PAS2 may be partially disposed on the first insulating layer PAS1 and the light emitting elements ED. For example, the second insulating layer PAS2 may be disposed on the third bank BNL3 and in the sub area SA. For example, the second insulating layer PAS2 may partially surround an outer surface of each light emitting element ED not to cover or overlap the first end and the second end of the light emitting element ED. For example, a part of the second insulating layer PAS2 may overlap the second bank BNL2 and may be disposed on the first insulating layer PAS1. For example, the second insulating layer PAS2 may be disposed on the light emitting elements ED, the first insulating layer PAS1 and the third bank BNL3 in the emission area EMA but may partially expose parts where the electrodes RME may be disposed as well as exposing both sides of each light emitting element ED. This shape of the second insulating layer PAS2 may be obtained by entirely placing the second insulating layer PAS2 on the first insulating layer PAS1 and the third bank BNL3 and then removing the second insulating layer PAS2 to expose both ends of each light emitting element ED during the manufacturing process of the display device 10.

The parts of which the second insulating layer PAS2 disposed on the light emitting elements ED may extend in the second direction DR2 on the first insulating layer PAS1 in a plan view to form substantially linear or substantially island-shaped or isolated shaped patterns in each subpixel PXn. The second insulating layer PAS2 may protect the light emitting elements ED while fixing the light emitting elements ED during the manufacturing process of the display device 10. The second insulating layer PAS2 may also fill a space between each light emitting element ED and the first insulating layer PAS1 disposed under or below the light emitting element ED.

During the manufacturing process of the display device 10, a process of splitting or separating the electrode lines in the sub area SA to form the electrodes RME may be performed after the second insulating layer PAS2 may be formed. The second insulating layer PAS2 may be entirely disposed in the sub area SA and the emission area EMA, and then may be partially removed by the process of exposing both ends of each light emitting elements ED and the splitting process of separating the electrode. In the sub area SA, the first insulating layer PAS1 and the second insulating layer PAS2 may be removed in an area where the electrode lines may be split or separated, and the third insulating layer PAS3 to be described later may be directly disposed on the second interlayer insulating layer IL2.

A plurality of contact electrodes CNE1 through CNE3 and the third insulating layer PAS3 may be disposed on the second insulating layer PAS2. The contact electrodes CNE1 through CNE3 may include a first contact electrode CNE1 and a second contact electrode CNE2 disposed on the same layer and a third contact electrode CNE3 disposed on a different layer from the first and second contact electrodes CNE1 and CNE2. The third insulating layer PAS3 may be disposed between the first and second contact electrodes CNE1 and CNE2 and the third contact electrode CNE3.

The contact electrodes CNE1 through CNE3 may contact the light emitting elements ED and the electrodes RME. The contact electrodes CNE1 through CNE3 may directly contact the semiconductor layers exposed on both end surfaces of each light emitting element ED and may contact exposed parts of upper surfaces of the electrodes RME where the first insulating layer PAS1 is not disposed. Both ends of each light emitting element ED may be electrically connected to the electrodes RME through the contact electrodes CNE1 through CNE3.

The first contact electrode CNE1 may be disposed on the first electrode RME1, and the second contact electrode CNE2 may be disposed on the second electrode RME2. The first contact electrode CNE1 may be disposed on the first electrode extension part ET1, may have a width smaller than a width of the first electrode extension part ET1, and may extend in the second direction DR2. For example, the first contact electrode CNE1 may include a plurality of first contact parts CNT1 disposed on the first electrode RME1 and having an increased width, and the first contact parts CNT1 may contact the first electrode RME1 exposed by the first insulating layer PAS1. The first contact parts CNT1 may be disposed not to overlap the light emitting elements ED in the first direction DR1. For example, the first contact parts CNT1 may be disposed adjacent to a side, in the second direction DR2, of the first electrode extension part ET1 on which the light emitting elements ED may be disposed. Although the first contact electrode CNE1 may include two first contact parts CNT1 in the drawings, the disclosure is not limited thereto. The first contact electrode CNE1 may contact the first ends of the first light emitting elements ED1 and the first electrode RME1, and the first light emitting elements ED1 may be electrically connected to the first electrode RME1 through the first contact electrode CNE1.

The second contact electrode CNE2 may be disposed on the second electrode extension part ET2, may have a width smaller than a width of the second electrode extension part ET2, and may extend in the second direction DR2. For example, the second contact electrode CNE2 may include a plurality of second contact parts CNT2 disposed on the second electrode RME2 and having an increased width, and the second contact parts CNT2 may contact the second electrode RME2 exposed by the first insulating layer PAS1. For example, in an embodiment, any one of the second contact parts CNT2 may be disposed on a second electrode contact part CE2 of the second electrode RME2. The second contact parts CNT2 may be disposed not to overlap the light emitting elements ED in the first direction DR1. For example, the second contact parts CNT2 may be disposed adjacent to a side, in the second direction DR2, of the second electrode extension part ET2 on which the light emitting elements ED may be disposed. Although the second contact electrode CNE2 may include two second contact parts CNT2 in the drawings, the disclosure is not limited thereto. The second contact electrode CNE2 may contact the second ends of the second light emitting elements ED2 and the second electrode RME2, and the second light emitting elements ED2 may be electrically connected to the second electrode RME2 through the second contact electrode CNE2.

Each of the first contact electrode CNE1 and the second contact electrode CNE2 may be directly disposed on the second insulating layer PAS2. The first contact electrode CNE1 and the second contact electrode CNE2 may have smaller widths than the electrodes RME and may form linear patterns extending in the second direction DR2 within the emission area EMA. The first contact parts CNT1 of the first contact electrode CNE1 may be disposed on a side of the first electrode extension part ET1 in the second direction DR2, and the second contact parts CNT2 of the second contact electrode CNE2 may be disposed on the other side of the second electrode extension part ET2 in the second direction DR2. However, the disclosure is not limited thereto.

The third insulating layer PAS3 may be disposed on the first contact electrode CNE1 and the second contact electrode CNE2. The third insulating layer PAS3 may cover or overlap the first contact electrode CNE1 and the second contact electrode CNE2, and a part of the third insulating layer PAS3 may also be disposed on the second insulating layer PAS2. In an embodiment, the third insulating layer PAS3 may be entirely disposed on the first insulating layer PAS1 except for parts or portions where the third contact electrode CNE3 is disposed on the electrodes RME. The third insulating layer PAS3 may insulate the first contact electrode CNE1 and the second contact electrode CNE2 from the third contact electrode CNE3 to prevent them from directly contacting each other. The third insulating layer PAS3 may be disposed between the first and second contact electrodes CNE1 and CNE2 and the third contact electrode CNE3 to insulate them from each other. However, in an embodiment, the third insulating layer PAS3 may be omitted. In this case, the first and second contact electrodes CNE1 and CNE2 and the third contact electrode CNE3 may be disposed on the same layer.

The third contact electrode CNE3 may include a first extending part CN_E1 disposed on the third electrode extension part ET3, a second extending part CN_E2 disposed on the fourth electrode extension part ET4, and a plurality of connecting parts CN_B connecting the first extending part CN_E1 and the second extending part CN_E2 to each other.

The first extending part CN_E1 and the second extending part CN_E2 may have a substantially similar shape to the first contact electrode CNE1. The first extending part CN_E1 and the second extending part CN_E2 may have smaller widths than the third electrode extension part ET3 and the fourth electrode extension part ET4 and may extend in the second direction DR2. However, lengths of the first extending part CN_E1 and the second extending part CN_E2 measured in the second direction DR2 may be greater than a length of the first contact electrode CNE1. The first extending part CN_E1 and the second extending part CN_E2 may be connected to each other through the connecting parts CN_B extending in the first direction DR1. The third contact electrode CNE3 may surround the first contact electrode CNE1 in a plan view.

For example, the first extending part CN_E1 and the second extending part CN_E2 may include a third contact part CNT3 and a fourth contact part CNT4. The third contact part CNT3 may be disposed on the third electrode RME3 and may have an increased width. The fourth contact part CNT4 may be disposed on the fourth electrode RME4 and may have an increased width. The third contact part CNT3 and the fourth contact part CNT4 may contact the third electrode RME3 and the fourth electrode RME4 exposed by the first insulating layer PAS1. The third contact part CNT3 and the fourth contact part CNT4 may be disposed not to overlap the light emitting elements ED in the first direction DR1. For example, the third contact part CNT3 and the fourth contact part CNT4 may be disposed side by side with the first contact parts CNT1 or the second contact parts CNT2 in the first direction DR1.

Although the third contact electrode CNE3 may include two contact parts CNT3 and CNT4 to contact the third electrode RME3 and the fourth electrode RME4 in the drawings, the disclosure is not limited thereto. The first extending part CN_E1 of the third contact electrode CNE3 may contact the first ends of the second light emitting elements ED2, and the second extending part CN_E2 may contact the second ends of the first light emitting elements ED1. The first light emitting elements ED1 and the second light emitting elements ED2 may be electrically connected in series to each other through the third contact electrode CNE3.

The contact electrodes CNE1 through CNE3 may include a conductive material such as ITO, IZO, ITZO, or aluminum (Al). For example, the contact electrodes CNE1 through CNE3 may include a transparent conductive material, and light emitted from the light emitting elements ED may pass through the contact electrodes CNE1 through CNE3 and proceed toward the electrodes RME, but the disclosure is not limited thereto.

Although not illustrated in the drawings, another insulating layer may be further disposed on the contact electrodes CNE1 through CNE3 and the third insulating layer PAS3 to cover or overlap them. The insulating layer may be entirely disposed on the first substrate SUB1 to protect the members disposed on the first substrate SUB1 from the external environment.

Each of the first insulating layer PAS1, the second insulating layer PAS2 and the third insulating layer PAS3 described above may include an inorganic insulating material or an organic insulating material. In an embodiment, each of the first insulating layer PAS1, the second insulating layer PAS2 and the third insulating layer PAS3 may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$). Alternatively, each of the first insulating layer PAS1, the second insulating layer PAS2 and the third insulating layer PAS3 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the disclosure is not limited thereto.

As described above, each pixel PX of the display device 10 may include different types of subpixels PXn having different arrangements of the emission area EMA and the sub area SA. Accordingly, the arrangement of the electrodes RME in each subpixel PXn may vary according to the arrangement of the emission area EMA and the sub area SA in the subpixel PXn.

For example, in the first subpixel PX1 and the third subpixel PX3, the sub area SA may be disposed on an upper side of each of the first emission area EMA1 and the third emission area EMA3 which is the first side of the second direction DR2. The first electrode RME1 and the third electrode RME3 of each of the first subpixel PX1 and the third subpixel PX3 may extend downward from the first electrode contact part CE1 and the third electrode contact part CE3 disposed in the sub area SA, and may be disposed in the emission area EMA. On the other hand, in the second subpixel PX2, the sub area SA may be disposed on a lower side of the second emission area EMA2 which is the second side of the second direction DR2. The first electrode RME1 and the third electrode RME3 of the second subpixel PX2 may extend upward from the first electrode contact part CE1 and the third electrode contact part CE3 disposed in the sub area SA, and may be disposed in the emission area EMA. The first subpixel PX1 and the third subpixel PX3 may be first type subpixels in which the first electrode RME1 and the third electrode RME3 extend downward from the electrode contact parts CE1 and CE3, and the second subpixel PX2 may be a second type subpixel in which the first electrode RME1 and the third electrode RME3 extend upward from the electrode contact parts CE1 and CE3.

The second electrode RME2 extends across a plurality of pixels PX or subpixels PXn neighboring in the second direction DR2 beyond the sub area SA. The second electrode RME2 may include a plurality of second electrode contact parts CE2. The second electrode contact parts CE2 may overlap the first wiring horizontal part VDL_H or the second wiring horizontal part VSL_H, but only the second electrode contact part CE2 overlapping the second wiring horizontal part VSL_H may contact the second wiring horizontal part VSL_H through the second electrode contact hole CTS. A second wiring horizontal part VSL_H may extend in the first direction DR1 and contact the second electrodes RME2 of a plurality of subpixels PXn arranged or disposed in the first direction DR1. The position of the second electrode contact part CE2 contacting the second wiring horizontal part VSL_H may be different in different types of subpixels PXn.

For example, in the first subpixel PX1 and the third subpixel PX3 which may be first type subpixels, the second wiring horizontal part VSL_H is disposed on an upper side of the sub area SA. The second electrode contact part CE2 of the second electrode RME2 disposed in the first type subpixels may be disposed on the upper side of the sub area SA to contact the second wiring horizontal part VSL_H in the emission area EMA of another subpixel PXn neighboring in the second direction DR2.

On the other hand, in the second subpixel PX2 which may be a second type subpixel, the second wiring horizontal part VSL_H may cross or intersect the second emission area EMA2. The second electrode contact part CE2 of the second electrode RME2 disposed in the second type subpixel may be partially disposed in the emission area EMA and may contact the second wiring horizontal part VSL_H in the vicinity of the emission area EMA of the subpixel PXn.

Similarly, the arrangement and structures of the contact electrodes CNE1 through CNE3 may also be different in the first subpixel PX1 and the second subpixel PX2. For example, a second contact part CNT2 of the second contact electrode CNE2 of the first subpixel PX1 contacts the second electrode contact part CE2 disposed on the first wiring horizontal part VDL_H. On the other hand, a second contact part CNT2 of the second contact electrode CNE2 of the second subpixel PX2 may contact the second electrode contact part CE2 disposed on the second wiring horizontal part VSL_H.

In the display device 10 according to an embodiment, the first and third subpixels PX1 and PX3 and the second subpixel PX2 may be defined as different types of subpixels. Accordingly, the arrangement of the emission area EMA and the sub area SA or the structures of the electrodes RME may be different. In the drawings, the direction in which the first electrode RME1 and the third electrode RME3 extend from the first electrode contact part CE1 and the third electrode contact part CE3 disposed in the sub area SA is opposite in the first subpixel PX1 and the second subpixel PX2. For example, the arrangement of the electrodes RME, the contact electrodes CNE1 through CNE3, and the emission area EMA and the sub area SA in the second subpixel PX2 may be symmetrical to that in the first subpixel PX1. Since the display device 10 may include different types of subpixels, the emission areas EMA of neighboring subpixels PXn in one pixel PX may not be arranged or disposed side by side with each other, and the sub area SA may be disposed between the emission areas EMA spaced apart from each other in the first direction DR1.

Since one pixel PX may include a plurality of subpixels PXn and each subpixel PXn may include the emission area EMA and the sub area SA, the pixel PX may be divided into an area where the light emitting elements ED may be disposed and an area where the light emitting elements ED may not be disposed. To make the light emitting elements ED emit light, each subpixel PXn may include a plurality of electrodes RME and a plurality of contact electrodes CNE1 through CNE3, which may be disposed in the emission area EMA. To have a certain level of luminance, each emission area EMA requires an area sufficient to accommodate a plurality of light emitting elements ED, and the electrodes RME and the contact electrodes CNE1 through CNE3 for driving the light emitting elements ED. When the emission areas EMA may not be disposed side by side and the sub area SA is disposed between them as in the display device 10 according to an embodiment, it is more advantageous in securing the area of the emission area EMA relative to the area of a single pixel PX than when the emission areas EMA may be arranged or disposed in one direction.

For example, when the display device 10 further may include color control structures (TPL, WCL1 and WCL2 of FIG. 16) disposed on the display element layer and to which light emitted from the light emitting elements ED is incident, the emission areas EMA can secure a sufficient area. Even if the color control structures may be disposed in the sub area SA neighboring the emission areas EMA, there is no concern of color mixing. In an embodiment, the color control structures may include organic materials. The color control structures may be deformed by deterioration of the organic materials and thus reduced in width. However, if the color control structures may be disposed in the sub area SA while covering or overlapping the light emitting elements ED of the emission areas EMA, they may cover or overlap at least the light emitting elements ED and maintain the output light efficiency even if their widths may be reduced. This will be described in detail later with reference to other drawings.

Figure 14:
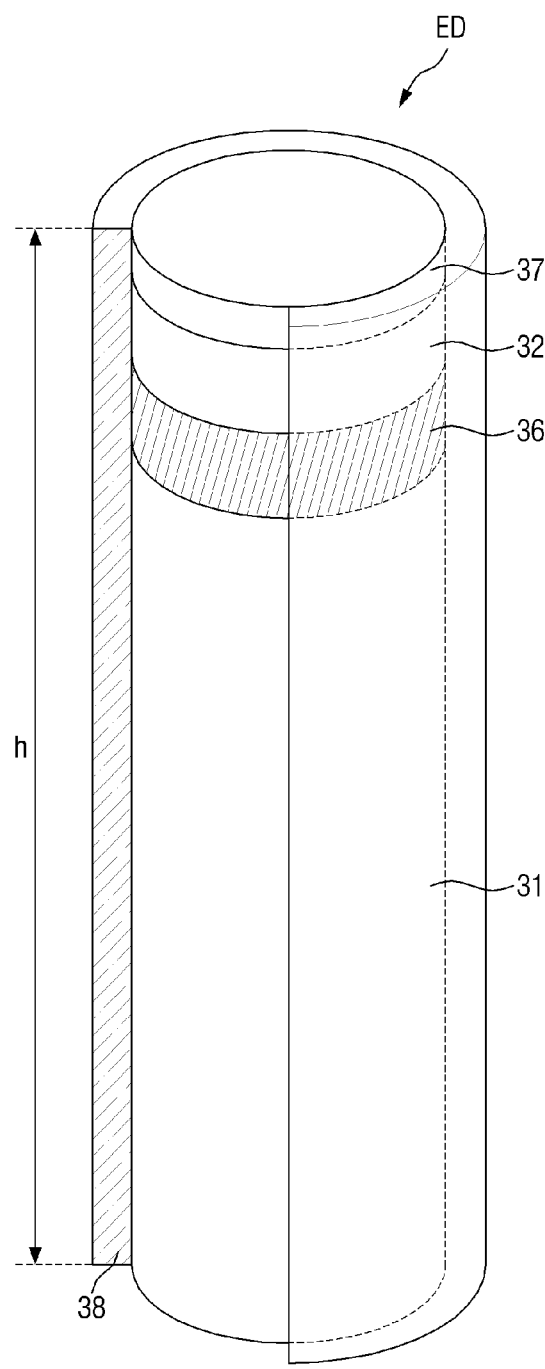
FIG. 14 is a schematic view of a light emitting element according to an embodiment.

FIG. 14 is a schematic view of a light emitting element ED according to an embodiment.

The light emitting element ED may be a light emitting diode. For example, the light emitting element ED may be a light emitting diode having a size of micrometers or nanometers and made of an inorganic material. When an electric field is formed in a specific or predetermined direction between two electrodes facing each other, the inorganic light emitting diode may be aligned between the two electrodes in which polarities may be formed. The light emitting element ED may be aligned between the electrodes by the electric field formed on the two electrodes.

The light emitting element ED according to an embodiment may extend in one direction. The light emitting element ED may have a shape like a rod, a wire, a tube, or the like within the spirit and the scope of the disclosure. In an embodiment, the light emitting element ED may be shaped substantially like a cylinder or a rod. However, the shape of the light emitting element ED is not limited thereto, and the light emitting element ED may also have various shapes including substantially polygonal prisms, such as a cube, a rectangular parallelepiped and a hexagonal prism, and a shape extending in a direction and having a partially inclined outer surface. A plurality of semiconductors included in the light emitting element ED which will be described later may be sequentially disposed or stacked along the one direction.

The light emitting element ED may include a semiconductor layer doped with impurities of any conductivity type (for example, a p type or an n type). The semiconductor layer may receive an electrical signal from an external power source to emit light of a specific or predetermined wavelength band.

Referring to FIG. 14, the light emitting element ED may include a first semiconductor layer 31, a second semiconductor layer 32, the light emitting layer 36, an electrode layer 37, and the insulating film 38.

The first semiconductor layer 31 may be an n-type semiconductor. For example, when the light emitting element ED emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). The semiconductor material may be, for example, any one or more of n-type doped AlGaInN, GaN, AlGaN, InGaN, AlN, and InN. The first semiconductor layer 31 may be doped with an n-type dopant, and the n-type dopant may be, for example, Si, Ge, or Sn. In an embodiment, the first semiconductor layer 31 may be n-GaN doped with n-type Si. A length of the first semiconductor layer 31 may be in the range of, but not limited to, about 1.5 to about 5 μm.

The second semiconductor layer 32 is disposed on the light emitting layer 36 to be described later. The second semiconductor layer 32 may be a p-type semiconductor. For example, when the light emitting element ED emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). The semiconductor material may be, for example, any one or more of p-type doped AlGaInN, GaN, AlGaN, InGaN, AlN, and InN. The second semiconductor layer 32 may be doped with a p-type dopant, and the p-type dopant may be, for example, Mg, Zn, Ca, Se, or Ba. In an embodiment, the second semiconductor layer 32 may be p-GaN doped with p-type Mg. A length of the second semiconductor layer 32 may be in the range of, but not limited to, about 0.05 to about 0.10 µm.

Although each of the first semiconductor layer 31 and the second semiconductor layer 32 is composed of one layer in the drawing, the disclosure is not limited thereto. According to embodiments, each of the first semiconductor layer 31 and the second semiconductor layer 32 may include a larger number of layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. When the light emitting layer 36 may include a material having a multiple quantum well structure, it may have a structure in which a plurality of quantum layers and a plurality of well layers may be alternately stacked. The light emitting layer 36 may emit light through combination of electron-hole pairs according to electrical signals received through the first semiconductor layer 31 and the second semiconductor layer 32. For example, when the light emitting layer 36 emits light in the blue wavelength band, it may include a material such as AlGaN or AlGaInN. For example, when the light emitting layer 36 has a multiple quantum well structure in which a quantum layer and a well layer may be alternately stacked, the quantum layer may include a material such as AlGaN or AlGaInN, and the well layer may include a material such as GaN or AlInN. In an embodiment, the light emitting layer 36 may include AlGaInN as a quantum layer and AlInN as a well layer to emit blue light whose central wavelength band is in the range of about 450 to about 495 nm.

However, the disclosure is not limited thereto, and the light emitting layer 36 may also have a structure in which a semiconductor material having a large band gap energy and a semiconductor material having a small band gap energy may be alternately stacked or may include different group 3 to 5 semiconductor materials depending on the wavelength band of emitted light. Light emitted from the light emitting layer 36 is not limited to light in the blue wavelength band. In some cases, the light emitting layer 36 may emit light in a red or green wavelength band. A length of the light emitting layer 36 may be in the range of, but not limited to, about 0.05 to about 0.10 µm.

Light emitted from the light emitting layer 36 may be radiated not only to an outer surface of the light emitting element ED in a longitudinal direction but also to both side surfaces. For example, the direction of the light emitted from the light emitting layer 36 is not limited to one direction.

The electrode layer 37 may be an ohmic contact electrode. However, the disclosure is not limited thereto, and the electrode layer 37 may also be a Schottky contact electrode. The light emitting element ED may include at least one electrode layer 37. Although the light emitting element ED may include one electrode layer 37 in FIG. 14, the disclosure is not limited thereto. In some cases, the light emitting element ED may include more electrode layers 37, or the electrode layer 37 may be omitted. The following description of the light emitting element ED may be applied equally even when the light emitting element ED may include a different number of electrode layers 37 or further may include other structures.

When the light emitting element ED is electrically connected to an electrode or a contact electrode in the display device 10 according to an embodiment, the electrode layer 37 may reduce the resistance between the light emitting element ED and the electrode or the contact electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IWO), and indium tin zinc oxide (ITZO). For example, the electrode layer 37 may include, but is not limited to, an n-type or p-type doped semiconductor material.

The insulating film 38 surrounds outer surfaces of a plurality of semiconductor layers and a plurality of electrode layers. In an embodiment, the insulating film 38 may surround an outer surface of at least the light emitting layer 36 and extend in the direction in which the light emitting element ED extends. The insulating film 38 may protect the above members. For example, the insulating film 38 may surround side surfaces of the above members but may expose both ends of the light emitting element ED in the longitudinal direction.

In the drawing, the insulating film 38 extends in the longitudinal direction of the light emitting element ED to cover or overlap from side surfaces of the first semiconductor layer 31 to side surfaces of the electrode layer 37. However, the disclosure is not limited thereto. The insulating film 38 may also cover or overlap outer surfaces of only some or a predetermined number of semiconductor layers as well as the light emitting layer 36, or may cover or overlap only a part of an outer surface of the electrode layer 37 to partially expose the outer surface of each electrode layer 37. For example, an upper surface of the insulating film 38 may be rounded in cross section in an area adjacent to at least one end of the light emitting element ED.

A thickness of the insulating film 38 may be in the range of, but not limited to, about 10 nm to about 1.0 µm. The thickness of the insulating film 38 may be about 40 nm.

The insulating film 38 may include a material having insulating properties, such as silicon oxide ($SiO_x$), silicon nitride ($SiN_x$), silicon oxynitride ($SiO_xN_y$), or aluminum oxide ($AlO_x$). Accordingly, it can prevent an electrical short circuit that may occur when the light emitting layer 36 directly contacts an electrode that transmits an electrical signal to the light emitting element ED. For example, since the insulating film 38 protects the outer surface of the light emitting element ED including the light emitting layer 36, a reduction in luminous efficiency can be prevented. Although the insulating; film 38 is illustrated as a single layer in the drawing, the disclosure is not limited thereto, and the insulating film 38 may also be formed as a double layer or a multilayer in which a plurality of layers may be stacked.

For example, in an embodiment, an outer surface of the insulating film 38 may be treated. The light emitting elements ED may be dispersed in a predetermined ink to be sprayed onto electrodes to be aligned. Here, the surface of the insulating film 38 may be hydrophobically or hydrophilically treated so that the light emitting element ED is kept separate in the ink without being agglomerated with other adjacent light emitting elements ED.

A length h of the light emitting element ED may be in the range of about 1 to about 10 µm or about 2 to about 6 µm and may be in the range of about 3 to about 5 µm. For example, a diameter of the light emitting element ED may be in the range of about 30 to about 700 nm, and an aspect ratio of the light emitting element ED may be about 1.2 to about 100. However, the disclosure is not limited thereto, and a plurality of light emitting elements ED included in the display device 10 may also have different diameters according to a difference in the composition of the light emitting layer 36. The diameter of the light emitting element ED may be about 500 nm.

In the display device 10 according to an embodiment, wirings of the circuit layer CCL electrically connected to a plurality of subpixels PXn may be disposed based on a single unit pixel PX, not based on the subpixel PXn. Accordingly, the wirings of the circuit layer CCL disposed under or below an area occupied by one subpixel PXn may be different in each subpixel PXn. For example, one pixel PX of the display device 10 may include different types of subpixels PXn having different arrangements of the emission area EMA and the sub area SA. Accordingly, the positions of the electrode contact parts CE1 and CE2, through which the electrodes RME, for example, the first electrode RME1 and the second electrode RME2 disposed in each subpixel PXn may be electrically connected to the third conductive layer thereunder, may be different in each subpixel PXn included in one pixel PX.

Figure 15:
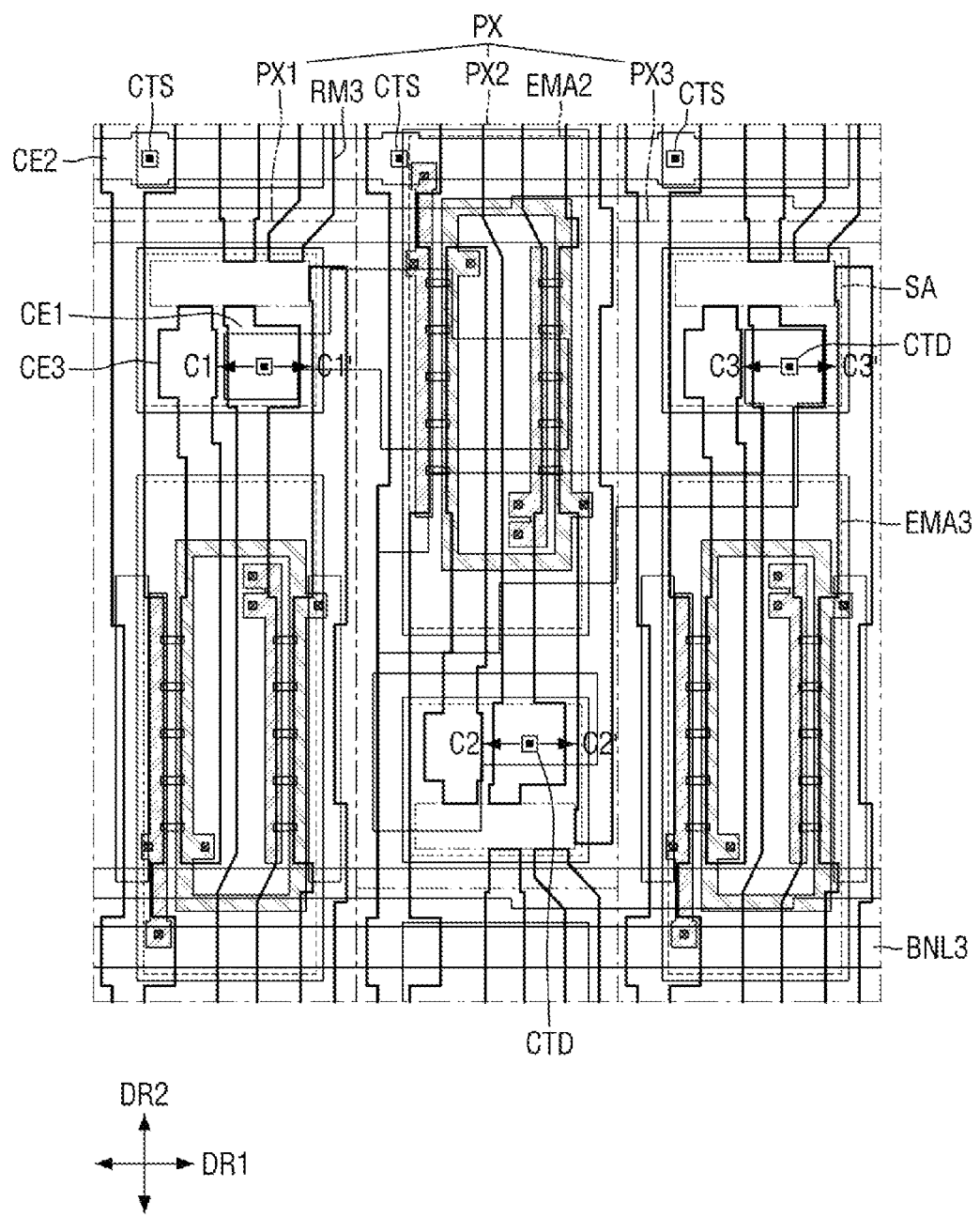
FIG. 15 is a plan view illustrating the schematic arrangement of a plurality of electrodes and a third conductive layer included in one pixel of the display device according to an embodiment.
Figure 16:
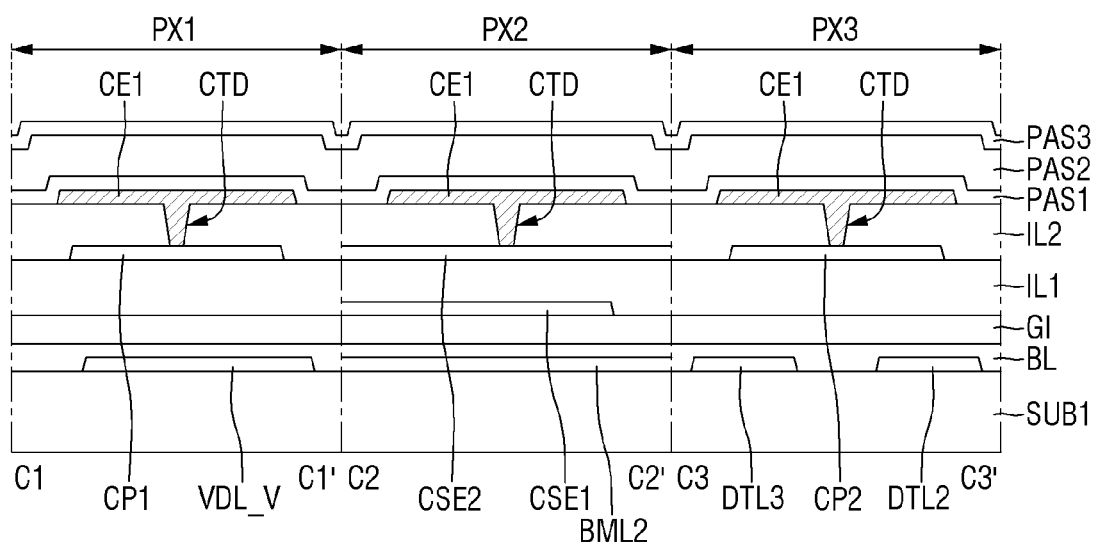
FIG. 16 is a schematic cross-sectional view taken along lines C1-C1', C2-C2' and C3-C3' of FIG. 15.

FIG. 15 is a plan view illustrating the schematic arrangement of a plurality of electrodes and the third conductive layer included in one pixel PX of the display device 10 according to an embodiment. FIG. 16 is a schematic cross-sectional view taken along lines C1-C1', C2-C2' and C3-C3' of FIG. 15.

FIG. 15 illustrates only relative positions of the third conductive layer of the circuit layer CCL and the third bank BNL3, the electrodes RME, the light emitting elements ED and the contact electrodes CNE1 through CNE3 disposed on the third conductive layer. FIG. 16 illustrates cross sections of the first electrode contact parts CE1 of the first subpixel PX1, the second subpixel PX2 and the third subpixel PX3.

Referring to FIGS. 15 and 16, for the first electrode RME1 of each subpixel PXn, the first electrode contact part CE1 disposed in the sub area SA may contact the third conductive layer thereunder and may thus be electrically connected to a first transistor T1 of the circuit layer CCL. The first electrode RME1 may be electrically connected to the first source electrode S1 of the first transistor T1. The second capacitor electrodes the first source electrodes S1 of the first transistors T1 disposed in the circuit layer CCL may be disposed in the second subpixel PX2 or at the boundary between the first subpixel PX1 and the second subpixel PX2 in a plan view. The first electrodes RME1 of the first subpixel PX1 and the third subpixel PX3 may be disposed not to overlap the second capacitor electrodes CSE2 of the third conductive layer. And the first electrode RME1 of the second subpixel PX2 may be disposed to overlap the second capacitor electrodes CSE2 of the third conductive layer. According to an embodiment, the first electrode contact part CE1 of each subpixel PXn may directly contact the second capacitor electrodes CSE2 of the third conductive layer or may be electrically connected to the second capacitor electrodes CSE2 through the extending electrode parts CP1 and CP2.

For example, first active layer ACT1, and a second capacitor electrode CSE2 forming the first source electrode S1 of a first transistor T1 electrically connected to the first electrode RME1 of the first subpixel PX1 may be disposed on the upper side of the center of the pixel PX which is the first side of the second direction DR2. However, since the second capacitor electrode CSE2 of the first subpixel PX1 is disposed not to overlap the first electrode RME1 and the sub area SA of the first subpixel PX1, the first electrode contact part CE1 may not directly contact the second capacitor electrode CSE2 of the first subpixel PX1. The third conductive layer may include the first extending electrode part CP1 which may be directly electrically connected to the second capacitor electrode CSE2 of the first subpixel PX1 and overlaps the sub area SA of the first subpixel PX1. The first extending electrode part CP1, including a part extending in the first direction DR1, may be integrated with the second capacitor electrode CSE2 and may directly contact the first electrode contact part CE1 in the sub area SA of the first subpixel PX1. The first electrode RME1 of the first subpixel PX1 may be electrically connected to the first source electrode S1 of the first transistor T1 through the first extending electrode part CP1.

Similarly, the first active layer ACT1, and a second capacitor electrode CSE2 forming the first source electrode S1 of a first transistor T1 electrically connected to the first electrode RME1 of the third subpixel PX3 may be disposed adjacent to the center of the pixel PX. However, since the second capacitor electrode CSE2 of the third subpixel PX3 is disposed not to overlap the first electrode RME1 and the sub area SA of the third subpixel PX3, the first electrode contact part CE1 may not directly contact the second capacitor electrode CSE2 of the third subpixel PX3. The third conductive layer may include the second extending electrode part CP2 which may be directly electrically connected to the second capacitor electrode CSE2 of the third subpixel PX3 and overlaps the sub area SA of the third subpixel PX3. The second extending electrode part CP2, including a part extending in the first direction DR1 and a part extending in the second direction DR2, may be integrated with the second capacitor electrode CSE2, and may directly contact the first electrode contact part CE1 in the sub area SA of the third subpixel PX3. The first electrode RME1 of the third subpixel PX3 may be electrically connected to the first source electrode S1 of the first transistor T1 through the second extending electrode part CP2.

On the other hand, the first active layer ACT1, and a second capacitor electrode CSE2 forming the first source electrode S1 of a first transistor T1 electrically connected to the first electrode RME1 of the second subpixel PX2 may be disposed on the lower side of the pixel PX which may be the second side of the second direction DR2. Since the second capacitor electrode CSE2 of the second subpixel PX2 may be disposed to overlap the first electrode RME1 and the sub area SA of the second subpixel PX2, the first electrode contact part CE1 may directly contact the second capacitor electrode CSE2 of the second subpixel PX2. The first electrode RME1 of the second subpixel PX2 may be directly electrically connected to the first source electrode S1 of the first transistor T1.

As described above, for the second electrode RME2, the position of the second electrode contact part CE2 overlapping the second wiring horizontal part VSL_H may be different based on the emission area EMA and the sub area SA of each subpixel PXn. For example, in each of the first subpixel PX1 and the third subpixel PX3, the second electrode contact part CE2 contacting the second wiring horizontal part VSL_H may be disposed on the upper side of the sub area SA and in the emission area EMA of another pixel PX neighboring in the second direction DR2. In the second subpixel PX2, the second electrode contact part CE2 may be partially disposed in the second emission area EMA2 and may contact the second wiring horizontal part VSL_H. For example, the position of the second electrode contact hole CTS may be different according to the type of subpixel PXn in one pixel PX. The second electrode RME2 of each of the first subpixel PX1 and the third subpixel PX3 may contact the second wiring horizontal part VSL_H through the second electrode contact hole CTS formed in the emission area EMA of another pixel PX, and the second electrode RME2 of the second subpixel PX2 may contact the second wiring horizontal part VSL_H through the second electrode contact hole CTS formed adjacent to the second emission area EMA2 of the second subpixel PX2.

In the display device 10 according to an embodiment, the arrangement of the electrodes RME and the wirings in the unit pixel PX illustrated in FIG. 15 may be repeated or may alternate with another arrangement in the first direction DR1 and the second direction DR2.

In pixels PX arranged or disposed in the second direction DR2, the arrangement of the electrodes RME and the wirings in FIG. 15 may be repeated. Since the first wiring horizontal part VDL_H and the second wiring horizontal part VSL_H may be alternately arranged or disposed along the second direction DR2 as described above, the position of the second electrode contact hole CTS through which the second electrode contact part CE2 and the second wiring horizontal part VSL_H may be electrically connected to each other may be different in each of the pixels PX.

For example, among the pixels PX arranged or disposed in the second direction DR2, a pixel PX in which the second electrode contact hole CTS is formed in the second electrode contact part CE2 of each of the first subpixel PX1 and the third subpixel PX3 and a pixel PX in which the second contact hole CTS is not formed may be alternately arranged or disposed. In the pixel PX illustrated in FIG. 15, the second electrode contact hole CTS is not formed in the second electrode contact part CE2 of each of the first subpixel PX1 and the third subpixel PX3. In a pixel PX located or disposed above the pixel PX illustrated in FIG. 15, the second electrode contact hole CTS may be formed in the second electrode contact part CE2 of each of the first subpixel PX1 and the third subpixel PX3.

Similarly, among the pixels PX arranged or disposed in the second direction DR2, a pixel PX in which the second electrode contact hole CTS is formed in the second electrode contact part CE2 of the second subpixel PX2 and a pixel PX in which the second contact hole CTS is not formed may be alternately arranged or disposed. In the pixel PX illustrated in FIG. 15, the second electrode contact hole CTS is formed in the second electrode contact part CE2 of the second subpixel PX2. In a pixel PX located or disposed below the pixel PX illustrated in FIG. 15, the second electrode contact hole CTS may not be formed in the second electrode contact part CE2 of the second subpixel PX2.

In pixels PX arranged or disposed in the first direction DR1, the arrangement of the electrodes RME, the emission area EMA and the sub area SA in FIG. 15 may be repeated or may be alternately flipped. For example, in the pixel PX of FIG. 15, the first subpixel PX1 and the third subpixel PX3 may be first type subpixels in which the first electrode RME1 extends downward from the first electrode contact part CE1, and the second subpixel PX2 may be a second type subpixel. When pixels PX having the same arrangement of the electrodes RME, the emission area EMA and the sub area SA may be repeatedly arranged or disposed, the first subpixel PX1 and the third subpixel PX3 may be first type subpixels, and the second subpixel PX2 may be a second type subpixel in a pixel PX neighboring the pixel PX of FIG. 15 in the first direction DR1. On the other hand, when the arrangement of the electrodes RME, the emission area EMA and the sub area SA may be alternately flipped, the first subpixel PX1 and the third subpixel PX3 may be second type subpixels, and the second subpixel PX2 may be a first type subpixel in the pixel neighboring the pixel PX of FIG. 15 in the first direction DR1. Since the display device 10 according to an embodiment may include different types of subpixels having different arrangements of the emission area EMA and the sub area SA in one pixel PX, subpixels PXn neighboring in the first direction DR1 can each secure the emission area EMA having a sufficient area. This is advantageous in implementing an ultra-high resolution display device.

Further, in an embodiment in which the display device 10 may include color control structures disposed on the display element layer, each color control structure overlapping the emission area EMA of a subpixel PXn may be formed to have a sufficient width. Since the sub area SA of another subpixel PXn may be disposed on a side of the emission area EMA in the first direction DR1, the color control structure may extend beyond the emission area EMA of the subpixel PXn to the sub area SA of the neighboring subpixel PXn.

Figure 17:
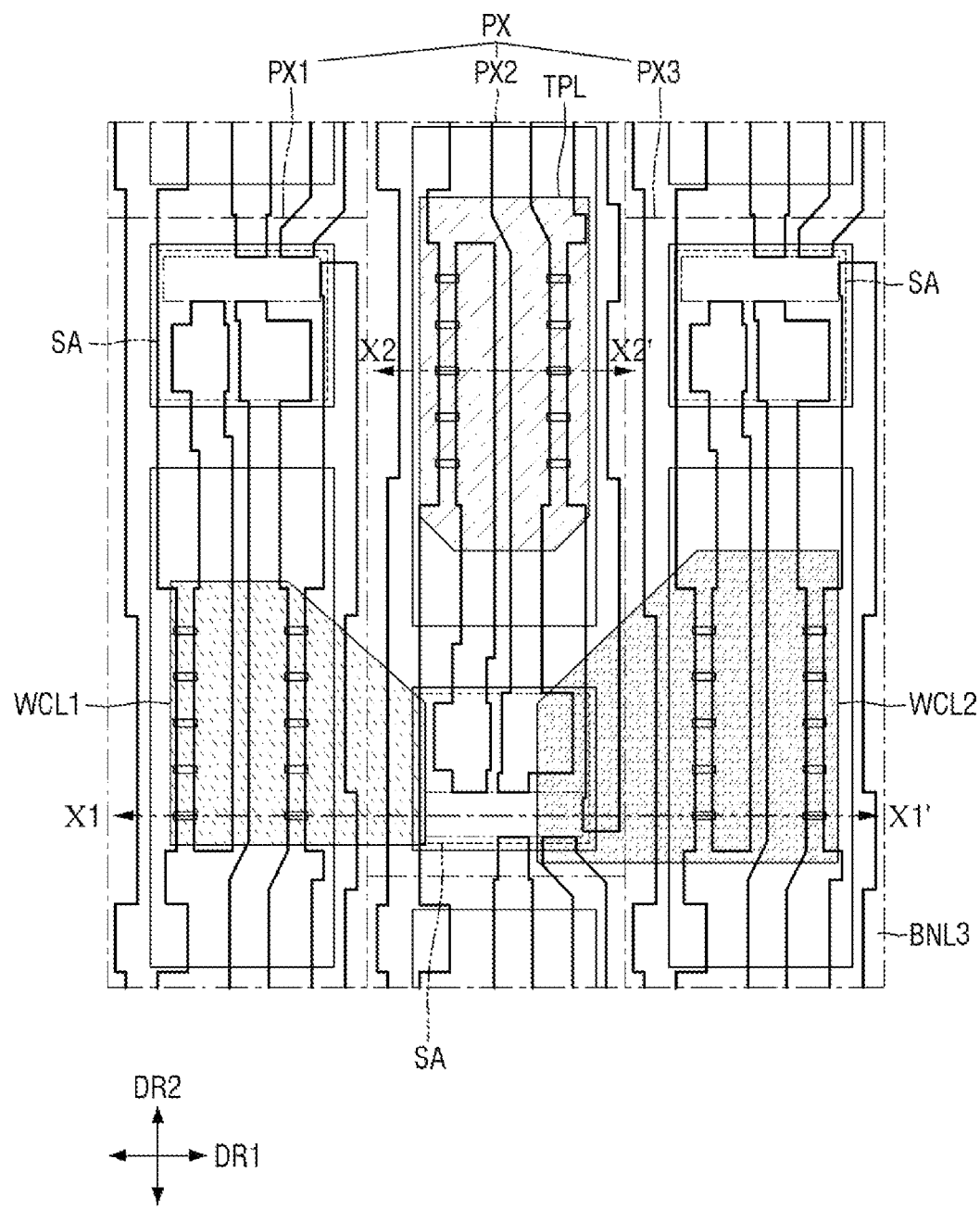
FIG. 17 is a plan view illustrating the schematic arrangement of color control structures disposed in one pixel of the display device according to an embodiment.
Figure 18:
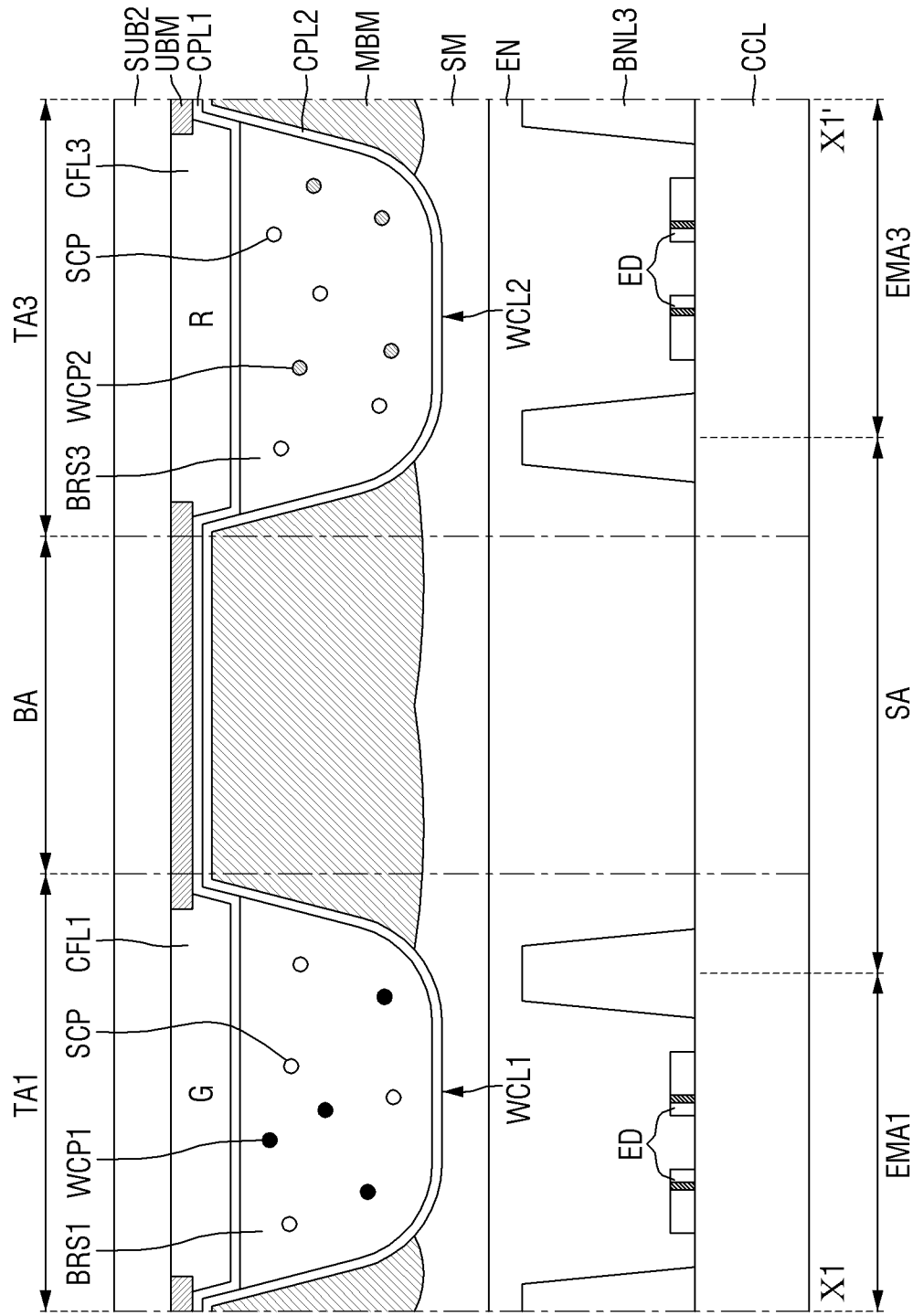
FIG. 18 is a schematic cross-sectional view taken along line X1-X1' of FIG. 17.
Figure 19:
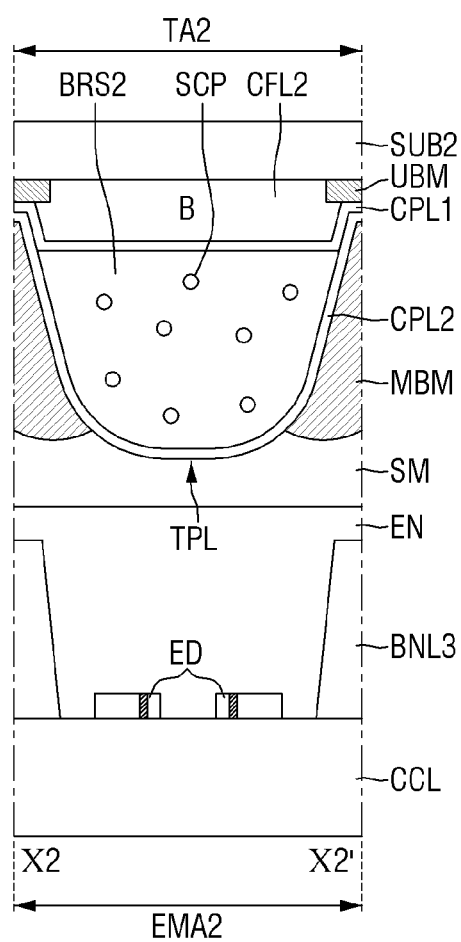
FIG. 19 is a schematic cross-sectional view taken along line X2-X2' of FIG. 17.

FIG. 17 is a plan view illustrating the schematic arrangement of color control structures disposed in one pixel PX of the display device 10 according to an embodiment. FIG. 18 is a schematic cross-sectional view taken along line X1-X1' of FIG. 17. FIG. 19 is a schematic cross-sectional view taken along line X2-X2' of FIG. 17.

FIG. 18 illustrates cross sections of a first wavelength conversion layer WCL1 and a second wavelength conversion layer WCL2 which may be color control structures disposed in the first subpixel PX1 and the third subpixel PX3. FIG. 19 illustrates a cross section of a light transmitting layer TPL which may be a color control structure disposed in the second subpixel PX2. To describe relative positions of the color control structures WCL1, WCL2 and TPL in the subpixels PXn, FIG. 17 illustrates only the third bank BNL3, the light emitting elements ED and the electrodes RME, and FIGS. 18 and 19 illustrate only the circuit layer CCL, the third bank BNL3 and the light emitting elements ED.

Referring to FIGS. 17 through 19, the display device 10 according to an embodiment may further include a plurality of color control structures WCL1, WCL2 and TPL and a plurality of color filter layers CFL1 through CFL3 disposed on the display element layer. The display device 10 may further include a second substrate SUB2 facing the first substrate SUB1, and the color filter layers CFL1 through CFL3 and the color control structures WCL1, WCL2 and TPL may be disposed on a surface of the second substrate SUB2 which faces the first substrate SUB1. Structures stacked on the surface of the second substrate SUB2 will now be sequentially described.

The second substrate SUB2 may be made of a light transmitting material. In an embodiment, the second substrate SUB2 may include a glass substrate or a plastic substrate. In an embodiment, the second substrate SUB2 may further include a separate layer, for example, an insulating layer such as an inorganic layer located or disposed on the glass substrate or the plastic substrate.

The color filter layers CFL1 through CFL3 and a first light blocking member UBM may be disposed on the surface of the second substrate SUB2 which faces the first substrate SUB1. The first light blocking member UBM and the color filter layers CFL1 through CFL3 may be directly disposed on the surface of the second substrate SUB2. The first light blocking member UBM is formed in a lattice pattern to partially expose the surface of the second substrate SUB2, and the color filter layers CFL1 through CFL3 may be disposed on the surface of the second substrate SUB2 exposed by the first light blocking member UBM. A part of each of the color filter layers CFL1 through CFL3 may be directly disposed on the surface of the second substrate SUB2, and the other part may be disposed on the first light blocking member UBM. Different color filter layers CFL1 through CFL3 may be spaced apart from each other on the first light blocking member UBM. However, the disclosure is not limited thereto, and the color filter layers CFL1 through CFL3 may also overlap each other.

The first light blocking member UBM may surround areas where the color control structures TPL, WCL1 and WCL2 to be described later may be disposed. The first light blocking member UBM may expose parts of the surface of the second substrate SUB2 which correspond to the areas where the color control structures TPL, WCL1 and WCL2 may be disposed. For example, to the third bank BNL3 of the display element layer, the first light blocking member UBM may be disposed to partially overlap, as well as the third bank BNL3 of the display element layer, the sub area SA and the emission area EMA of each subpixel PXn to form a substantially lattice shape in a plan view. The second substrate SUB2 may include a plurality of light transmitting areas TA1 through TA3 as the areas surrounded by the first light blocking member UBM and a light blocking area BA as an area where the first light blocking member UBM is disposed. First through third light transmitting areas TA1 through TA3 may be formed to correspond to the first through third subpixels PX1 through PX3, respectively, and the areas of the first through third light transmitting areas TA1 through TA3 may vary according to the shapes of the color control structures TPL, WCL1 and WCL2. For example, the structures of the first light blocking member UBM and the light blocking area BA may vary according to the shapes of the color control structures TPL, WCL1 and WCL2.

The first light blocking member UBM may include an organic material. The first light blocking member UBM may reduce color distortion due to reflection of external light by absorbing the external light. In an embodiment, the first light blocking member UBM may absorb all visible wavelengths. The first light blocking member UBM may include a light absorbing material. For example, the first light blocking member UBM may be made of a material used as a black matrix of the display device 10 and may be made of substantially the same or similar material as a second light blocking member MBM.

In an embodiment, in the display device 10, the first light blocking member UBM may be omitted or replaced with a material that absorbs light of a specific or predetermined wavelength among the visible wavelengths and transmits light of wavelengths other than the specific or predetermined wavelength. For example, the first light blocking member UBM may be replaced with the color filter layers CFL1 through CFL3. For example, at least any one of a first color filter layer CFL1 and a third color filter layer CFL3 may be partially stacked on a second color filter layer CFL2 to prevent color mixing between neighboring light transmitting areas TA1 through TA3. In an embodiment, the first light blocking member UBM may be formed integrally with the second color filter layer CFL2. This will be described with reference to an embodiment.

The color filter layers CFL1 through CFL3 may be disposed on the surface of the second substrate SUB2 exposed by the first light blocking member UBM. The color filter layers CFL1 through CFL3 may include the first color filter layer CFL1 disposed in the first subpixel PX1, the second color filter layer CFL2 disposed in the second subpixel PX2, and the third color filter layer CFL3 disposed in the third subpixel PX3. Each of the color filter layers CFL1 through CFL3 may include a colorant such as a dye or pigment that absorbs wavelengths other than a wavelength of a color displayed by a corresponding subpixel PXn. The first color filter layer CFL1 may be a green color filter layer, the second color filter layer CFL2 may be a blue color filter layer, and the third color filter layer CFL3 may be a red color filter layer. Light emitted from the light emitting elements ED may exit through the color filter layers CFL1 through CFL3 after passing through the color control structures TPL, WCL1 and WCL2.

Although neighboring color filter layers CFL1 through CFL3 may be separated by the first light blocking member UBM in the drawings, they may also at least partially overlap each other on the first light blocking member UBM.

The color filter layers CFL1 through CFL3 may be formed in a similar pattern to the color control structures TPL, WCL1 and WCL2 and disposed to cover or overlap a part of the emission area EMA of each subpixel PXn. The color filter layers CFL1 through CFL3 may be respectively disposed in the subpixels PXn to form substantially island-shaped or isolated shaped patterns, but the disclosure is not limited thereto. The color filter layers CFL1 through CFL3 may also form linear patterns over the entire display area DPA.

A first capping layer CPL1 may cover or overlap the color filter layers CFL1 through CFL3 and the first light blocking member UBM. The first capping layer CPL1 may directly contact the color filter layers CFL1 through CFL3 and may also directly contact a surface of the first light blocking member UBM exposed between the color filter layers CFL1 through CFL3 spaced apart from each other. The first capping layer CPL1 may prevent impurities such as moisture or air from being introduced from the outside so as to protect the color filter layers CFL1 through CFL3 from damage or contamination. For example, the first capping layer CPL1 may prevent the colorants contained in the first through third color filter layers CFL1 through CFL3 from spreading to other elements, for example, the color control structures TPL, WCL1 and WCL2. In an embodiment, the first capping layer CPL1 may be made of an inorganic material. For example, the first capping layer CPL1 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The color control structures TPL, WCL1 and WCL2 may be disposed on a surface of the first capping layer CPL1. In an embodiment in which the light emitting elements ED of each subpixel PXn emit light of the first color, the color control structures TPL, WCL1 and WCL2 may include the first wavelength conversion layer WCL1 disposed in the first subpixel PX1, the light transmitting layer TPL, disposed in the second subpixel PX2, and the second wavelength conversion layer WCL2 disposed in the third subpixel PX3.

The first wavelength conversion layer WCL1 may include a first base resin BRS1 and first wavelength conversion materials WCP1 and scatterers SCP disposed or contained in the first base resin BRS1. The second wavelength conversion layer WCL2 may include a third base resin BRS3 and second wavelength conversion materials WCP2 and scatterers SCP disposed or contained in the third base resin BRS3. The first wavelength conversion layer WCL1 and the second wavelength conversion layer WCL2 convert the wavelength of the light of the first color incident from the light emitting elements ED and transmit the converted light. The scatterers SCP of the first wavelength conversion layer WCL1 and the second wavelength conversion layer WCL2 may increase wavelength conversion efficiency.

The light transmitting layer TPL may include a second base resin BRS2 and scatterers SCP disposed or contained in the second base resin BRS2. The light transmitting layer TPL transmits light of the first color incident from the light emitting elements ED while maintaining the wavelength of the light. The scatterers SCP of the light transmitting layer TPL may adjust an output path of light output through the light transmitting layer TPL. The light transmitting layer TPL may not include wavelength conversion materials.

The scatterers SCP may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The material of the organic particles may be, for example, acrylic resin or urethane resin.

The first through third base resins BRS1 through BRS3 may include a light transmitting organic material. For example, the first through third base resins BRS1 through BRS3 may include epoxy resin, acrylic resin, cardo resin, or imide resin. The first through third base resins BRS1 through BRS3 may all include the same or similar material, but the disclosure is not limited thereto.

The first wavelength conversion materials WCP1 may be materials that convert light of the first color into light of the second color, and the second wavelength conversion materials WCP2 may be materials that convert the light of the first color into light of the third color. The first wavelength conversion materials WCP1 and the second wavelength conversion materials WCP2 may be quantum dots, quantum rods, phosphors, or the like within the spirit and the scope of the disclosure. The quantum dots include group IV nanocrystals, group II-VI compound nanocrystals, group III-V compound nanocrystals, group IV-VI nanocrystals, or a combination of the same.

As light of the first color emitted from the light emitting elements ED of the first subpixel PX1 passes through the first wavelength conversion layer WCL1, a part of the light of the first color is converted into light of the second color and then incident on the first color filter layer CFL1. The first base resin BRS1 of the first wavelength conversion layer WCL1 may be made of a transparent material, and a part of the light of the first color may pass through the first base resin BRS1. However, at least a part of the light of the first color may be incident on the scatterers SCP and the first wavelength conversion materials WCP1 disposed or contained in the first base resin BRS1, and then the light is scattered or converted in wavelength to be incident on the first capping layer CPL1 and the first color filter layer CFL1. The first color filter layer CFL1 may block transmission of light of other colors except for the light of the second color, and the second color may be displayed in the first subpixel PX1.

Light of the first color emitted from the light emitting elements ED of the second subpixel PX2 passes through the light transmitting layer TPL and then enters the second color filter layer CFL2 without a change in its color. The second base resin BRS2 of the light transmitting layer TPL is made of a transparent material, and a part of the light may pass through the second base resin BRS2 and enter the first capping layer CPL1 and the second color filter layer CFL2 disposed on the second base resin BRS2. For example, at least a part of the light may be incident on the scatterers SCP disposed or contained in the second base resin BRS2 and then may be incident on the first capping layer CPL1 and the second color filter layer CFL2 after being scattered. The second color filter layer CFL2 may block transmission of light of other colors except for the light of the first color, and the first color may be displayed in the second subpixel PX2.

In the third subpixel PX3, light of the first color emitted from the light emitting elements ED passes through the second wavelength conversion layer WCL2 and the third color filter layer CFL3, and then the third color may be displayed. Even if the subpixels PXn include the light emitting elements ED emitting light of the same color, the display device 10 may display light of a different color in each subpixel PXn.

Light emitted from the light emitting elements ED disposed in the first subpixel PX1 is incident on the first wavelength conversion layer WCL1, light emitted from the light emitting elements ED disposed in the second subpixel PX2 is incident on the light transmitting layer TPL, and light emitted from the light emitting elements ED disposed in the third subpixel PX3 is incident on the second wavelength conversion layer WCL2. The light incident on the light transmitting layer TPL may be transmitted as light of the same first color without wavelength conversion, the light incident on the first wavelength conversion layer WCL1 may be converted into light of the second color, and the light incident on the second wavelength conversion layer WCL2 may be converted into light of the third color. Even if the subpixels PXn include the light emitting elements ED emitting light of the same color, they may display light of different colors according to the arrangement of the color control structures WCL1, WCL2 and TPL disposed above the light emitting elements ED.

At least a part of each of the color control structures TPL, WCL1 and WCL2 may overlap the light emitting elements ED disposed in the emission area EMA to allow light emitted from the light emitting elements ED to smoothly enter the color control structure TPL, WCL1 or WCL2. The light emitting elements ED may be disposed on the electrode extension parts ET1 through ET4 of the electrodes RME disposed in the emission area EMA, and each of the color control structures TPL, WCL1 and WCL2 may cover or overlap at least the electrode extension parts ET1 through ET4 and the light emitting elements ED. in the emission area EMA, at least a part of an area where the light emitting elements ED may not be disposed may not have the color control structure TPL, WCL1 or WCL2. The display device 10 may include the light transmitting areas TA1 through TA3 corresponding to the emission areas EMA, the color control structures TPL, WCL1 and WCL2 and the color filter layers CFL1 through CFL3 of the subpixels PXn, respectively. However, since each of the color control structures TPL, WCL1 and WCL2 does not cover or overlap the whole of the emission area EMA, the area of the emission area EMA may be different from those of the light transmitting areas TA1 through TA3.

For example, the light transmitting layer TPL, the first wavelength conversion layer WCL1, and the second wavelength conversion layer WCL2 may be spaced apart from each other as they may be disposed to correspond to the emission areas EMA, respectively. The space between them may generally overlap the non-emission area and may form a valley part having a substantially lattice shape in a plan view.

According to an embodiment, some or a predetermined number of the color control structures TPL, WCL1 and WCL2 may partially overlap the sub area SA. Each of the color control structures TPL, WCL1 and WCL2 may have a width sufficient to cover or overlap the light emitting elements ED while overlapping the emission area EMA. In an embodiment, some or a predetermined number of the color control structures TPL, WCL1 and WCL2 may be wider than the emission area EMA and may overlap the sub area SA of a neighboring subpixel PXn.

For example, a width, measured in the first direction DR1 in a plan view, of the first wavelength conversion layer WCL1 overlapping the first emission area EMA1 of the first subpixel PX1 may be greater than a width of the first emission area EMA1 measured in the first direction DR1. The first wavelength conversion layer WCL1 may overlap the first emission area EMA1 and the third bank BNL3 in the thickness direction and may further overlap the sub area SA of the second subpixel PX2 in the thickness direction. In the drawings, the first wavelength conversion layer WCL1 may have a substantially trapezoidal or pentagonal shape having two vertical sides, two horizontal sides and an oblique side in a plan view, and one end of the oblique side may be disposed in the sub area SA of the second subpixel PX2. However, the disclosure is not limited thereto. In a plan view, the first wavelength conversion layer WCL1 may also extend in the first direction DR1 beyond the first emission area EMA1 to overlap the third bank BNL3 in the thickness direction, and a part of the sides may be disposed in the sub area SA of a neighboring subpixel PXn.

Similarly, a width, measured in the first direction DR1 in a plan view, of the second wavelength conversion layer WCL2 overlapping the third emission area EMA3 of the third subpixel PX3 may be greater than a width of the third emission area EMA3 measured in the first direction DR1. The second wavelength conversion layer WCL2 may overlap the third emission area EMA3 and the third bank BNL3 in the thickness direction and may further overlap the sub area SA of the second subpixel PX2 in the thickness direction. Accordingly, the first wavelength conversion layer WCL1 and the second wavelength conversion layer WCL2 may be spaced apart from each other in the first direction DR1 in the sub area SA of the second subpixel PX2. In the drawings, the second wavelength conversion layer WCL2 may have a substantially trapezoidal or pentagonal shape having two vertical sides, two horizontal sides and an oblique side in a plan view, and one end of the oblique side may be disposed in the sub area SA of the second subpixel PX2. However, the disclosure is not limited thereto. In a plan view, the second wavelength conversion layer WCL2 in a plan view may also extend in the first direction DR1 beyond the third emission area EMA3 to overlap the third bank BNL3 in the thickness direction, and a part of the sides may be disposed in the sub area SA of a neighboring subpixel PXn.

On the other hand, a width, measured in the first direction DR1 in a plan view, of the light transmitting layer TPL overlapping the second emission area EMA2 of the second subpixel PX2 may be similar to a width of the second emission area EMA2 measured in the first direction DR1. The light transmitting layer TPL may overlap the second emission area EMA2 but may not or may partially overlap the third bank BNL3 and may not overlap the sub area SA of a neighboring subpixel PXn. Different from the first and second wavelength conversion layers WCL1 and WCL2, the light transmitting layer TPL may be disposed within the emission area EMA of a corresponding subpixel PXn so that it is not disposed in the sub area SA of a neighboring subpixel PXn or may partially overlap the third bank BNL3. However, the disclosure is not limited thereto. As previously described, in an embodiment, some or a predetermined number of the color control structures TPL, WCL1 and WCL2 may partially overlap the sub area SA. But, the disclosure is not limited thereto. In some embodiment, the color control structure TPL, WCL1 and WCL2 may partially overlap the sub area SA.

As described above, the color control structures TPL, WCL1 and WCL2 include the first through third base resins BRS1 through BRS3, and some or a predetermined number of them may further include the wavelength conversion particles WCP1 and WCP2. The first through third base resins BRS1 through BRS3 made of an organic material may be deformed by deterioration, and thus their shape and volume may be changed. If the color control structures TPL, WCL1 and WCL2 may be disposed to correspond to only the emission areas EMA of the subpixels PXn, respectively, they may not overlap some or a predetermined number of the light emitting elements ED due to deformation, and light emitted from the light emitting elements ED may be lost not to enter the color control structures TPL, WCL1 and WCL2. To prevent this, the display device 10 according to an embodiment may include different types of subpixels having different arrangements of the emission area EMA and the sub area SA in one pixel PX. Therefore, the emission area EMA of any one subpixel PXn may neighbor the sub area SA of a neighboring subpixel PXn. In this case, even if the color control structure TPL, WCL1 or WCL2 of each subpixel PXn extends beyond the emission area EMA, it is disposed in the sub area SA of a neighboring subpixel PXn so that color mixing between neighboring subpixels PXn can be prevented. For example, even if the color control structures TPL, WCL1 and WCL2 may be deformed by deterioration, each color control structure overlapping the sub area SA and the third bank BNL3 may cover or overlap at least the light emitting elements ED of the emission area EMA. Therefore, light loss due to deformation can be minimized.

In embodiment of FIGS. 18 and 19, the color control structures TPL, WCL1 and WCL2 may be formed as patterns of photoresist. However, the disclosure is not limited thereto, and the color control structures TPL, WCL1 and WCL2 may also be formed through an inkjet printing process.

The second capping layer CPL2 is disposed on a surface of each of the color control structures TPL, WCL1 and WCL2 which faces the display element layer. The second capping layer CPL2 may cover or overlap the color control structures TPL, WCL1 and WCL2 and the first capping layer CPL1. The second capping layer CPL2 may prevent impurities such as moisture or air from being introduced from the outside so as to protect the color control structures TPL, WCL1 and WCL2 from damage and contamination. For example, the second capping layer CPL2 may prevent the materials of the color control structures TPL, WCL1 and WCL2 from spreading to other elements. The second capping layer CPL2 may be made of an inorganic material. For example, the second capping layer CPL2 may include silicon nitride, aluminum nitride, zirconium nitride, titanium nitride, hafnium nitride, tantalum nitride, silicon oxide, aluminum oxide, titanium oxide, tin oxide, or silicon oxynitride. The second light blocking member MEM may be disposed on the second capping layer CPL2. The second light blocking member MBM may be made of a material capable of blocking transmission of light to prevent light, which is emitted from the color control structures TPL, WCL1 and WCL2, from entering adjacent subpixels PXn and thus causing color mixing. The second light blocking member MBM may be disposed along the boundary of each subpixel PXn. For example, the second light blocking member MBM may be disposed along the space between the color control structures TPL, WCL1 and WCL2 to overlap the third bank BNL3 in the thickness direction. The second light blocking member MBM may fill the valley part between the color control structures TPL, WCL1 and WCL2. An upper surface of the second light blocking member MBM may protrude further than upper surfaces of the color control structures TPL, WCL1 and WCL2 in the thickness direction, but the disclosure is not limited thereto.

The second light blocking member MBM may include an organic material. The second light blocking member MBM may include a light absorbing material that absorbs a visible wavelength band. In an embodiment, the second light blocking member MBM may include an organic light blocking material.

In the drawings, since the second capping layer CPL2 covers or overlaps the color control structures TPL, WCL1 and WCL2, the first capping layer CPL1 and the second capping layer CPL2 directly contact each other in the valley part in which the color control structures TPL, WCL1 and WCL2 may not be disposed. However, the disclosure is not limited thereto. In an embodiment, the color control structures TPL, WCL1 and WCL2 may be disposed in areas separated by a structure on the first capping layer CPL1, and the second capping layer CPL2 may be disposed on the structure and the color control structures TPL, WCL1 and WCL2. In this case, the second capping layer CPL2 and the first capping layer CPL1 may not directly contact each other, and the structure may play the same role as the second light blocking member MBM and may directly contact the first capping layer CPL1.

For example, although not illustrated in the drawings, at least one optical layer may be further disposed between the color filter layers CFL1 through CFL3 and the first capping layer CPL1, between the first capping layer CPL1 and the color control structures TPL, WCL1 and WCL2, or on the second capping layer CPL2 and the second light blocking member MBM. For example, the optical layer may be a selective reflect filter layer or a low refractive layer. When the optical layer is a selective reflect filter layer, it may be a yellow reflect filter (YRF) layer. Since the display device 10 may include optical layers disposed on and/or under or below the color control structures TPL, WCL1 and WCL2, further improvement of the light conversion efficiency can be achieved by recycling some of the light emitted from the color control structures TPL, WCL1 and WCL2.

An encapsulation layer EN may be disposed on the display element layer on the first substrate SUB1 to cover or overlap the electrodes RME, the contact electrodes CNE1 through CNE3, and the third bank BNL3 as well as the light emitting elements ED. The encapsulation layer EN may cover or overlap and protect the display element layer. For example, the encapsulation layer EN may planarize an upper surface of the display element layer disposed on the first substrate SUB1. The encapsulation layer EN may be composed of one inorganic layer or one organic layer. However, the disclosure is not limited thereto, and the encapsulation layer EN may also be a multilayer in which a plurality of inorganic layers and a plurality of organic layers may be stacked or alternately stacked.

The second substrate SUB2 on which the color control structures TPL, WCL1 and WCL2 and the color filter layers CFL1 through CFL3 may be disposed may be bonded to the first substrate SUB1 on which the display element layer and the circuit layer CCL may be disposed by a filling layer SM. The filling layer SM may fill a space between the display element layer and the color control structures TPL, WCL1 and WCL2 and the second light blocking member MBM while bonding them together. The filling layer SM may be made of, but not limited to, a Si-based organic material or an epoxy-based organic material.

Other embodiments of the display device 10 will now be described with reference to other drawings.

Figure 20:
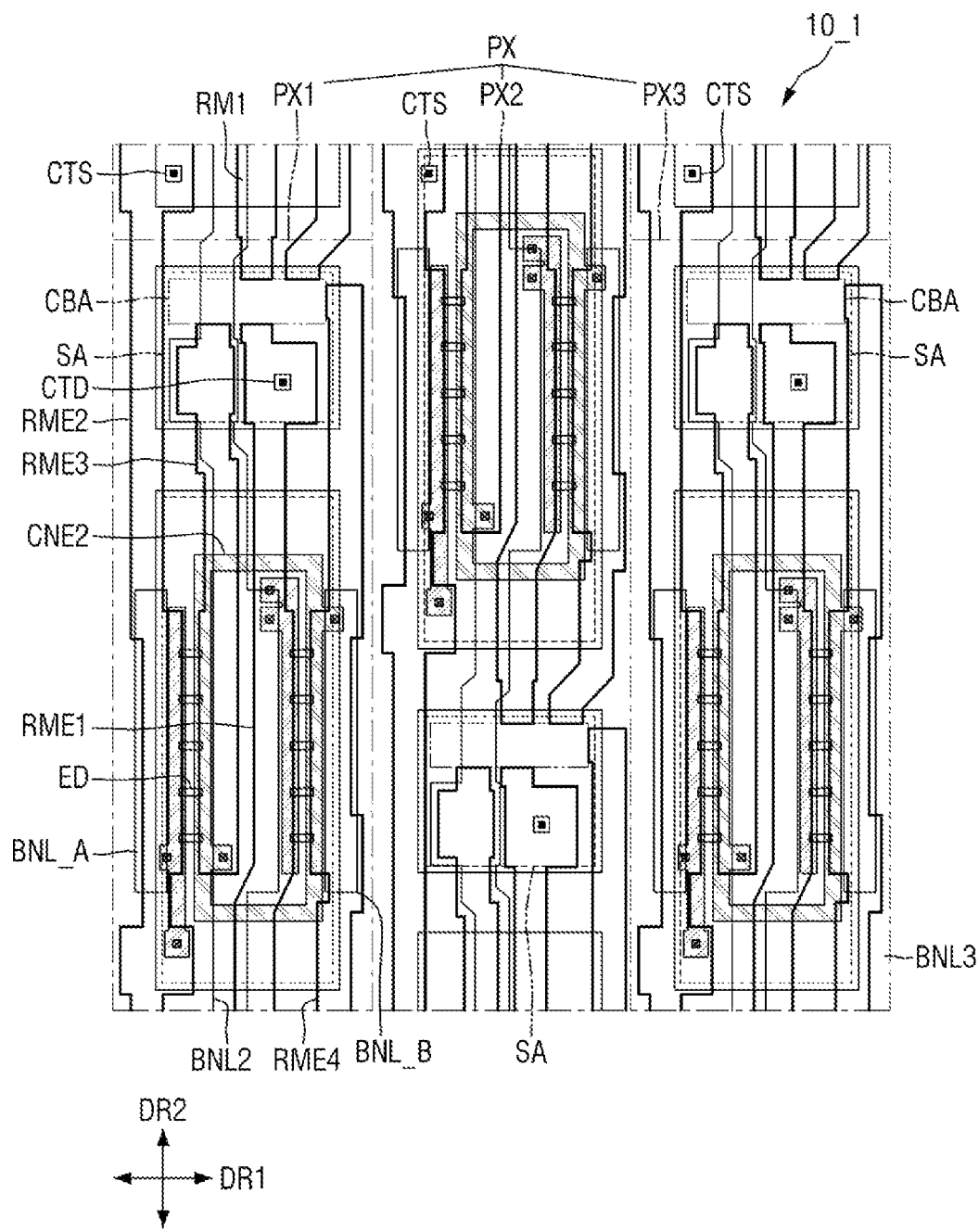
FIG. 20 is a plan view illustrating the arrangement of a plurality of electrodes included in one pixel of a display device according to an embodiment.

FIG. 20 is a plan view illustrating the arrangement of a plurality of electrodes included in one pixel PX of a display device 10_1 according to an embodiment.

Referring to FIG. 20, in the display device 10_1 according to an embodiment, each pixel PX may include a plurality of subpixels PXn in which relative positions of an emission area EMA and a sub area SA may be the same but the emission area EMA and the sub area SA may be alternately disposed. Different from an embodiment of FIG. 8, in the display device 10_1 according to an embodiment, the sub area SA of each subpixel PXn may be disposed on an upper side of the emission area EMA which may be the first side of the second direction DR2, and the arrangement and structures of electrodes RME may be substantially the same in the subpixels PXn. However, the emission area EMA and the sub area SA of any one subpixel PXn may be moved or shifted in the second direction DR2 so that the emission area EMA of the subpixel PXn is not side by side with the emission area EMA of another subpixel PXn in the first direction DR1. The current embodiment is the same as an embodiment of FIG. 8 in the positions of a first subpixel PX1 and a third subpixel PX3, which may be first type subpixels among the subpixels PXn included in the pixel PX of the display device 10_1, and in the structures of the electrodes RME of the first subpixel RV and the third subpixel PX3 but is different from an embodiment of FIG. 8 in the position of a second subpixel PX2, which may be a second type subpixel, and in the structures of the electrodes RME of the second subpixel PX2. Description already provided herein will not be repeated here, and thus, the following description will focus on the structure of the second subpixel PX2.

The second subpixel PX2 may have substantially the same structure as the first subpixel PX1 and the third subpixel PX3. A first electrode contact part CE1 of a first electrode RME1 may be disposed in the sub area SA disposed on an upper side of a second emission area EMA2, and the first electrode RME1 may extend downward from the first electrode contact part CE1. Similarly, a third electrode contact part CE3 of a third electrode RME3 may be disposed in the sub area SA disposed on the upper side of the second emission area EMA2, and the third electrode RME3 may extend downward from the third electrode contact part CE3. Accordingly, the arrangement of first light emitting elements ED1 and second light emitting elements ED2 and the arrangement of a plurality of contact electrodes CNE1 through CNE3 may be substantially the same as those in the first subpixel PX1.

However, in the display device 10_1, the second subpixel PX2 may be moved or shifted in the second direction DR2 so that the sub area SA is disposed between a first emission area EMA1 of the first subpixel PX1 and a third emission area EMA3 of the third subpixel PX3 in each pixel PX. The sub area SA disposed between the first emission area. EMA1 and the third emission area EMA3 of each pixel PX may be the sub area SA of the second subpixel PX2 of another pixel PX neighboring the pixel PX in the second direction DR2. In the sub area SA disposed between the first emission area EMA1 and the third emission area EMA3 of each pixel PX, the first electrode contact part CE1 and the third electrode contact part CE3 disposed in the second subpixel PX2 of another pixel PX may be disposed.

When the electrodes RME of the second subpixel PX2 have the same structures as those of the first subpixel PX1, an electrode RME2 may include a greater number of second electrode contact parts CE2. Two second electrode contact parts CE2 of the first subpixel PX1 may be disposed in an area occupied by one pixel PX. One of the second electrode contact parts CE2 may contact a second wiring horizontal part VSL_H, and the other may contact a second contact electrode CNE2. On the other hand, three second electrode contact parts CE2 of the second subpixel PX2 may be disposed in the area occupied by one pixel PX. Among the three second electrode contact parts CE2, two second electrode contact parts CE2 may be partially disposed in the second emission area EMA2 to contact the second wiring horizontal part VSL_H or the second contact electrode CNE2. The other second electrode contact part CE2 may be disposed in a second subpixel PX2 of neighboring pixel PX to overlap a first wiring horizontal part VDL_H but not to contact the first wiring horizontal part VDL_H. As the structures and arrangement of the electrodes RME in the second subpixel PX2 may be changed, the second electrode RME2 disposed in the second subpixel PX2 may further include a second electrode contact part CE2 for contact with the second contact electrode CNE2.

Even if the position and structure of the second subpixel PX2 may be changed, the arrangement of color control structures TPL, WCL1 and WCL2 may be substantially the same as that of an embodiment of FIGS. 18 and 19. A first wavelength conversion layer WCL1 and a second wavelength conversion layer WCL2 may cover or overlap light emitting elements ED in the first emission area EMA1 and the third emission area EMA3, respectively, and may partially overlap the sub area SA between the first emission area EMA1 and the third emission area EMA3. However, different from an embodiment of FIGS. 18 and 19, the sub area SA overlapped by the first wavelength conversion layer WCL1 and the second wavelength conversion layer WCL2 may be the sub area SA of another pixel PX neighboring the pixel PX in the second direction DR2.

In the display device 10_1, the structures of the electrodes RME and the arrangement of the subpixels PXn may be changed to the extent that light emitted from the light emitting elements ED is not lost even if the color control structures TPL, WCL1 and WCL2 may be deformed by deterioration. According to an embodiment, the second subpixel PX2 may have substantially the same structure as the first subpixel PX1 but may be shifted in the second direction DR2 such that the second emission area EMA2 is staggered with the first emission area EMA1. As the second subpixel PX2 is shifted, the sub area SA may be located or disposed aside of the emission areas EMA in the first direction DR1, and the color control structures TPL, WCL1 and WCL2 overlapping the emission areas EMA may partially overlap the sub area SA.

Figure 21:
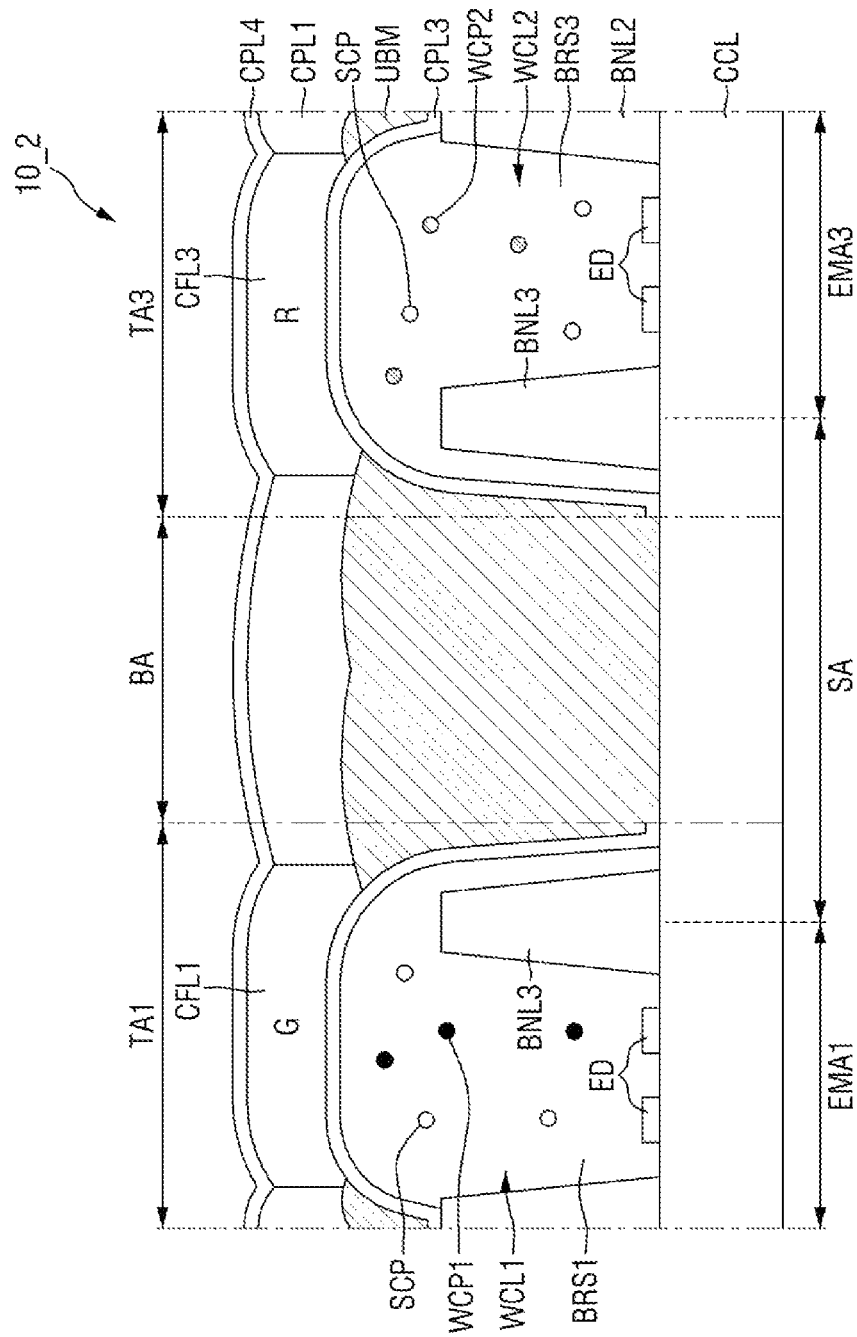
FIG. 21 is a schematic cross-sectional view illustrating the schematic arrangement of a circuit layer, a light emitting unit, and color control structures of a display device according to an embodiment.

FIG. 21 is a schematic cross-sectional view illustrating the schematic arrangement of a circuit layer CCL, a light emitting unit, and color control structures TPL, WCL1 and WCL2 of a display device 10_2 according to an embodiment. FIG. 21 is a cross section across a first emission area EMA1, a sub area SA and a third emission area EMA3 and illustrates the schematic arrangement of the color control structures TPL, WCL1 and WCL2, a display element layer and the circuit layer CCL.

Referring to FIG. 21, in the display device 10_2 according to an embodiment, the color control structures TPL, WCL1 and WCL2 may be directly disposed on the display element layer, and a second substrate SUB2 may be omitted. Relative positions of the color control structures TPL, WCL1 and WCL2 and color filter layers CFL1 through CFL3 will now be described, but a detailed description of the color control structures TPL, WCL1 and WCL2 and the color filter layers CFL1 through CFL3 will be omitted.

The color control structures TPL, WCL1 and WCL2 may be disposed on the display element layer, and may be directly disposed on a third bank BNL3, a third contact electrode CNE3 and a third insulating layer PAS3. The color control structures TPL, WCL1 and WCL2 may be partially disposed in areas surrounded by the third bank BNL3, and some or a predetermined number of them may be disposed on the third bank BNL3. For example, a light transmitting layer TPL overlapping a second subpixel PX2 may be disposed in a second emission area EMA2 surrounded by the third bank BNL3. On the other hand, a first wavelength conversion layer WCL1 overlapping a first subpixel PX1 and a second wavelength conversion layer WCL2 overlapping a third subpixel PX3 may be respectively extended to the sub area SA of the second subpixel PX2 beyond a first emission area EMA1 and a third emission area EMA3. A part of each of the first wavelength conversion layer WCL1 and the second wavelength conversion layer WCL2 may be directly disposed on the third bank BNL3.

In an embodiment, a height of each of the color control structures TPL, WCL1 and WCL2 may be greater than that of the third bank BNL3. The color control structures TPL, WCL1 and WCL2 may be formed by an inkjet printing process or a photoresist process during a process of manufacturing the display device 10_2. The color control structures TPL, WCL1 and WCL2 may be formed by spraying or applying materials that form the color control structures TPL, WCL1 and WCL2 to the areas surrounded by the third bank BNL3 and then drying or exposing and developing the materials. For example, the materials that form the color control structures TPL, WCL1 and WCL2 may include an organic material to have viscosity, and the organic material may be sprayed or applied to a position higher than the third bank BNL3. Accordingly, the height of each of the color control structures TPL, WCL1 and WCL2 may be greater than that of the third bank BNL3. However, the disclosure is not limited thereto.

A third capping layer CPL3 is disposed on the color control structures TPL, WCL1 and WCL2. The third capping layer CPL3 may cover or overlap the color control structures TPL, WCL1 and WCL2 and the third bank BNL3. The third capping layer CPL3 may prevent impurities such as moisture or air from being introduced from the outside and damaging or contaminating the color control structures TPL, WCL1 and WCL2. For example, the third capping layer CPL3 may prevent the materials of the color control structures TPL, WCL1 and WCL2 from spreading to other elements. Similar to a first capping layer CPL1 described above, the third capping layer CPL3 may be made of an inorganic material, but the disclosure is not limited thereto.

A second light blocking member MBM may be disposed on the third capping layer CPL3. The second light blocking member MBM may be made of a material capable of blocking transmission of light to prevent light, which is emitted from the color control structures TPL, WCL1 and WCL2, from entering adjacent subpixels PXn and thus causing color mixing.

A first light blocking member UBM, the color filter layers CFL1 through CFL3, and a fourth capping layer CPL4 may be disposed on the color control structures TPL, WCL1 and WCL2 and the second light blocking member MBM. The color filter layers CFL1 through CFL3 and the first light blocking member UBM may be the same as those described above in their planar shapes and materials but different in that they may be directly disposed on the third capping layer CPL3. The fourth capping layer CPL4 may cover or overlap the color filter layers CFL1 through CFL3 and the first light blocking member UBM and perform a function similar to that of the third capping layer CPL3.

In the display device 10_2 according to the current embodiment, since the color control structures TPL, WCL1 and WCL2 and the color filter layers CFL1 through CFL3 may be sequentially and directly disposed on the display element layer, the second substrate SUB2 can be omitted. The display device 10_2 may include one first substrate SUB1 only, and the circuit layer CCL, the display element layer, the color control structures TPL, WCL1 and WCL2 and the color filter layers CFL1 through CFL3 may be stacked. Therefore, the manufacturing process can be simplified.

Figure 22:
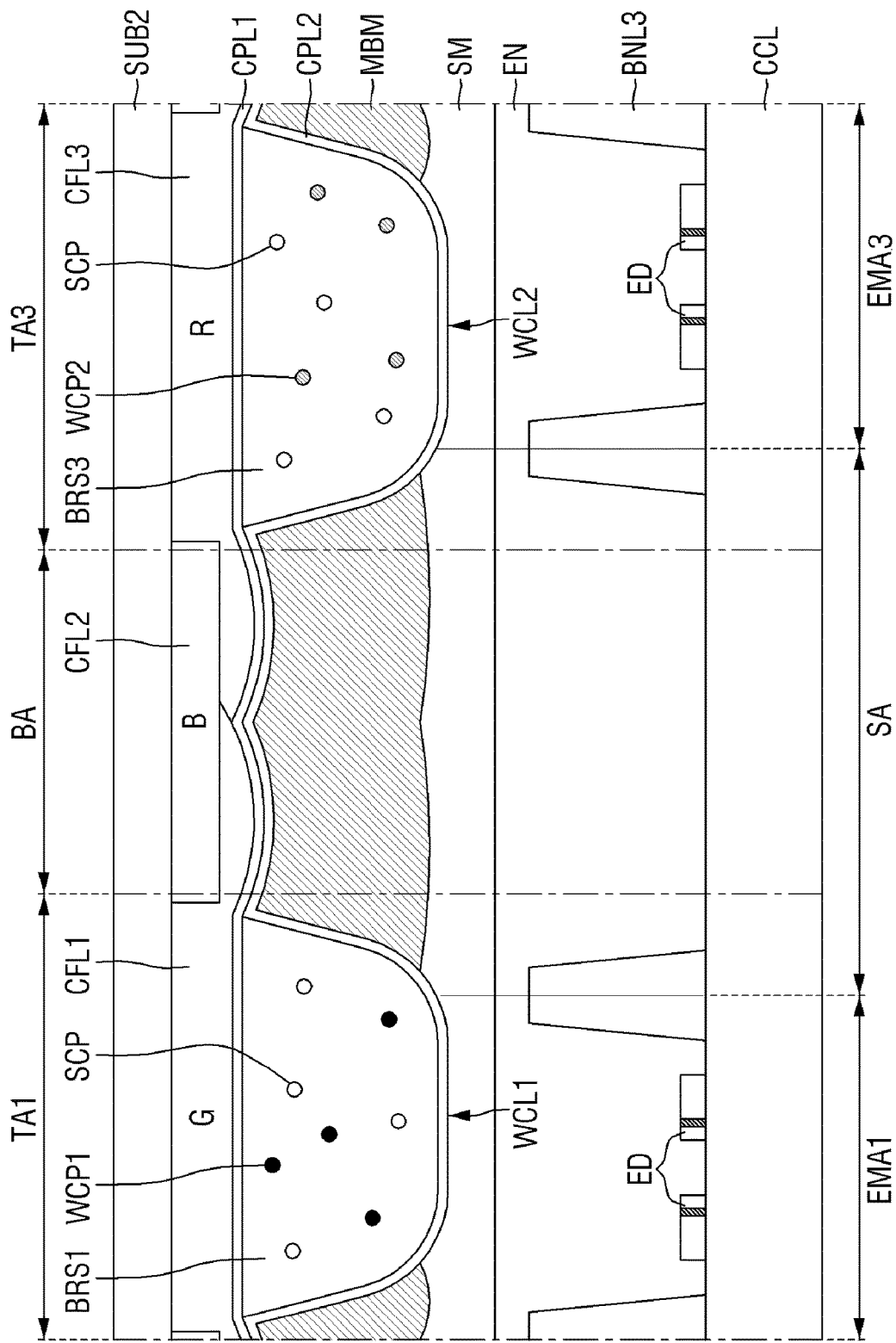
FIG. 22 is a schematic cross-sectional view illustrating the schematic arrangement of a circuit layer, a light emitting unit, and color control structures of a display device according to an embodiment.

FIG. 22 is a schematic cross-sectional view illustrating the schematic arrangement of a circuit layer CCL, a light emitting unit, and color control structures TPL, WCL1 and WCL2 of a display device 10_3 according to an embodiment.

FIG. 22 is a cross section across a first emission area EMA1, a sub area SA and a third emission area EMA3 and illustrates the schematic arrangement of the color control structures TPL, WCL1 and WCL2, a display element layer and the circuit layer CCL.

Referring to FIG. 22, in the display device 10_3 according to an embodiment, a first light blocking member UBM may be omitted, and at least some or a predetermined number of color filter layers CFL1 through CFL3 may be stacked on each other in a light blocking area BA. The color filter layers CFL1 through CFL3 may respectively include dyes of different colors and may be stacked to block transmission of light. The current embodiment is different from an embodiment of FIG. 18 in that the color filter layers CFL1 through CFL3 serve as the first light blocking member UBM. Description already provided herein will not be repeated here, and thus, the following description will focus on differences.

A second color filter layer CFL2, not the first light blocking member UBM, may be disposed on the light blocking area BA of a second substrate SUB2. The second color filter layer CFL2 may be disposed not only on a light transmitting layer TPL corresponding to a second subpixel PX2 but also in the light blocking area BA in which the color control structures TPL, WCL1 and WCL2 may not be disposed. The second color filter layer CFL2 may be extended to the light blocking area BA adjacent to a second light transmitting area TA2 and may have a large width.

At least any one of a first color filter layer CFL1 and a third color filter layer CFL3 may be disposed on the second color filter layer CFL2 in the light blocking area BA. Since each of the first color filter layer CFL1 and the third color filter layer CFL3 may include a dye of a different color from the dye included in the second color filter layer CFL2, the transmission of light may be blocked in an area where the first through third color filter layers CFL1 through CFL3 may be stacked. For example, in an embodiment in which the second color filter layer CFL2 may include a blue colorant, external light or reflected light transmitted through the light blocking area BA may have a blue wavelength band. The eye color sensibility that a user's eyes perceive varies depending on the color of light. For example, light in the blue wavelength band may be perceived less sensitively by the user than light in a green wavelength band and light in a red wavelength band. Since the first light blocking member UBM is omitted from the light blocking area BA and a plurality of color filter layers CFL1 through CFL3 may be stacked in the light blocking area BA, the transmission of light can be blocked, and the user can perceive reflected light relatively less sensitively. For example, a part of light entering from the outside of the display device 10_3 may be absorbed, thereby reducing reflection of the external light.

Although not illustrated in the drawing, in an embodiment of FIG. 22, at least one optical layer may also be further disposed between the color filter layers CFL1 through CFL3 and a first capping layer CPL1, between the first capping layer CPL1 and the color control structures TPL, WCL1 and WCL2, or on a second capping layer CPL2 and a second light blocking member MBM.

Figure 23:
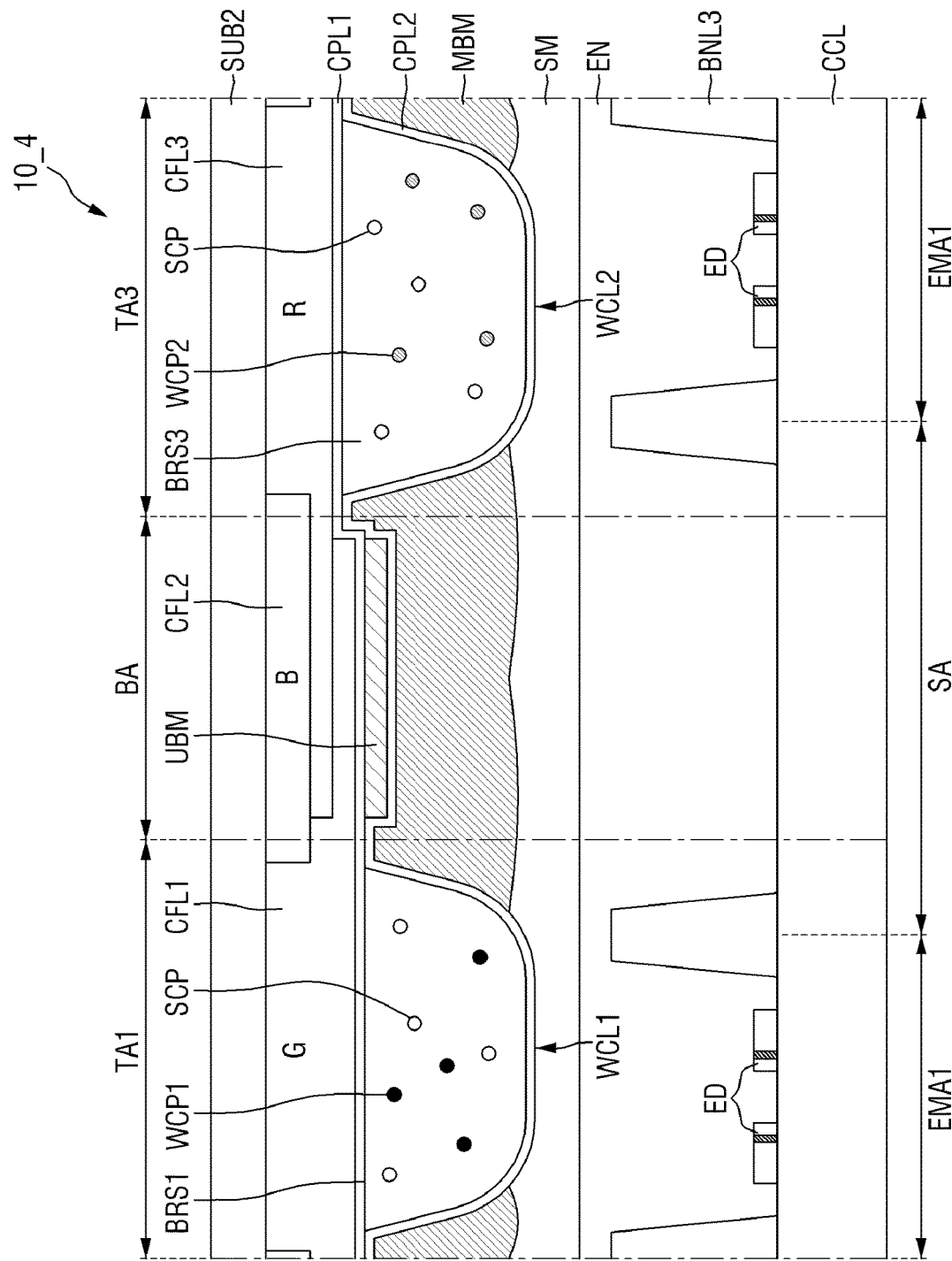
FIG. 23 is a schematic cross-sectional view illustrating the schematic arrangement of a circuit layer, a light emitting unit, and color control structures of a display device according to an embodiment.

FIG. 23 is a schematic cross-sectional view illustrating the schematic arrangement of a circuit layer CCL, a light emitting unit, and color control structures TPL, WCL1 and WCL2 of a display device 10_4 according to an embodiment. FIG. 23 is a cross section across a first emission area EMA1, a sub area SA and a third emission area EMA3 and illustrates the schematic arrangement of the color control structures TPL, WCL1 and WCL2, a display element layer and the circuit layer CCL.

Referring to FIG. 23, in the display device 10_4 according to an embodiment, color filter layers CFL1 through CFL3 may be stacked on each other in a light blocking area BA, and a first light blocking member UBM may be disposed on a part where the color filter layers CFL1 through CFL3 overlap. The color filter layers CFL1 through CFL3 may include dyes of different colors and may be stacked to block transmission of light. The current embodiment is different from an embodiment of FIG. 22 in that the color filter layers CFL1 through CFL3 perform a light blocking function together with the first light blocking member UBM. Description already provided herein will not be repeated here, and thus, the following description will focus on differences.

A second color filter layer CFL2 may be disposed on the light blocking area BA of a second substrate SUB2, and a third color filter layer CFL3 and a first color filter layer CFL1 may be further sequentially disposed on the second color filter layer CFL2. The first through third color filter layers CFL1 through CFL3 may be not only disposed on the color control structures TPL, WCL1 and WCL2 corresponding to subpixels PXn, respectively, but also extended to the light blocking area BA. For example, the second color filter layer CFL2 may be extended to the light blocking area BA adjacent to a second light transmitting area TA2, and the third color filter layer CFL3 and the first color filter layer CFL1 may be further disposed on the second color filter layer CFL2. Since each of the first color filter layer CFL1 and the third color filter layer CFL3 may include a dye of a different color from the dye included in the second color filter layer CFL2, the transmission of light may be blocked in an area where the first through third color filter layers CFL1 through CFL3 may be stacked.

The first light blocking member UBM may be further disposed on the area where the first through third color filter layers CFL1 through CFL3 may be stacked on each other to block light in the light blocking area BA between neighboring subpixels PXn. However, in an embodiment in which the first through third color filter layers CFL1 through CFL3 may be stacked on each other, the first light blocking member UBM may also be omitted.

A display device according to an embodiment may include different types of subpixels having different arrangements of an emission area and a sub area in one pixel. Therefore, neighboring subpixels can each secure an emission area having a sufficient area. For example, the display device may further include color control structures disposed to respectively correspond to the subpixels in each pixel. Even if the color control structures may be deformed by deterioration, each color control structure overlapping the sub area may cover or overlap at least light emitting elements of the emission area. Therefore, light loss due to deformation can be minimized.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. A display device comprising:
a plurality of pixels comprising a plurality of subpixels and disposed in a first direction and a second direction intersecting the first direction;
a plurality of electrodes spaced apart from each other in the first direction, extending in the second direction, and disposed in each of the plurality of subpixels;
a plurality of light emitting elements disposed in each of the plurality of subpixels and disposed on the plurality of electrodes; and
a plurality of contact electrodes electrically contacting the plurality of light emitting elements and the plurality of electrodes, wherein
each of the plurality of subpixels comprises:
an emission area comprising the plurality of light emitting elements; and
a sub area spaced apart from the emission area in the second direction, each of the plurality of pixels comprises:
a first subpixel comprising a first emission area and a sub area disposed on a first side of the first emission area in the second direction; and
a second subpixel disposed on a first side of the first subpixel in the first direction and comprises a second emission area and a sub area disposed on a second side of the second emission area in the second direction, and
the sub area of the second subpixel is disposed side by side with the first emission area in the first direction, wherein the plurality of electrodes comprise:
a first electrode disposed across the emission area and the sub area of each subpixel of the plurality of pixels;
a second electrode spaced apart from the electrode in the first direction and disposed across the plurality of subpixels;
a third electrode disposed between the first electrode and the second electrode disposed across the emission area and sub area of the plurality of subpixel; and
a fourth electrode spaced apart from the third electrode in the first direction with the first electrode interposed between the fourth electrode and the third electrode, wherein
the first electrode comprises a first electrode contact part disposed in the sub area of the plurality of subpixels, and
the second comprises a plurality of second electrode contact parts disposed at boundaries of adjacent plurality of pixels in the second direction.

2. The display device of claim 1, wherein
each of the plurality of electrodes comprises an electrode extension part disposed in the emission area of the plurality of subpixels, and the plurality of light emitting elements comprise:
first light emitting elements having first ends disposed on a first electrode extension part of the first electrode, and second ends disposed on a fourth electrode extension part of the fourth electrode; and
second light emitting elements having first ends disposed on a third electrode extension part of the third electrode, and second ends disposed on a second electrode extension part of the second electrode.

3. The display device of claim 1, further comprising:
a first wiring horizontal part and a second wiring horizontal part which are disposed on a first side and a second side of each of the plurality of subpixels in the second direction,
wherein one of the second electrode contact parts of the second electrode overlaps the second wiring horizontal part to electrically contact the second wiring horizontal part.

4. The display device of claim 3, wherein
the first wiring horizontal part intersects the first emission area of the first subpixel and is spaced apart toward a second side of the second direction from the plurality of light emitting elements disposed in the first subpixel, and
the second wiring horizontal part intersects the second emission area of the second subpixel and is spaced apart toward a first side of the second direction from the plurality of light emitting elements disposed in the second subpixel.

5. The display device of claim 4, wherein
the second electrode contact part electrically contacting the second wiring horizontal part is disposed on a first side of the sub area in the second direction in the second electrode disposed in the first subpixel, and
a part of the second electrode contact part contacting the second wiring horizontal part is disposed in the second emission area in the second electrode disposed in the second subpixel.

6. The display device of claim 2, wherein the plurality of contact electrodes comprise:
a first contact electrode electrically contacting the first electrode and the first ends of the first light emitting elements;
a second contact electrode electrically contacting the second electrode and the second ends of the second light emitting elements; and
a third contact electrode electrically contacting the third electrode, the fourth electrode, the second ends of the first light emitting elements, and the first ends of the second light emitting elements.

7. The display device of claim 6, wherein
the first contact electrode is disposed on the first electrode extension part to extend in the second direction,
the second contact electrode is disposed on the second electrode extension part to extend in the second direction, and
the third contact electrode surrounds the first contact electrode and comprises:
a first extending part disposed on the third electrode extension part;
a second extending part disposed on the fourth electrode extension part; and
a plurality of connecting parts electrically connecting the first extending part and the second extending part.

8. The display device of claim 1, further comprising:
a plurality of first banks overlapping the second electrode and the fourth electrode and disposed in the emission area of each of the plurality of subpixels;
a second bank surrounding the emission area and the sub area of each of the plurality of subpixels and disposed at a boundary between adjacent subpixels; and
a third bank extending in the second direction to intersect the emission area and the sub area of each of the plurality of subpixels and comprising a part disposed between the plurality of first banks,
wherein the plurality of light emitting elements are disposed between the plurality of first banks and the third bank.

9. The display device of claim 8, further comprising:
a plurality of color control structures, at least a part of each of the plurality of color control structures overlapping the emission area of each of the plurality of subpixels,
wherein the plurality of color control structures comprise:
a first wavelength conversion layer disposed in the first emission area of the first subpixel and overlapping the plurality of light emitting elements of the first emission area; and
a light transmitting layer disposed in the second emission area of the second subpixel and overlapping the plurality of light emitting elements of the second emission area.

10. The display device of claim 9, wherein
at least a part of the first wavelength conversion layer overlaps the sub area of the second subpixel disposed on a first side of the first emission area in the first direction, and
the light transmitting layer is not disposed in the sub area of the first subpixel.

11. The display device of claim 9, wherein at least a part of each of the first wavelength conversion layer and the light transmitting layer overlaps the second bank in a thickness direction.

12. The display device of claim 9, further comprising:
a third subpixel disposed on a first side of the second subpixel in the first direction and comprises a third emission area and a sub area disposed on a first side of the third emission area in the second direction, wherein
the second emission area is disposed between the sub areas of the first subpixel and the third subpixel, in the second subpixel, and
the sub area is disposed between the first emission area of the first subpixel and the third emission area of the third subpixel.

13. The display device of claim 12, wherein
the plurality of color control structures further comprise a second wavelength conversion layer disposed in the third emission area of the third subpixel and overlapping the plurality of light emitting elements of the third emission area, and
at least a part of the second wavelength conversion layer overlaps the sub area of the second subpixel disposed on a second side of the third emission area of the third subpixel in the first direction.

14. The display device of claim 2, further comprising:
a first capacitor electrode overlapping the second emission area, the first capacitor electrode and the second wiring horizontal part being disposed on a same layer;
a second capacitor electrode overlapping the sub area of the second subpixel; and a first extending electrode part overlapping the sub area of the first subpixel and being electrically connected to the first capacitor electrode, wherein
the first electrode contact part of the first electrode of the first subpixel electrically contacts the first extending electrode part in the sub area of the first subpixel, and
the first electrode contact part of the first electrode of the second subpixel directly electrically contacts the second capacitor electrode in the sub area of the second subpixel.

15. A display device comprising:
a plurality of pixels including a plurality of emission areas, and a plurality of sub areas, wherein
each of the plurality of pixels comprises:
a plurality of electrodes spaced part from each other in a first direction, at least a part of each of the plurality of electrodes extending in each emission area in a second direction;
a plurality of light emitting elements disposed in each emission area of the plurality of emission areas, ends of each of the plurality of light emitting elements being disposed on the plurality of electrodes; and
a plurality of contact electrodes electrically contacting the plurality of light emitting elements and the plurality of electrodes,
the plurality of emission areas of each of the plurality of pixels comprise:
a first emission area;
a second emission area spaced apart from the first emission area in a diagonal direction between the first direction and the second direction; and
a third emission area spaced apart from the first emission area in the first direction, and
at least one of the plurality of sub areas spaced apart from the second emission area in the second direction is included between the first emission area and the third emission area, wherein the plurality of electrodes comprise:
a first electrode disposed across each emission area mind each sub area of the plurality of pixels;
a second electrode spaced apart from the first electrode in the first direction and overlapping a plurality of adjacent pixels in the second direction;
a third electrode disposed between the first electrode and the second electrode and overlapping each emission area and each sub area of the plurality of pixels; and
a fourth electrode spaced apart tom the third electrode in the first direction, the electrode interposed between the fourth electrode and the third electrode, wherein
the first electrode comprises a first electrode contact part disposed in each area of the plurality of pixels, and
the second electrode comprises a plurality of second electrode contact parts disposed at boundaries of adjacent pixels in the second direction.

16. The display device of claim 15, further comprising:
a plurality of color control structures overlapping the plurality of light emitting elements disposed in each emission area of the plurality of emission areas of each pixel of the plurality of pixels, wherein
the plurality of color control structures comprise:
a first wavelength conversion layer overlapping the first emission area;
a light transmitting layer overlapping the second emission area; and
a second wavelength conversion layer overlapping the third emission area, and at least a part of each of the first wavelength conversion layer and the second wavelength conversion layer overlaps the sub area of the plurality of emission areas spaced apart from the second emission area in the second direction.

17. The display device of claim 16, further comprising:
a bank surrounding the plurality of emission areas and the sub areas of the plurality of pixels,
wherein at least a part of each of the first wavelength conversion layer and the second wavelength conversion layer overlaps the bank.

18. The display device of claim 16, wherein
the first wavelength conversion layer has a maximum width in the first direction greater than a maximum width of the first emission area in the first direction, and
the second wavelength conversion layer has a maximum width in the first direction greater than a maximum width of the third emission area in the first direction.

19. The display device of claim 1, each of the plurality of electrodes is electrically connected to at least one of the plurality of light emitting elements.

20. The display device of claim 1, different ones of the plurality of electrodes are electrically connected to opposite ends of each of the light emitting elements.

* * * * *